(12) United States Patent
Kobayashi et al.

(10) Patent No.: US 7,965,446 B2
(45) Date of Patent: Jun. 21, 2011

(54) STRUCTURE FOR PATTERN FORMATION, METHOD FOR PATTERN FORMATION, AND APPLICATION THEREOF

(75) Inventors: Hironori Kobayashi, Tokyo-to (JP); Manabu Yamamoto, Tokyo-to (JP); Daigo Aoki, Tokyo-to (JP); Hironori Kamiyama, Tokyo-to (JP); Shinichi Hikosaka, Tokyo-to (JP); Mitsuhiro Kashiwabara, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 363 days.

(21) Appl. No.: 11/867,842

(22) Filed: Oct. 5, 2007

(65) Prior Publication Data

US 2008/0043337 A1     Feb. 21, 2008

Related U.S. Application Data

(60) Division of application No. 09/882,409, filed on Jun. 15, 2001, now Pat. No. 7,575,845, which is a continuation of application No. 09/284,161, filed as application No. PCT/JP98/03547 on Aug. 10, 1998, now Pat. No. 6,294,313.

(30) Foreign Application Priority Data

| Aug. 8, 1997 | (JP) | 9-214845 |
| Oct. 31, 1997 | (JP) | 9-300295 |
| Nov. 14, 1997 | (JP) | 9-313041 |
| Mar. 27, 1998 | (JP) | 10-100369 |
| Mar. 31, 1998 | (JP) | 10-085955 |
| Mar. 31, 1998 | (JP) | 10-086293 |
| Jun. 12, 1998 | (JP) | 10-165392 |
| Jun. 15, 1998 | (JP) | 10-167316 |
| Jun. 15, 1998 | (JP) | 10-183370 |

(51) Int. Cl.
G02B 27/10     (2006.01)
(52) U.S. Cl. ...................................................... 359/620
(58) Field of Classification Search .................. 359/620, 359/634
See application file for complete search history.

(56) References Cited

U.S. PATENT DOCUMENTS 5,235,463 A * 8/1993 Broussoux et al. ........... 359/642
5,466,926 A * 11/1995 Sasano et al. ................. 250/216

FOREIGN PATENT DOCUMENTS

| EP | 1 376 224 A1 | 1/2004 |
| JP | 2-165932 A | 6/1990 |
| JP | 3-21901 A | 1/1991 |
| JP | 5-164904 A | 6/1993 |
| JP | 5-206429 A | 8/1993 |
| JP | 9-106774 A | 4/1997 |

(Continued)

OTHER PUBLICATIONS

USPTO OA mailed Apr. 3, 2008 for Co-Pending U.S. Appl. No. 11/867,781.

(Continued)

*Primary Examiner* — Joseph Martinez
(74) *Attorney, Agent, or Firm* — Ladas & Parry LLP

(57) ABSTRACT

A structure for pattern formation adapted for optically forming a pattern, characterized by comprising: a photocatalyst-containing layer provided on a substrate, the photocatalyst-containing layer containing a material of which the wettability is variable through photocatalytic action upon pattern-wise exposure.

6 Claims, 28 Drawing Sheets

FOREIGN PATENT DOCUMENTS

JP 09-131914 * 5/1997
JP 11-344804 A 12/1999

OTHER PUBLICATIONS

USPTO OA mailed Aug. 11, 2008 for Co-Pending U.S. Appl. No. 11/867,781.
USPTO OA mailed May 28, 2009 for Co-Pending U.S. Appl. No. 11/867,781.
USPTO OA mailed Feb. 12, 2010 for Co-Pending U.S. Appl. No. 11/867,781.
USPTO OA mailed Sep. 16, 2009 for Co-Pending U.S. Appl. No. 11/867,791.
USPTO OA mailed Mar. 10, 2010 for Co-Pending U.S. Appl. No. 11/867,791.
USPTO OA mailed Jun. 11, 2008 for Co-Pending U.S. Appl. No. 11/867,799.
USPTO OA mailed Mar. 24, 2009 for Co-Pending U.S. Appl. No. 11/867,799.
USPTO OA mailed Sep. 28, 2009 for Co-Pending U.S. Appl. No. 11/867,799.
USPTO OA mailed May 27, 2009 for Co-Pending U.S. Appl. No. 11/867,820.
USPTO OA mailed Oct. 14, 2009 for Co-Pending U.S. Appl. No. 11/867,820.
USPTO OA mailed Sep. 11, 2008 for Co-Pending U.S. Appl. No. 11/867,831.
USPTO OA mailed Jun. 26, 2009 for Co-Pending U.S. Appl. No. 11/867,831.
USPTO OA mailed Mar. 2, 2010 for Co-Pending U.S. Appl. No. 12/122,833.
USPTO OA mailed Oct. 2, 2009 for Co-Pending U.S. Appl. No. 12/472,585.
USPTO OA mailed Mar. 18, 2010 for Co-Pending U.S. Appl. No. 12/652,843.
USPTO OA mailed Jul. 2, 2010 in connection with U.S. Appl. No. 11/867,799.
USPTO OA mailed Jun. 28, 2010 in connection with U.S. Appl. No. 11/867,820.
USPTO OA mailed Sep. 20, 2010 in connection with U.S. Appl. No. 12/122,833.
USPTO OA mailed Jul. 12, 2010 in connection with U.S. Appl. No. 12/472,585.
USPTO OA mailed Dec. 3, 2010 in connection with U.S. Appl. No. 11/867,831.
USPTO OA mailed Dec. 1, 2010 in connection with U.S. Appl. No. 12/652,843.
USPTO OA mailed Nov. 29, 2010 in connection with U.S. Appl. No. 11/867,791.
USPTO OA mailed Sep. 22, 2010 in connectio with U.S. Appl. No. 11/867,781.

* cited by examiner

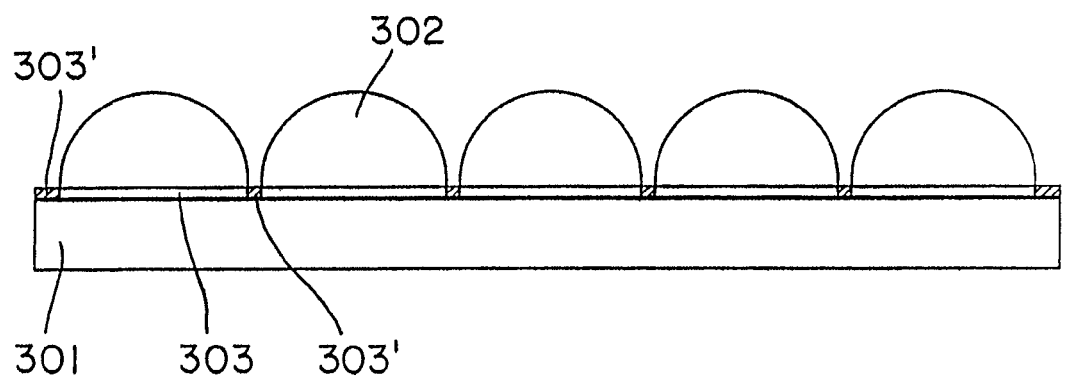
F I G. 23
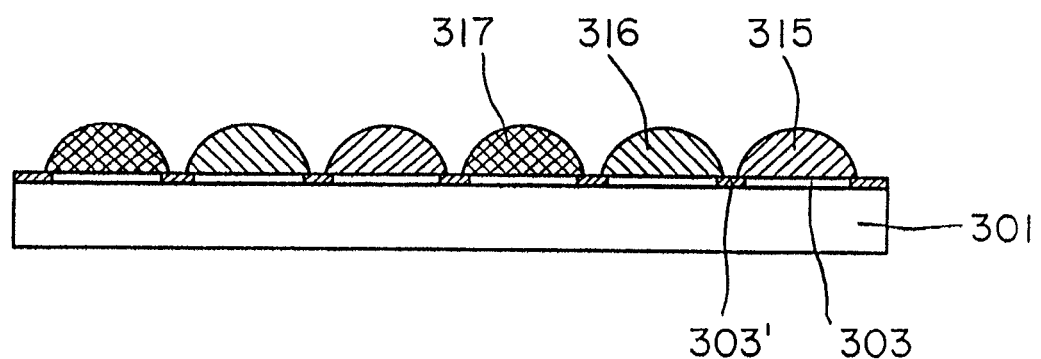
F I G. 24

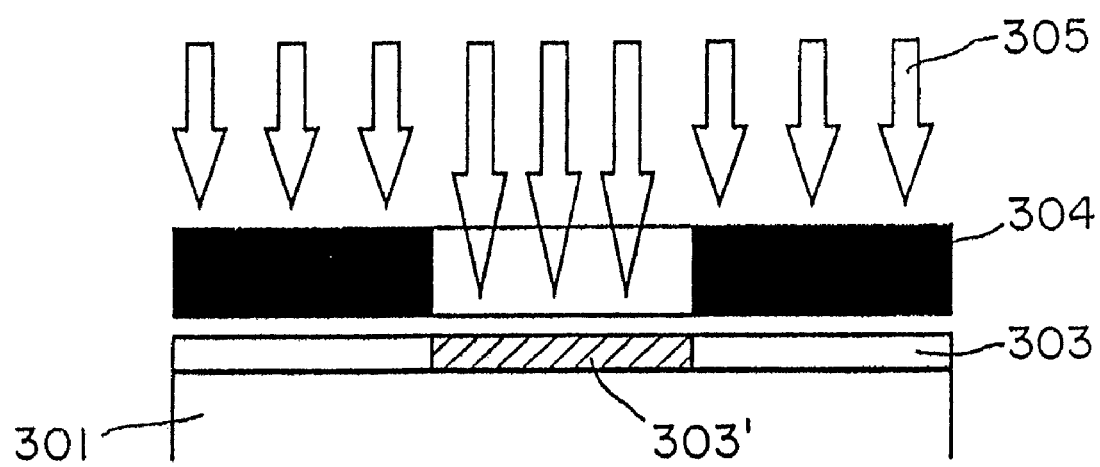
F I G. 25 A
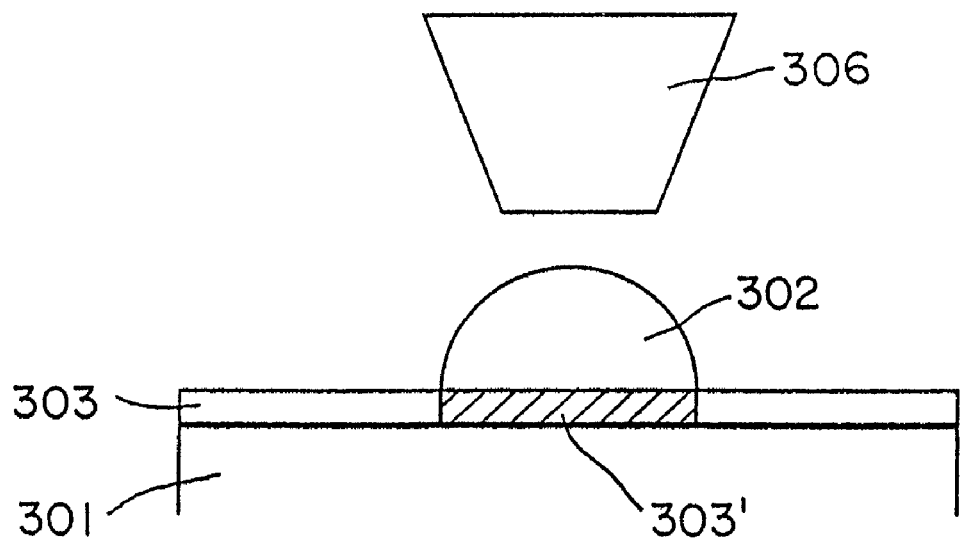
F I G. 25 B

STRUCTURE FOR PATTERN FORMATION, METHOD FOR PATTERN FORMATION, AND APPLICATION THEREOF

TECHNICAL FIELD

The present invention relates to a novel structure for pattern formation usable for various applications, preferably a structure for pattern formation utilizing a variation in wettability and a method for pattern formation, and application thereof to printing, color filters, lenses and the like.

BACKGROUND ART

Prior art techniques relevant to first invention A will be described.

Structures for pattern formation comprising a substrate having on its surface areas different from neighboring areas in wettability, for example, by liquids have been used in various technical fields. For example, in structures for pattern formation used in printing of designs, images, letters and the like, a pattern is provided which, upon transfer of a printing ink, receives or repels the ink. In some cases, this pattern is in the form of a patterned layer or a transferred layer formed on the structure for pattern formation according to a variation in wettability.

This will described by taking printing as an example. In plates for lithography, i.e., a kind of printing method, printing ink-receptive lipophilic areas and printing ink-unreceptive areas are provided on a flat plate. In use, an ink image to be printed is formed on the lipophilic areas and then transferred and printed onto paper or the like.

In this printing, a pattern of letters, figures or the like is formed on an original plate for a printing plate to prepare a printing plate that is then mounted on a printing machine. A large number of proposals have been made on original plates for printing plates that are used in offset printing which is representative lithography.

Plates for offset printing may be produced by a method wherein the original plate for a printing plate is exposed through a mask with a pattern drawn thereon followed by development, and a method wherein the original plate for a printing plate is directly exposed by electrophotography to prepare a printing plate. The original plate for an electrophotographic offset printing plate is prepared by a method which comprises the steps of: providing a photoconductive layer composed mainly of photoconductive particles of zinc oxide or the like and a binder resin on a conductive substrate to form a photoreceptor; exposing the photoreceptor by electrophotography to form a highly lipophilic image on the surface of the photoreceptor; and subsequently treating the photoreceptor with a desensitizing liquid to hydrophilify nonimage areas to prepare an original plate for offset printing. High critical surface tension areas are immersed in water or the like and is consequently lipophobified, and a printing ink is received by the lipophilic image areas followed by transfer onto paper or the like.

An original plate for waterless lithography has also been used wherein, instead of the immersion in water to form lipophobic areas, highly lipophobic areas are formed without relying upon immersion in water or the like to form ink-receptive areas and ink-unreceptive areas.

Further, a method for producing an original plate for lithography using a heat mode recording material has been proposed which can realize the formation of highly ink-receptive areas and ink-repellent areas by laser beam irradiation. Heat mode recording materials can eliminate the need to provide the step of development and the like, and advantageously enables printing plates to be produced simply by forming an image using a laser beam. They, however, suffer from problems associated with the regulation of laser beam intensity, the disposal of residues of solid materials denatured by the laser, the plate wear and the like.

Furthermore, photolithography is known as a method for forming a high definition pattern. In this method, for example, a photoresist layer coated onto a substrate is pattern-wise exposed, and the exposed photoresist is developed, followed by etching. Alternatively, a functional material is used in a photoresist, and the photoresist is exposed to directly form a contemplated pattern.

The formation of a high definition pattern by photolithography has been used for the formation of color patterns in color filters for liquid crystal displays and the like, the formation of microlenses, the production of high definition electric circuit boards, the production of chromium masks for pattern-wise exposure and other applications. In these methods, however, in addition to the use of the photoresist, development using a liquid developing solution or etching should be carried out after the exposure. This poses problems including the necessity of treating waste liquid. Further, use of a functional material as the photoresist disadvantageously raises problems including deterioration of the photoresist by an alkaline liquid or the like used in the development.

Formation of a high definition pattern for color filters or the like by printing or the like has also been carried out. Patterns formed by printing suffer from problems of positional accuracy and the like, and, hence, in this method, it is difficult to form high definition patterns.

In order to solve these problems, the present inventors have already proposed, in Japanese Patent Application No. 214845/1997, a structure for pattern formation and a method for pattern formation wherein a material, of which the wettability is variable through photocatalytic action, is used to form a pattern. According to the present invention, in the structure and method for pattern formation using a photocatalyst, structure and method for pattern formation having better properties are provided.

It is an object of the first invention A to provide a novel structure for pattern formation and a method for pattern formation. It is another object of the first invention A to provide a novel original plate for a printing plate that can solve the problems of the conventional original plates for printing plates. It is a further object of the first invention A to provide a structure for pattern formation and a method for pattern formation that can be used to provide functional elements having excellent properties.

Prior art techniques relevant to second invention B will be described.

In liquid crystal display devices (LCDs), color filters are used in both active matrix system and simple matrix system in order to cope with an increasing demand for color display in recent years. For example, in liquid crystal displays of active matrix system using a thin film transistor (TFT), the color filter has color patterns of the three primary colors of red (R), green (G), and blue (B), and electrodes corresponding respectively to pixels of R, G, and B are turned on or off to permit a liquid crystal to function as a shutter, whereby light passes through pixels of R, G, and B to perform color display. In the case of color mixing, liquid crystal shutters corresponding to two or more pixels are opened to mix colors together so that, on the principle of additive color process, a viewer sees a different color on the retina.

Examples of methods for producing conventional color filters include a dyeing method which comprises coating a dyeing substrate onto a transparent substrate, exposing the coated substrate through a photomask, conducting development to form a pattern, and dyeing the pattern to form a colored layer, a pigment dispersion method which comprises previously dispersing a color pigment in a photosensitive resist layer provided on a transparent substrate, exposing the resist layer through a photomask, and conducting development to form a colored layer, a printing method which comprises printing colored layers using printing inks onto a transparent substrate, and an electrodeposition method which comprises forming a transparent electrode pattern on a transparent substrate and repeating, three times for R, G, and B, the energization of the transparent electrode pattern in an electrode liquid of a predetermined color to electrodeposit the color, thereby forming patterns of the colors.

In the conventional dyeing method and pigment dispersion method, however, material loss cannot be avoided in the step of coating the transparent substrate by spin coating or the like, and, further, the step of development and the step of washing are necessary for the formation of a pattern of each color. This makes it difficult to improve the efficiency of use of the material and to simplify the process and hence hinders a reduction in production cost. On the other hand, for the printing method, the formation of high definition patterns is difficult, and, for the electrodeposition method, the shape of patterns formable by the electrodeposition is limited.

In order to eliminate the above problems, a process for producing a color filter by ink-jet system has been developed. This process, however, is still unsatisfactory for solution to the problems.

The second invention B has been made under these circumstances. It is an object of the present invention to provide a color filter having high definition and free from defects such as dropouts and to provide a production process of a color filter that is excellent in efficiency of use of the material and includes neither the step of development nor the step of washing, that is, is simple in process.

Prior art techniques relevant to the third invention will be described.

Among lenses used in the art, particularly a microlens or a microlens array comprising orderly arranged microlenses has been utilized in fine optics and other fields. For example, there is an ever-increasing demand for use of the microlens or the microlens array as components constituting liquid crystal displays and as components adjacent to charge coupled solid-state image pick-up device (CCD) used in video cameras and the like.

For the production of microlenses, for example, Japanese Patent Laid-Open Nos. 21901/1991 and 164904/1993 disclose a production process which comprises forming a transparent heat deformable resin pattern by etching through a mask and heat deforming the heat deformable resin pattern to form a microlens. In this process, however, the formation of fine lenses is difficult because the direction of etching is isotropic. Further, the regulation of the focal length of the lens is limited, and the process is complicate.

Japanese Patent Laid-Open No. 165932/1990 discloses another conventional process for producing a microlens which comprises ejecting droplets of a composition for a lens onto a transparent substrate and curing the deposited droplets to form a microlens array. In this process, however, the shape of the lens is restricted by the contact angle between the transparent substrate and the composition for the lens, making it difficult to regulate the focal length. Further, in order to provide a specific contact angle, a composition for a lens having a specific surface tension should be selected. This narrows the range of selectable materials. Furthermore, the shape of the contact face is limited to a circular one, and a contact face having a polygonal pattern cannot be provided. A further problem is that enhancing the radius of curvature requires for the substrate to repel the composition for a lens. This deteriorates the adhesion.

Further, Japanese Patent Laid-Open No. 206429/1993 proposes a method wherein functions of a microlens array and a color filter array comprising a plurality of stacked color filters can be realized by a single color microlens array layer.

The color microlens array may be produced, for example, by a process described in Japanese Patent Laid-Open No. 206429/1993. This process comprises forming a color filter array by photolithography, forming microlens dies on respective color filters, and transferring the dies onto the color filter array by isotropic etching to form a microlens of the color filter array. Further, Japanese Patent Application No. 201793/1996 discloses a production process which comprises forming recesses in a lens form in a glass substrate by using a photoresist and glass etching and filing colored lens materials into respective color portions. In the former production process, however, the process is very complicate, and, in the latter production process, a lens is formed in recesses of a glass substrate, posing problems including that it is very difficult to control the step of etching and the effect of lens cannot be attained without increasing the refractive index of the lens forming material.

The third invention C solves the above problems. It is an object of the present invention to provide a process for producing a lens in a simple manner, particularly a production process that can produce fine microlenses and a microlens array with good positional accuracy and enables the focal length of microlenses to be easily altered, and lenses, microlenses, and a microlens array produced by the production process.

Prior art techniques relevant to the fourth invention D will be described.

In plates for lithography, i.e., a kind of printing method, printing ink-receptive lipophilic areas and printing ink-unreceptive areas are provided on a flat plate. In use, an ink image to be printed is formed on the lipophilic areas, and the image is then transferred and printed onto paper or the like.

In this printing, various original plates for printing plates are used. After formation of a pattern of letters, figures or the like on plates, the plates are used for printing. A large number of proposals have been made on original plates for printing plates used in offset printing, representative lithographic plates. Among them, original plates for offset printing plates directly prepared by electrophotography have been widely used in the art. The original plate for an electrophotographic offset printing plate is prepared by a method which comprises the steps of: providing a photoconductive layer composed mainly of photoconductive particles of zinc oxide or the like and a binder resin on a conductive substrate to form a photoreceptor; exposing the photoreceptor by electrophotography to form a highly lipophilic image on the surface of the photoreceptor; and subsequently treating the photoreceptor with a desensitizing liquid to hydrophilify nonimage areas to prepare an original plate for offset printing. High critical surface tension areas are immersed in water or the like and is consequently lipophobified, and a printing ink is received by the lipophilic image areas followed by transfer onto paper or the like.

An original plate for waterless lithography has also been used wherein, instead of the immersion in water to form lipophobic areas, highly lipophobic areas are formed without relying upon immersion in water or the like to form ink-receptive areas and ink-unreceptive areas.

Further, a method for producing an original plate for lithography using a heat mode recording material has been proposed which can realize the formation of highly ink-receptive areas and ink-repellent areas by laser beam irradiation.

Heat mode recording materials can eliminate the need to provide the step of development and the like, and advantageously enables an original printing plate to be produced simply by forming an image using a laser beam. They, however, suffer from problems associated with the regulation of laser beam intensity, the disposal of residues of solid materials denatured by the laser, the plate wear and the like.

In order to solve these problems, the present inventors have already proposed, in Japanese Patent Application No. 214845/1997, a structure for pattern formation and a method for pattern formation wherein a material of which the wettability is variable through photocatalytic action is used to form a pattern. In this connection, the production of press plates having excellent properties by utilizing original plates for printing plates using the pattern forming structure using a photocatalyst has been desired in the art.

It is an object of the fourth invention D to provide a press plate having excellent properties by utilizing an original plate for a printing plate using a structure for pattern formation prepared through photocatalytic action.

DISCLOSURE OF THE INVENTION

Re: First Invention A

The present invention provides a structure for pattern formation adapted for optically forming a pattern, the structure comprising a photocatalyst-containing layer provided on a substrate, the photocatalyst-containing layer containing a material of which the wettability is variable through photocatalytic action upon pattern-wise exposure.

The present invention also provides a structure for pattern formation adapted for optically forming a pattern, the structure comprising: a substrate; a photocatalyst-containing layer provided on the substrate; and, provided on the photocatalyst-containing layer, a layer that is decomposable and removable through photocatalytic action upon pattern-wise exposure.

The present invention further provides a structure for pattern formation adapted for optically forming a pattern, the structure comprising: a substrate; a photocatalyst-containing layer provided on the substrate; and, provided on the photocatalyst-containing layer, a layer containing a material of which the wettability is variable through photocatalytic action upon pattern-wise exposure.

The present invention further provides a structure for pattern formation adapted for optically forming a pattern, the structure comprising a composition layer, the composition layer comprising a photocatalyst, a material decomposable through photocatalytic action upon pattern-wise exposure, and a binder.

In the above structure for pattern formation, the photocatalyst-containing layer may contain a compound having siloxane bonds.

In the above structure for pattern formation, the photocatalyst-containing layer may contain silicone.

In the above structure for pattern formation, fluoroalkyl groups may be bonded to silicon atoms in the silicone.

In the above structure for pattern formation, the silicone may have been prepared from a composition containing an organoalkoxysilane.

In the above structure for pattern formation, the silicone may have been prepared from a composition containing a reactive silicone compound.

In the above structure for pattern formation, the pattern forming structure may be an original plate for a printing plate.

The present invention further provides a method for pattern formation adapted for optically forming a pattern comprising exposing pattern-wise a structure for pattern formation comprising: a substrate; a photocatalyst-containing layer provided on the substrate, the photocatalyst-containing layer containing a material of which the wettability is variable through photocatalytic action, a structure for pattern formation comprising: a substrate; a photocatalyst-containing layer provided on the substrate; and, provided on the photocatalyst-containing layer, a layer containing a material of which the wettability is variable through photocatalytic action, a structure for pattern formation comprising: a substrate; a photocatalyst-containing layer provided on the substrate; and, provided on the photocatalyst-containing layer, a layer that, upon pattern-wise exposure, is decomposable and removable through photocatalytic action, or a structure for pattern formation comprising: a substrate; and a composition layer provided on the substrate, the composition layer comprising a photocatalyst, a material decomposable through photocatalytic action upon pattern-wise exposure, and a binder, to vary the wettability of the surface of the structure through photocatalytic action.

In the above method for pattern formation, the pattern-wise exposure of the photocatalyst-containing layer may be carried out by light beam exposure.

In the above method for pattern formation, the pattern-wise exposure of the photocatalyst-containing layer may be carried out by exposure through a photomask.

In the above method for pattern formation, the pattern-wise exposure of the photocatalyst-containing layer may be carried out while heating the structure for pattern formation.

The present invention further provides an element characterized by comprising: a substrate; the above structure for pattern formation provided on the substrate; and a functional layer provided on the structure for pattern formation in its areas corresponding to a pattern, of the structure for pattern formation, obtained by the above pattern-wise exposure.

The present invention further provides an element produced by transferring a functional layer onto another substrate, the functional layer being provided on a structure for pattern formation in its areas corresponding to a pattern, of the structure for pattern formation, obtained by the above pattern-wise exposure.

The present invention further relates to a process for producing an element, comprising the steps of: providing the above structure for pattern formation on a substrate; and forming a functional layer provided on the structure for pattern formation in its areas corresponding to a pattern, of the structure for pattern formation, obtained by the above pattern-wise exposure.

The present invention further relates to a process for producing an element, comprising the step of transferring a functional layer onto another substrate, the functional layer being provided on a structure for pattern formation in its areas corresponding to a pattern, of the structure for pattern formation, obtained by the above pattern-wise exposure, whereby the functional layer is formed on the another substrate.

The above process for producing an element may comprise the steps of: forming a composition for a functional layer onto the whole surface of a structure for pattern formation; and forming a patterned functional layer on the structure for pattern formation only in its wettability-varied exposed areas by utilizing the repellency of unexposed areas.

The above process for producing an element may comprise the steps of: forming a composition for a functional layer onto the whole surface of a structure for pattern formation; and removing the functional layer in its unexposed areas to form a patterned functional layer.

The above process for producing an element may comprise the steps of: forming a composition for a functional layer onto the whole surface of a structure for pattern formation; and forming a patterned functional layer on the structure for pattern formation only in its wettability-varied exposed areas by utilizing the repellency of unexposed areas.

The above process for producing an element may comprise the steps of: forming a composition for a functional layer onto the whole surface of a structure for pattern formation; and removing the functional layer in its unexposed areas to form a patterned functional layer.

In the above process for producing an element, the functional layer may be formed on the structure for pattern formation by coating a composition for a functional layer.

In the above process for producing an element, the functional layer may be formed on the structure for pattern formation by ejecting a composition for a functional layer through a nozzle.

In the above process for producing an element the functional layer may be formed on the structure for pattern formation by thermal or pressure transfer from a film coated with a composition for a functional layer.

In the above process for producing an element, the functional layer may be formed on the structure for pattern formation by film formation utilizing vacuum.

In the above process for producing an element, the functional layer may be formed on the structure for pattern formation by film formation utilizing electroless plating.

Re: Second Invention B

In order to attain the above object, the present invention provides a color filter comprising: a transparent substrate; a colored layer provided on the transparent substrate, the colored layer comprising a plurality of colors formed in a predetermined pattern; and a light shielding layer located at each boundary region between two adjacent colored layers, at least one of the colored layer and the light shielding layer having been formed on the transparent substrate through a wettability-variable component layer in its areas having specific wettability.

Further, the present invention provides a color filter comprising: a transparent substrate; a wettability-variable component layer provided on the transparent substrate; a colored layer of a plurality of colors provided in a predetermined pattern on the wettability-variable component layer in its areas having specific wettability; and a light shielding layer located at each boundary region between two adjacent colored layers.

Further, the present invention provides a color filter comprising: a transparent substrate provided with a light shielding layer in a predetermined pattern; a wettability-variable component layer provided on the transparent substrate so as to cover the light shielding layer; and a colored layer of a plurality of colors provided in a predetermined pattern on the wettability-variable component layer in its areas having specific wettability, the light shielding layer being located at each boundary region between two adjacent colored layers.

Further, the present invention provides a color filter comprising: a transparent substrate provided with a light shielding layer in a predetermined pattern; laminates, in number of desired colors, put on the transparent substrate so as to cover the light shielding layer, the laminates each comprising a wettability-variable component layer and a colored layer provided in a predetermined pattern on the wettability-varied component layer in its areas having specific wettability, the light shielding layer being located at each boundary region between two adjacent colored layers.

Further, the present invention provides a color filter comprising: a transparent substrate; a wettability-variable component layer provided on the transparent substrate; a light shielding layer provided in a predetermined pattern on the wettability-variable component layer in its areas having specific wettability; laminates, in number of desired colors, put on the wettability-variable component layer so as to cover the light shielding layer, the laminates each comprising a wettability-variable component layer and a colored layer provided in a predetermined pattern on the wettability-variable component layer in its areas having specific wettability, the light shielding layer being located at each boundary region between two adjacent colored layers.

In the color filter of the present invention, the areas having specific wettability may be areas having high critical surface tension.

In the color filter of the present invention, the wettability-variable component layer may be a photocatalyst-containing layer comprising at least a binder and a photocatalyst, the binder may contain an organopolysiloxane prepared from a composition containing a chloro-or alkoxysilane, or the binder may contain an organopolysiloxane prepared from a composition containing a reactive silicone.

In the color filter of the present invention, the wettability-variable component layer may be an organic polymer resin layer.

The present invention further provides a process for producing a color filter, comprising:

the first step of forming areas having specific wettability in a predetermined pattern on a transparent substrate and depositing a coating composition for a light shielding layer onto the areas having specific wettability to form a light shielding layer; and the second step of forming areas having specific wettability in a predetermined pattern on the transparent substrate and depositing a coating composition for a colored layer onto the areas having specific wettability to form a colored layer.

In the first step, a photocatalyst-containing layer comprising at least a binder and a photocatalyst may be formed on the transparent substrate and is then irradiated with light to permit light exposed areas to have high critical surface tension through photocatalytic action, thereby forming the areas having specific wettability, and, in the second step, the photocatalyst-containing layer is irradiated with light to permit light exposed areas to have high critical surface tension through photocatalytic action, thereby forming the areas having specific wettability.

The present invention further provides a process for producing a color filter, comprising:

the first step of forming areas having specific wettability in a predetermined pattern on a transparent substrate provided with a light shielding layer of a predetermined pattern; and the second step of depositing a coating composition for a colored layer onto the areas having specific wettability to form a colored layer.

In the first step, a photocatalyst-containing layer comprising at least a binder and a photocatalyst may be formed on the transparent substrate provided with the light shielding layer of a predetermined pattern so as to cover the light shielding layer, followed by irradiation with light to permit light exposed areas to have high critical surface tension through photocatalytic action, thereby forming the areas having specific wettability.

The present invention further provides a process for producing a color filter, comprising repeating the procedure for forming areas having specific wettability in a predetermined pattern on a transparent substrate, provided with a light shielding layer of a predetermined pattern, and depositing a coating composition for a colored layer onto the areas having specific wettability to form a colored layer as many times as required to form a necessary number of colored layers of a plurality of colors.

In the above process for producing a color filter, a photocatalyst-containing layer comprising at least a binder and a photocatalyst may be formed on the transparent substrate provided with the light shielding layer of a predetermined pattern so as to cover the light shielding layer, followed by irradiation with light to permit light exposed areas to have high critical surface tension through photocatalytic action, thereby forming the areas having specific wettability.

The present invention further provides a process for producing a color filter, comprising:

the first step of forming areas having specific wettability in a predetermined pattern on a transparent substrate and depositing a coating composition for a light shielding layer onto the areas having specific wettability to form a light shielding layer;

the second step of repeating the procedure for forming areas having specific wettability in a predetermined pattern on the transparent substrate and depositing a coating composition for a colored layer onto the wettable areas to form a colored layer as many times as required to form a necessary number of colored layers of a plurality of colors.

In the first step, a photocatalyst-containing layer comprising at least a binder and a photocatalyst may be formed on the transparent substrate followed by irradiation with light to permit light exposed areas to have high critical surface tension through photocatalytic action, thereby forming the areas having specific wettability, and, in the second step, a photocatalyst-containing layer comprising at least a binder and a photocatalyst may be formed so as to cover the light shielding layer followed by irradiation with light to permit light exposed areas to have high critical surface tension through photocatalytic action, thereby forming the areas having specific wettability.

In the above process for producing a color filter, exposure of the photocatalyst-containing layer to light may be carried out by any one of pattern-wise exposure through a mask and a light beam exposure.

In the above process for producing a color filter, the deposition of the coating composition for a light shielding layer and/or the coating composition for a colored layer may be carried out by any one of a coating method, a nozzle ejection method, and a vacuum thin film formation method. In the vacuum thin film formation method, after the formation of a thin film, the thin film formed of a coating composition for a light shielding layer or a coating composition for a colored layer deposited on areas other than the areas having specific wettability may be removed.

In the above inventions, areas having specific wettability have high wettability by the composition for a light shielding layer and the composition for a colored layer, so that the composition for a light shielding layer and the composition for a colored layer are selectively deposited only onto areas having specific wettability to form a light shielding layer and a colored layer with high accuracy. The photocatalyst-containing layer in its light exposed areas are brought to a high critical surface tension state through photocatalytic action to form the above areas having specific wettability.

Re: Third Invention

The present inventors have found that selective deposition of a liquid containing a material for a lens onto a pattern based on a difference in wettability followed by curing to form a lens can attain the above object. Specifically, the present invention provides a process for producing a lens, comprising the steps of:

forming a pattern based on a difference in wettability on the surface of a substrate;

depositing a liquid containing a material for a lens on the surface of the substrate in its areas having specific wettability; and curing the liquid containing the material for a lens to form a lens.

Re: Fourth Invention D

The present invention provides a plate for lithography, comprising: a substrate; a layer provided on the substrate, the wettability of the layer being variable upon pattern-wise exposure; a resin layer provided on areas of which the wettability has been varied upon pattern-wise exposure; and areas that have been hydrophilified or lipophilified upon whole exposure.

In the plate for lithography, the layer of which the wettability is variable upon exposure may comprise: a photocatalyst; and a material of which the wettability is variable through photocatalytic action.

In the plate for lithography, the material of which the wettability is variable may comprise a silicone resin.

In the plate for lithography, the resin layer may be ink repellent.

In the plate for lithography, the ink-repellent resin may be a silicone resin.

In the plate for lithography, the ink-repellent resin layer may be a silicone resin layer that has been crosslinked by a condensation reaction of SiOH groups with a hydrolyzable crosslinking agent.

In the plate for lithography, the ink-repellent resin layer may be a silicone resin layer that has been crosslinked by an addition reaction of SiH groups with vinyl groups.

In the above plate for lithography, the resin layer may be ink receptive and water repellent.

The present invention further provides a process for producing a plate for lithography, comprising the steps of: putting a layer onto a substrate, the wettability of the layer being variable through photocatalytic action upon pattern-wise exposure; pattern-wise exposing the layer; coating a resin composition to selectively form a resin layer on wettability-varied areas; and then conducting exposure to vary the wettability of areas not provided with the resin layer.

BRIEF DESCRIPTION OF THE DRAWINGS

FIG. 23 is a cross-sectional view showing a microlens array according to a preferred embodiment of the present invention;

FIG. 24 is a cross-sectional view showing a color microlens array according to a preferred embodiment of the present invention;

FIG. 25 is a diagram illustrating the production process of a microlens using a photocatalyst according to a preferred embodiment of the present invention;

BEST MODE FOR CARRYING OUT THE INVENTION

Re: First Invention A

Figure 1A:
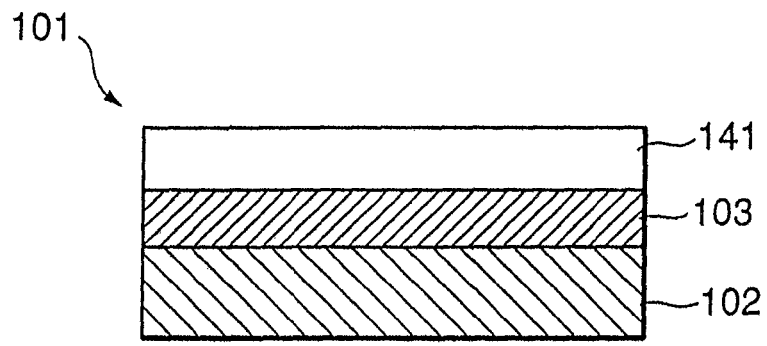
FIG. 1 is a diagram showing one embodiment of the present invention.

The present invention relates to a structure for pattern formation and a method for pattern formation wherein a pattern is formed by utilizing the action of a photocatalyst that, upon light irradiation, creates a chemical change of materials present around it. According to the present invention, the pattern, when used in printing of designs, images, letters and the like, refers to areas that, upon transfer of the printing ink, receive or repel the ink. Further, the structure for pattern formation according to the present invention may be utilized in applications other than printing. In this case, the pattern connotes areas, formed on a structure for pattern formation in response to a change in wettability, having properties different from those around them, and areas, on another substrate, obtained by transfer of the above areas onto the another substrate.

The mechanism of action of the photocatalyst typified by titanium oxide according to the present invention has not been fully elucidated yet. However, it is considered that carriers produced by light irradiation influence the chemical structure of the organic material through a direct reaction with a neighboring compound, or otherwise by active oxygen species produced in the presence of oxygen and water.

Proposals utilizing the photocatalytic action include one wherein oil stains are decomposed by light irradiation to hydrophilify the oil stains, enabling the oil stains to be washed away by water, one wherein a hydrophilic film is formed on the surface of glass or the like to impart antifogging properties, and one wherein a photocatalyst-containing layer is formed on the surface of tiles or the like to form the so-called antimicrobial tiles or the like that can reduce the number of bacteria floating in air.

Enhancement in receptivity of pattern areas to printing inks, toners or the like, or repellency of non-pattern areas to ink or the like by utilizing a material of which the wettability is variable through photocatalytic action, a layer which can be decomposed and removed by photocatalytic action, a layer containing a material of which the wettability is variable through photocatalytic action, a layer having a composition comprising a material decomposable through photocatalytic action and a binder and the like has realized the structure for pattern formation according to the present invention.

Photocatalysts usable in the structure for pattern formation and the method for pattern formation according to the present invention include metal oxides known as photosemiconductors, such as titanium oxide ($TiO_2$), zinc oxide (ZnO), tin oxide ($SnO_2$), strontium titanium oxide ($SrTiO_3$), tungsten oxide ($WO_3$), bismuth oxide ($Bi_2O_3$), and iron oxide ($Fe_2O_3$). Among them, titanium oxide is particularly preferred because it has high band gap energy and is chemically stable, nontoxic, and easily available.

Titanium oxide may be in anatase form or rutile form with anatase form of titanium oxide being preferred.

Preferably, the anatase form of titanium has a small particle diameter because the photocatalytic reaction takes place efficiently. The average particle diameter is preferably not more than 50 nm, more preferably not more than 20 nm. Examples of anatase form of titanium oxide usable herein include hydrochloric acid peptization type titania sols (STS-02, average crystal diameter 7 nm, manufactured by Ishihara Sangyo Kaisha Ltd.) and nitric acid peptization type titania sols (TA-15, average crystal diameter 12 nm, manufactured by Nissan Chemical Industries Ltd.).

The photocatalyst-containing layer according to the present invention may be formed by dispersing a photocatalyst in a binder. The photocatalyst has a fear of decomposing the binder as well upon photoexcitation. Therefore, the binder should have satisfactory resistance to photo-oxidation by the photocatalyst. Further, when use of the structure for pattern formation as printing plates is taken into consideration, plate wear and abrasion resistance are also required of the photocatalyst-containing layer.

A silicone resin having siloxane bonds (—Si—O—) in its main skeleton may be used as the binder that can satisfy the above requirements.

In the silicone resin, organic groups are bonded to silicon atoms. As described in detail in working examples, upon photoexcitation of the photocatalyst, the organic groups bonded to silicon atoms in the silicone molecule are replaced with oxygen-containing groups, resulting in improved wettability. Therefore, the silicone resin functions also as a material of which the wettability is variable.

The silicone resin may be a hydrolysis condensate or a cohydrolysis condensate of at least one member selected from silicon compounds represented by general formula $Y_nSiX_{4-n}$ wherein n is 1 to 3; Y represents an alkyl, fluoroalkyl, vinyl, amino, or epoxy group; and X represents a halogen or a methoxy, ethoxy, or acetyl group.

Specific examples thereof include methyltrichlorosilane, methyltribromosilane, methyltrimethoxysilane, methyltriethoxysilane, methyltriisopropoxysilane, methyl-tri-t-butoxysilane; ethyltrichlorosilane, ethyltribromosilane, ethyltrimethoxysilane, ethyltriethoxysilane, ethyltriisopropoxysilane, ethyl-tri-t-butoxysilane; n-propyltrichlorosilane, n-propyltribromosilane, n-propyltrimethoxysilane, n-propyltriethoxysilane, n-propyltriisopropoxysilane, n-propyl-tri-t-butoxysilane; n-hexyltrichlorosilane, n-hexyltribromosilane, n-hexyltrimethoxysilane, n-hexyltriethoxysilane, n-hexyltriisopropoxysilane, n-hexyl-tri-t-butoxysilane; n-decyltrichlorosilane, n-decyltribromosilane, n-decyltrimethoxysilane, n-decyltriethoxysilane, n-decyltriisopropoxysilane, n-decyl-tri-t-butoxysilane; n-octadecyltrichlorosilane, n-octadecyltribromosilane, n-octadecyltrimethoxysilane, n-octadecyltriethoxysilane, n-octadecyltriisopropoxysilane, n-octadecyl-tri-t-butoxysilane; phenyltrichlorosilane, phenyltribromosilane, phenyltrimethoxysilane, phenyltriethoxysilane, phenyltriisopropoxysilane, phenyl-tri-t-butoxysilane; tetrachlorosilane, tetrabromosilane, tetramethoxysilane, tetraethoxysilane, tetrabutoxysilane, dimethoxydiethoxysilane; dimethyldichlorosilane, dimethyldibromosilane, dimethyldimethoxysilane, dimethyldiethoxysilane; diphenyldichlorosilane, diphenyldibromosilane, diphenyldimethoxysilane, diphenyldiethoxysilane; phenylmethyldichlorosilane, phenylmethyldibromosilane, phenylmethyldimethoxysilane, phenylmethyldiethoxysilane; trichlorohydrosilane, tribromohydrosilane, trimethoxyhydrosilane, triethoxyhydrosilane, triisopropoxyhydrosilane, tri-t-butoxyhydrosilane; vinyltrichlorosilane, vinyltribromosilane, vinyltrimethoxysilane, vinyltriethoxysilane, vinyltriisopropoxysilane, vinyl-tri-t-butoxysilane; trifluoropropyltrichlorosilane, trifluoropropyltribromosilane, trifluoropropyltrimethoxysilane, trifluoropropyltriethoxysilane, trifluoropropyltriisopropoxysilane, trifluoropropyl-tri-t-butoxysilane; γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyl-tri-t-butoxysilane; γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyl-tri-t-butoxysilane; γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyl-tri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyl-tri-t-butoxysilane; β-(3,4-epoxycyclohexyl)ethyltrimethoxysilane, β-(3,4-epoxycyclohexyl)ethyltriethoxysilane; and partial hydrolyzates thereof; and mixtures thereof.

When the binder layer comprises an organoalkoxysilane, preferably, 10 to 30% by weight of the organoalkoxysilane is accounted for by a bifunctional silicone precursor, for example, a dialkoxydimethylsilane. When use of the organoalkoxysilane in the sol-gel process is contemplated, preferably, the organoalkoxysilane is composed mainly of a trialkoxymethylsilane which is a trifunctional silicone precursor from the viewpoint of improving the crosslinking density. When a difference in wettability is created as in the present invention, incorporation of a large amount of dimethylsiloxane component rather than a methylsiloxane component can improve water repellency and oil repellency.

The silicone molecule may contain fluoroalkyl groups as organic groups bonded to silicon atoms. In this case, the critical surface tension of unexposed areas are further lowered. Therefore, the repellency of the ink and the composition for a functional layer by the unexposed areas is improved, the function of inhibiting the deposition of the ink or the composition for a functional layer is increased, and, in addition, the range of usable materials for the ink or the composition for a functional layer is increased.

Specifically, the silicone is formed from at least one member selected from hydrolysis condensates and cohydrolysis condensates of the following fluoroalkylsilanes. Compounds containing fluoroalkyl groups include the following compounds. Compounds generally known as fluorosilane coupling agents may also be used.

$CF_3(CF_2)_3CH_2CH_2Si(OCH_3)_3$,
$CF_3(CF_2)_5CH_2CH_2Si(OCH_3)_3$,
$CF_3(CF_2)_7CH_2CH_2Si(OCH_3)_3$,
$CF_3(CF_2)_9CH_2CH_2Si(OCH_3)_3$,
$(CF_3)_2CF(CF_2)_4CH_2CH_2Si(OCH_3)_3$,
$(CF_3)_2CF(CF_2)_6CH_2Cl_2Si(OCH_3)_3$,
$(CF_3)_2CF(CF_2)_8CH_2CH_2Si(OCH_3)_3$,
$CF_3(C_6H_4)C_2H_4Si(OCH_3)_3$,
$CF_3(CF_2)_3(C_6H_4)C_2H_4Si(OCH_3)_3$,

CF$_3$(CF$_2$)$_5$(C$_6$H$_4$)C$_2$H$_4$Si(OCH$_3$)$_3$,
CF$_3$(CF$_2$)$_7$(C$_6$H$_4$)C$_2$H$_4$Si(OCH$_3$)$_3$,
CF$_3$(CF$_2$)$_3$CH$_2$CH$_2$SiCH$_3$(OCH$_3$)$_2$,
CF$_3$(CF$_2$)$_5$CH$_2$CH$_2$SiCH$_3$(OCH$_3$)$_2$,
CF$_3$(CF$_2$)$_7$CH$_2$CH$_2$SiCH$_3$(OCH$_3$)$_2$,
CF$_3$(CF$_2$)$_9$CH$_2$CH$_2$SiCH$_3$(OCH$_3$)$_2$,
(CF$_3$)$_2$CF(CF$_2$)$_4$CH$_2$CH$_2$SiCH$_3$(OCH$_3$)$_2$,
(CF$_3$)$_2$CF(CF$_2$)$_6$CH$_2$CH$_2$SiCH$_3$(OCH$_3$)$_2$,
(CF$_3$)$_2$CF(CF$_2$)$_8$CH$_2$CH$_2$SiCH$_3$(OCH$_3$)$_2$,
CF$_3$(C$_6$H$_4$)C$_2$H$_4$SiCH$_3$(OCH$_3$)$_2$,
CF$_3$(CF$_2$)$_3$(C$_{61}$H$_4$)C$_2$H$_4$SiCH$_3$(OCH$_3$)$_2$,
CF$_3$(CF$_2$)$_5$(C$_6$H$_4$)C$_2$H$_4$SiCH$_3$(OCH$_3$)$_2$,
CF$_3$(CF$_2$)$_7$(C$_6$H$_4$)C$_2$H$_4$SiCH$_3$(OCH$_3$)$_2$,
CF$_3$(CF$_2$)$_3$CH$_2$CH$_2$Si(OCH$_2$CH$_3$)$_3$,
CF$_3$(CF$_2$)$_5$CH$_2$CH$_2$Si(OCH$_2$CH$_3$)$_3$,
CF$_3$(CF$_2$)$_7$CH$_2$CH$_2$Si(OCH$_2$CH$_3$)$_3$,
CF$_3$(CF$_2$)$_9$CH$_2$CH$_2$Si(OCH$_2$CH$_3$)$_3$, and
CF$_3$(CF$_2$)$_7$SO$_2$N(C$_2$H$_5$)CH$_2$CH$_2$CH$_2$Si(OCH$_3$)$_3$ In order to provide better repellency of the ink and the composition for a functional layer by unexposed areas, the silicone is preferably a reactive linear silicone, more preferred a silicone prepared by crosslinking dimethylpolysiloxane at low crosslinking density. Typically, silicones obtained by crosslinking compounds comprising the following repeating units are preferred:

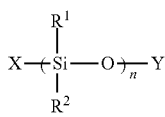

Formula A-1 wherein n is an integer of two or more; and R$^1$ and R$^2$ represent a substituted or unsubstituted alkyl, alkenyl, aryl, or cyanoalkyl group having 1 to 10 carbon atoms. R$^1$ and R$^2$ preferably represent a methyl group because the surface free energy of the silicone is the smallest. The molar proportion of the methyl group is preferably not less than 60%.

The molecular weight of the silicone is preferably 500 to 1,000,000. When the molecular weight is excessively small, the content of R$^1$ and R$^2$ is relatively low, making it difficult to develop the water repellency, oil repellency and the like. On the other hand, when the molecular weight is excessively large, the content of the end in X and Y is low, posing a problem that the crossing density is small.

X and Y, which may be the same or different, are selected from the following groups. R represents a hydrocarbon chain having 10 or less carbon atoms.

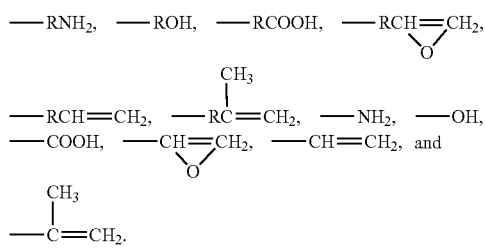

Formula A-2

Reactive modified silicones usable in the present invention may be either one wherein crosslinking is performed by condensation or one wherein crosslinking is performed in the presence of a crosslinking agent. When the crosslinking is performed by condensation, a tin, zinc, lead, calcium, or manganese salt of carboxylic acid, preferably, a laurate or chloroplatinic acid, may be added as a catalyst.

On the other hand, when the crosslinking is performed in the presence of a crosslinking agent, crosslinking agents usable herein include isocyanates commonly used as crosslinking agents in the art. Preferred examples thereof are as follows:

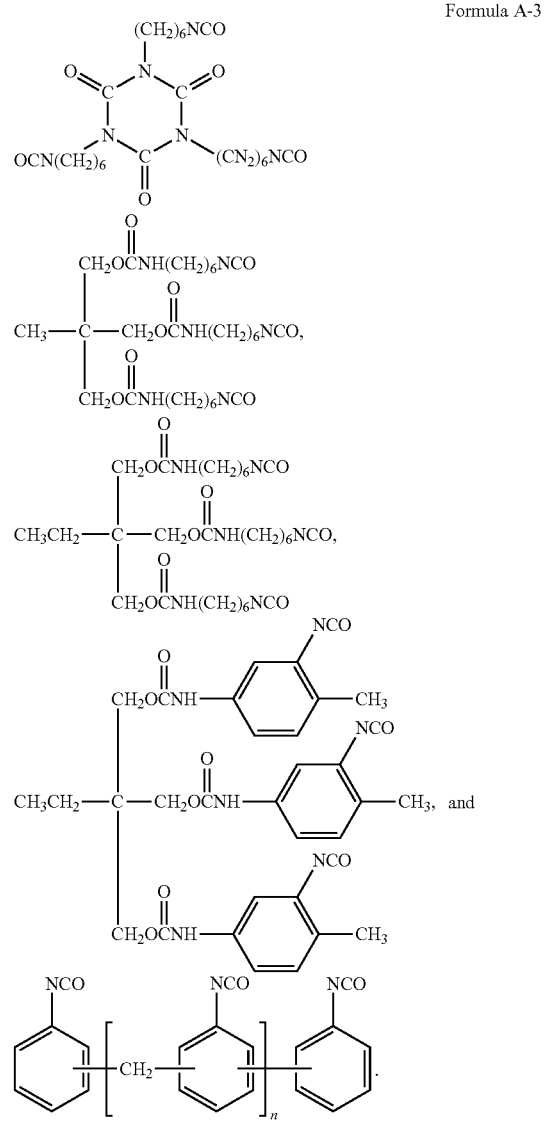

Formula A-3

The reactive silicone compound may be of aqueous emulsion type. The aqueous emulsion type compound is easy to handle because an aqueous solvent is used.

According to the present invention, the water repellency and the oil repellency may be enhanced by incorporating the reactive silicone compound as the binder in combination with a stable organosiloxane compound that does not cause any crosslinking reaction, such as dimethylpolysiloxane.

In this case, not less than 60% by weight of the siloxane contained in a layer formed from a compound containing a reactive silicone compound is preferably accounted for by the siloxane obtained from the reactive silicone compound.

When the proportion is less than 60% by weight, the amount of dimethylsiloxane is reduced, unfavorably resulting in deteriorated water repellency and oil repellency.

The binder may be an amorphous silica precursor. Preferred are silicon compounds represented by general formula $SiX_4$ wherein X represents a halogen, a methoxy, ethoxy, or acetyl group or the like, silanols which are hydrolyzates of the silicon compounds, and polysiloxanes having an average molecular weight of not more than 3000.

Specific examples thereof include tetraethoxysilane, tetraisopropoxysilane, tetra-n-propoxysilane, tetrabutoxysilane, and tetramethoxysilane. In this case, a photocatalyst-containing film may be formed by homogeneously dispersing an amorphous silica precursor and photocatalyst particles in a nonaqueous solvent, utilizing moisture in air to form a silanol through hydrolysis on a substrate, and conducting dehydropolycondensation at room temperature. When the dehydropolycondensation of the silanol is carried out at 100° C. or above, the degree of polymerization is increased, realizing improved strength of the film surface. These binders may be used alone or as a mixture of two or more.

Titanium oxide alone may be used for the film formation without use of any binder. In this case, amorphous titania is formed on a substrate followed by firing to cause a phase change to crystalline titania. The amorphous titania may be obtained, for example, by hydrolyzing and dehydrocondensing an inorganic salt of titanium, such as titanium tetrachloride, titanium sulfate, or hydrolyzing and dehydrocondensing an organotitanium compound, such as tetraethoxytitanium, tetraisopropoxytitanium, tetra-n-propoxytitanium, tetrabutoxytitanium, or tetramethoxytitanium, in the presence of an acid.

Next, the amorphous titania may be transformed to anatase form of titania by firing at 400 to 500° C. and may be transformed to rutile form of titania by filing at 600 to 700° C.

In the layer containing at least one of an organosiloxane and amorphous silica, and a photocatalyst, the content of photocatalyst is preferably 5 to 60% by weight, more preferably 20 to 40% by weight.

The photocatalyst and the binder may be dispersed in a solvent to prepare a coating liquid followed by coating of the liquid. Solvents usable herein include alcoholic organic solvents, such as ethanol and isopropanol.

Titanium, aluminum, zirconium, and chromium coupling agents may also be used.

The photocatalyst-containing coating liquid may be coated onto the substrate by spray coating, dip coating, roll coating, bead coating or the like. When an ultraviolet curable component is contained as the binder, curing by ultraviolet irradiation results in the formation of a photocatalyst-containing composition layer on the substrate.

The excitation wavelength of the anatase form of titania is not more than 380 nm. Therefore, the excitation of this type of photocatalysts should be carried out using ultraviolet light. Ultraviolet light sources usable herein include mercury lamps, metal halide lamps, xenon lamps, excimer lamps, excimer layer, YAG laser, and other ultraviolet light sources. The wettability of the film surface may be varied by varying the ultraviolet light intensity, exposure and the like.

When the exposure is carried out using a fine beam of a laser or the like, a desired image pattern may be directly formed without use of any mask. In the case of other light sources, a pattern is formed by light irradiation using a mask with a desired pattern formed thereon. Pattern forming masks usable herein include masks wherein a pattern is formed on a metal sheet, such as vapor deposition masks, photomasks wherein a pattern is formed using a metallic chromium on a glass sheet, and, for printing applications, plate preparation films.

The structure for pattern formation may be rendered sensitive to visible and other wavelengths by doping with metal ions of chromium, platinum, palladium or the like, by addition of fluorescent materials, or addition of photosensitive dyes. Examples of dyes usable herein include cyanine dyes, carbocyanine dyes, dicarbocyanine dyes, hemicyanine dyes, and other cyanine dyes. Other useful dyes include diphenylmethane dyes, for example, triphenylmethane dyes, such as Crystal Violet and basic fuchsine, xanthene dyes, such as Rhodamine B, Victoria Blue, Brilliant Green, Malachite Green, Methylene Blue, pyrylium salts, benzopyrylium salts, trimethylbenzopyrylium salts, and triallylcarbonium salts.

When a mask is used in exposing the structure for pattern formation according to the present invention, the resolution can be enhanced by conducting the exposure in intimate contact of the mask with the photocatalyst-containing layer. In this case, however, the sensitivity is remarkably lowered. Preferably, the exposure is carried out while leaving a spacing of about 100 μm between the mask and the photocatalyst-containing layer.

Exposure while blowing air into between the mask and the structure for pattern formation can accelerate the reaction and can improve the sensitivity and, in addition, can prevent heterogeneous exposure derived from a difference in position between the center portion and the portion around the portion. Further, exposure while heating of the structure for pattern formation can improve the sensitivity. Furthermore, a fine pattern may also be formed by reduction projection exposure wherein the image of a mask pattern is reduced using a reduction optical system.

Substrates usable in the structure for pattern formation according to the present invention include glasses, metals, such as aluminum and alloys thereof, plastics, woven fabrics, and nonwoven fabrics that are used according to application of the structure for pattern formation or elements with a pattern formed thereon. According to the structure for pattern formation according to the present invention, prior to the coating of the composition for a photocatalyst-containing layer, a primer layer may be formed on the substrate from the viewpoints of an improvement in adhesion, an improvement in surface roughness, the prevention of substrates from being deteriorated through photocatalytic action, the prevention of a lowering in photocatalytic activity and the like. Materials for the primer layer usable herein include resins composed mainly of a siloxane structure, fluororesins, epoxy resins, and polyurethane resins.

Figure 1B:
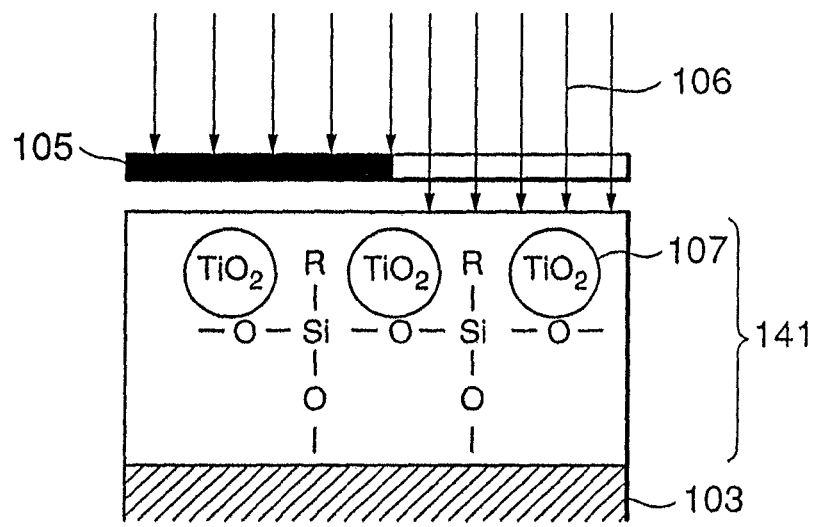
Figure 1C:
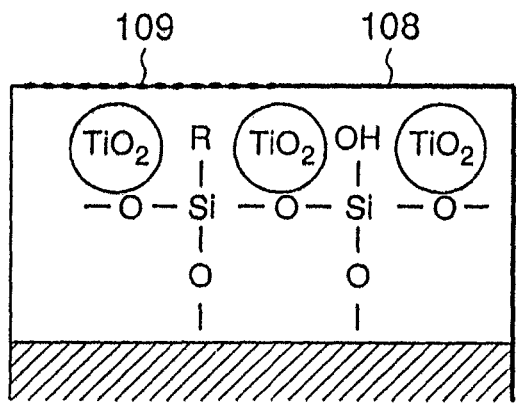

According to one embodiment of the structure for pattern formation according to the present invention, as shown in FIG. 1(A), a structure 101 for pattern formation may comprise a photocatalyst-containing layer 141 provided either directly or through a primer layer 103 on a substrate 102. As shown in FIG. 1(B), in order to record pattern information, exposure 106 is carried out in a predetermined pattern 105. As shown in FIG. 1(C), alkyl chains of the silicone compound are converted to OH groups through the action of a photocatalyst 107, and high critical surface tension areas 108 are formed in the surface having low critical surface tension according to the exposed pattern, permitting pattern information to be recorded by utilizing a difference in wettability between the high critical surface tension areas 108 and the low critical surface tension areas 109.

Figure 2A:
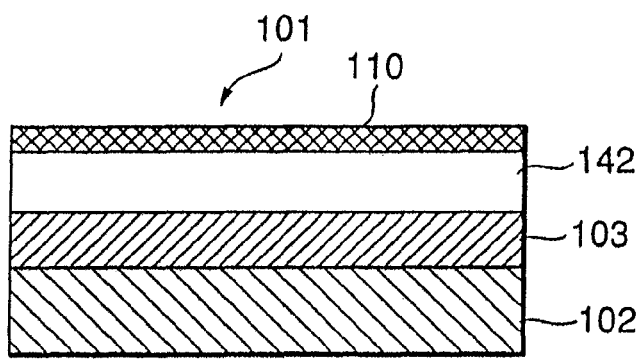
FIG. 2 is a diagram showing another embodiment of the present invention.
Figure 2B:
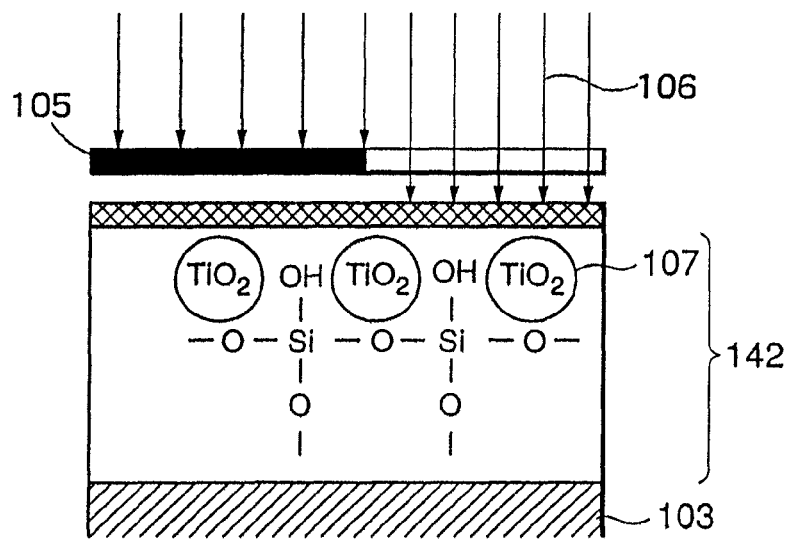
Figure 2C:
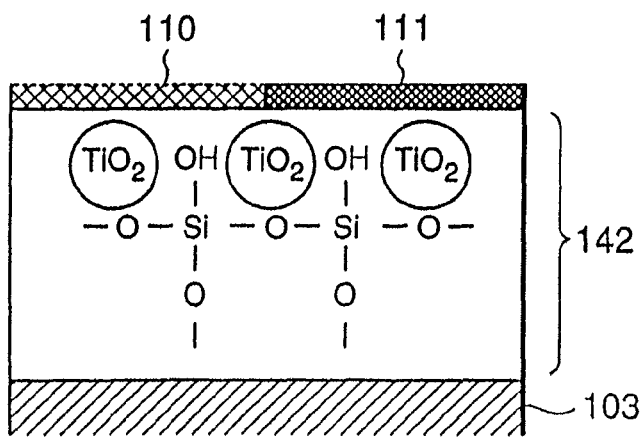

The structure for pattern formation according to a second embodiment of the present invention, as shown in FIG. 2(A), comprises a substrate 102, a primer layer 103 provided on the substrate 102, a photocatalyst-containing layer 142 provided on the primer layer 103, and a wettability-variable material layer 110 provided on the photocatalyst-containing layer 142, the wettability of the wettability-variable material layer 110 being variable through photocatalytic action upon exposure to light. As shown in FIG. 2(B), exposure 106 is carried out in a pattern 105 to form, as shown in FIG. 2(C), areas 111 having specific wettability according to the pattern. Thus, pattern information is recorded.

In the case of the second embodiment, a photocatalyst-containing layer of a hydrolyzate or a partial hydrolyzate of a composition comprising a photocatalyst dispersed in a binder precursor or the like is formed, and a thin film of an organic material having low critical surface tensions then formed. The photocatalyst layer may be formed by the photocatalyst per se. The thin film of an organic material may be used by solution coating, surface grafting, surfactant treatment, or gaseous phase film formation such as PVD or CVD.

Organic materials usable herein include monomeric compounds, polymeric compounds, and surfactants, the wettability of these materials being variable by the photocatalyst.

Specific examples of organic materials usable herein include silane compounds that permit organic groups to be converted to hydroxyl groups through photocatalytic action, such as silane coupling agents, chlorosilanes, alkoxysilanes, or hydrolysis condensates and cohydrolysis condensates of two or more of them.

Figure 3A:
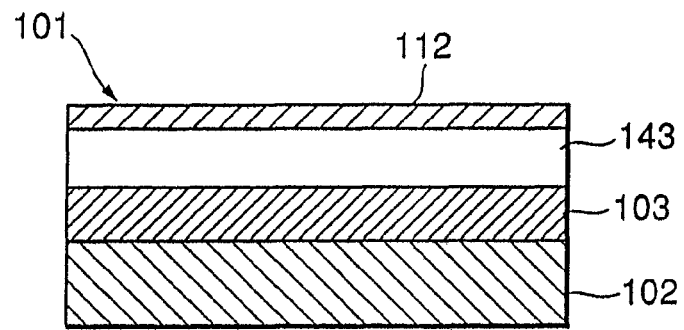
FIG. 3 is a diagram showing still another embodiment of the present invention.
Figure 3B:
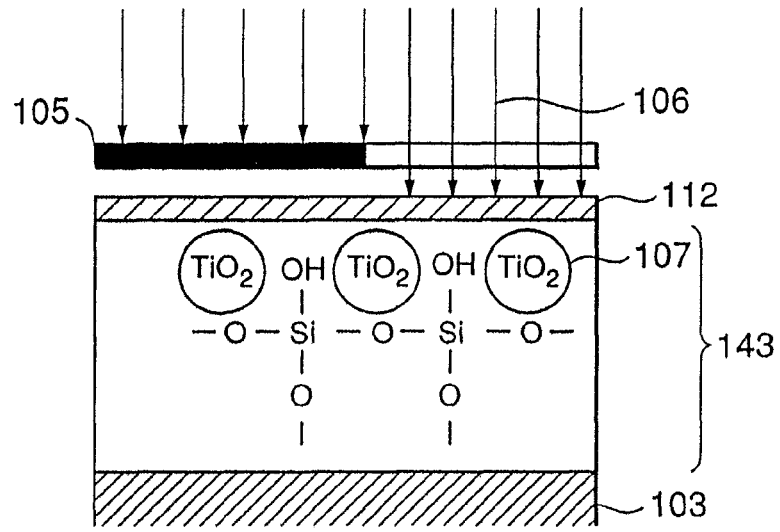
Figure 3C:
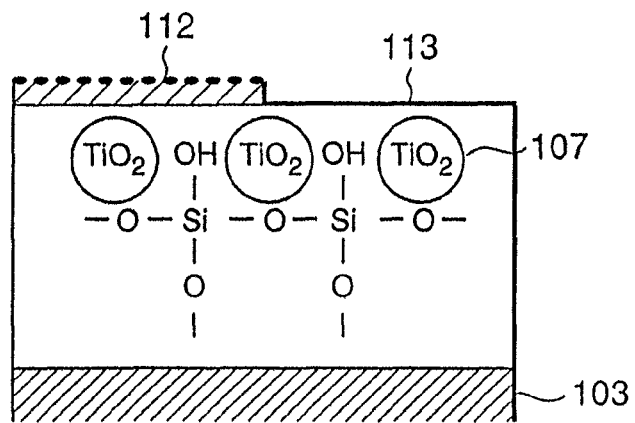

The structure for pattern formation according to a third embodiment of the present invention, as shown in FIG. 3(A), comprises a substrate 102, a photocatalyst-containing layer 143 provided on the substrate 102, and a material layer 112 provided on the photocatalyst-containing layer 143, the layer 112 being formed of a material that, upon light irradiation, can be decomposed and removed through photocatalytic action. As shown in FIG. 3(B), exposure 106 is carried out in a pattern 105, and, as shown in FIG. 3(C), areas having specific wettability 113 are formed according to the pattern. Thus, pattern information is recorded.

In the third embodiment, a photocatalyst-containing layer of a hydrolyzate or a partial hydrolyzate of a composition comprising a photocatalyst dispersed in a binder precursor or the like is formed, and a thin film of an organic material having low critical surface tension is then formed. The catalyst layer may be formed by the photocatalyst per se. The thin film of an organic material may be used by solution coating, surface grafting, surfactant treatment, or gaseous phase film formation such as PVD or CVD.

Specific examples of organic materials usable herein include hydrocarbon nonionic surfactants, such as NIKKOL BL, BC, BO, and BB series manufactured by Nihon Surfactant Kogyo K.K.; and fluoro or silicone nonionic surfactants, such as ZONYL FSN and FSO, manufactured by E.I. du Pont de Nemours & Co., SurfluonS-141 and 145 manufactured by Asahi Glass Co., Ltd., Megafac F-141 and 144 manufactured by Dainippon Ink and Chemicals, Inc., Ftergent F-200 and F-251, manufactured by Neos Co., Ltd.; Unidyne DS-401 and 402 manufactured by Daikin Industries, Ltd., and Fluorad FC-170 and 176 manufactured by Sumitomo 3M Ltd. Cationic, anionic, and amphoteric surfactants may also be used.

Examples of organic materials other than surfactants usable herein include oligomers and polymers, such as polyvinyl alcohol, unsaturated polyesters, acrylic resins, polyethylene, diallyl phthalate, ethylene propylene diene monomer, epoxy resin, phenolic resin, polyurethane, melamine resin, polycarbonate, polyvinyl chloride, polyamide, polyimide, styrene butadiene rubber, chloroprene rubber, polypropylene, polybutylene, polystyrene, polyvinyl acetate, nylon, polyester, polybutadiene, polybenzimidazole, polyacrylonitrile, epichlorohydrin, polysulfide, and polyisoprene.

Figure 4A:
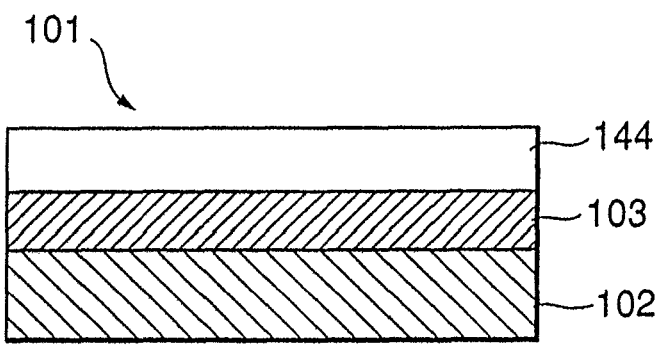
FIG. 4 is a diagram showing a further embodiment of the present invention.
Figure 4B:
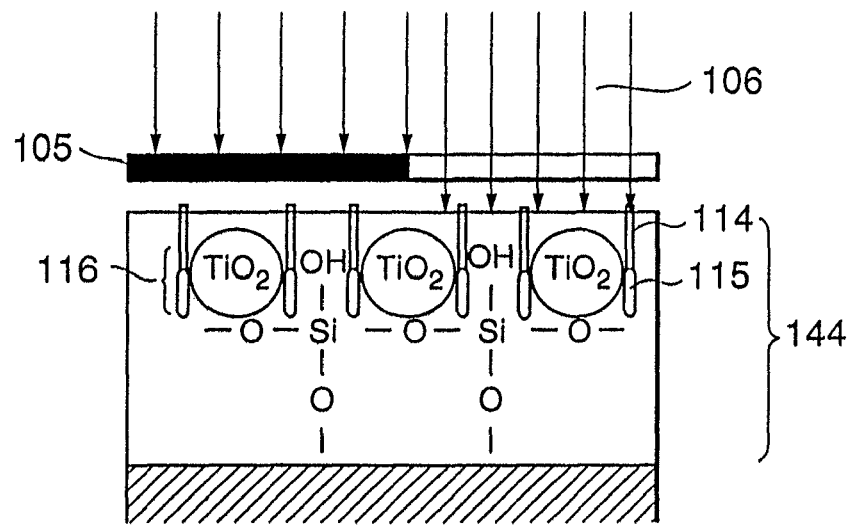
Figure 4C:
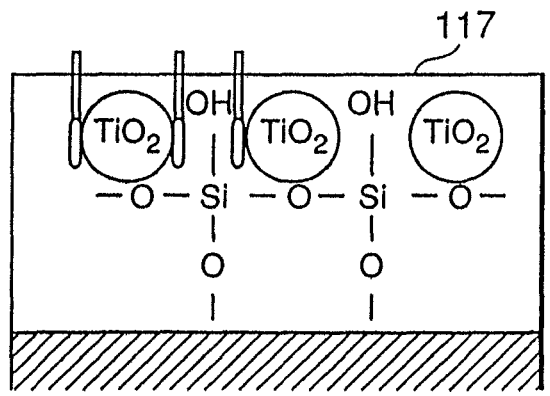

The structure for pattern formation according to a fourth embodiment of the present invention, as shown in FIG. 4(A), comprises a substrate 102, a primer layer 103 provided on the substrate 102, and a photocatalyst-containing layer 144 containing a photocatalyst, a binder, and a photocatalytically decomposable material 116, comprising a hydrophobic portion 114 and a hydrophilic portion 115, decomposable through photocatalytic action upon exposure to light. A layer consisting of the photocatalyst and the photocatalytically decomposable material alone may be formed instead of the photocatalyst-containing layer. As shown in FIG. 4(B), exposure 106 is carried out in a predetermined pattern 105. As a result, as shown in FIG. 4(C), the photocatalytically decomposable material 116 comprising the hydrophobic portion 114 and the hydrophilic portion 115 present in predetermined areas is decomposed by photocatalytic action to form areas 117 of which the surface wettability has been varied according to the exposed 106 pattern. Thus, pattern information is recorded.

Preferred materials capable of varying the wettability of the surface include those that can regulate the wettability of the photocatalyst-containing layer as desired by varying the kind and amount thereof added, for example, surfactants.

Surfactants are preferred as the material capable of varying the wettability, and specific examples thereof include hydrocarbon nonionic surfactants, such as NIKKOL BL, BC, BO, and BB series manufactured by Nihon Surfactant Kogyo K.K.; and fluoro or silicone nonionic surfactants, such as ZONYL FSN and FSO, manufactured by E.I. du Pont de Nemours & Co., SurfluonS-141 and 145 manufactured by Asahi Glass Co., Ltd., Megafac F-141 and 144 manufactured by Dainippon Ink and Chemicals, Inc., Ftergent F-200 and F-251, manufactured by Neos Co., Ltd.; Unidyne DS-401 and 402 manufactured by Daikin Industries, Ltd., and Fluorad FC-170 and 176 manufactured by Sumitomo 3M Ltd. Cationic, anionic, and amphoteric surfactants may also be used.

Examples of organic materials other than surfactants usable herein include oligomers and polymers, such as polyvinyl alcohol, unsaturated polyesters, acrylic resins, polyethylene, diallyl phthalate, ethylene propylene diene monomer, epoxy resin, phenolic resin, polyurethane, melamine resin, polycarbonate, polyvinyl chloride, polyamide, polyimide, styrene butadiene rubber, chloroprene rubber, polypropylene, polybutylene, polystyrene, polyvinyl acetate, nylon, polyester, polybutadiene, polybenzimidazole, polyacrylonitrile, epichlorohydrin, polysulfide, and polyisoprene.

Use of a composition comprising 5 to 60% by weight of the photocatalyst, 95 to 40% by weight of amorphous silica, and 0.1 to 55% by weight of the material of which the wettability is variable through photocatalytic action is preferred.

According to the structure for pattern formation of the present invention, the surface free energy is varied through the action of the catalyst in the composition, and the wettability-varied areas have varied receptivity to printing ink. Therefore, the structure for pattern formation may be used as printing plates. Use of the structure for pattern formation according to the present invention as an original plate for a printing plate can eliminate the need to provide the step of wet development and the like and can offer a feature that the preparation of a printing plate is completed simultaneously with exposure. The formation of a pattern on the structure for pattern formation according to the present invention may be performed by exposure through a process film or the like or by direct pattern formation using a laser or the like.

In preparing an original plate for a printing plate, substrates usable herein include those commonly used in offset printing plates, such as aluminum. Alternatively, a pattern may be formed by coating a photocatalyst-containing layer onto a screen of a woven fabric or a nonwoven fabric and exposing the photocatalyst-containing layer. When the substrate is constituted by a material, such as a plastic, that has a fear of being deteriorated by the photo-oxidation activity of the photocatalyst, a silicone, a fluororesin or the like may be previously coated onto the substrate to form a protective layer. The substrate may be in any desired form, such as a sheet, a ribbon, or a roll.

A photochromic material, which undergoes a change in color upon exposure to light, such as spiropyrone, or an organic dye decomposable through photocatalytic action may be incorporated into the composition to form a visualized pattern.

When unexposed areas are designed to be receptive to printing ink and repellent to dampening water, the structure for pattern formation according to the present invention may be used also as conventional offset printing plates using dampening water.

When use of the structure for pattern formation according to the present invention as an element with a pattern laminated thereon is contemplated, various functional layers may be formed in a pattern form on various substrates by regulating the wettability of the surface of the structure for pattern formation. Functional properties refer to optical properties (such as refraction, light selective absorption, reflection, polarization, light transmission, light selective transmission, nonlinear optical properties, luminescence of phosphor or phosphorescence, and photochromism), magnetic properties (such as hard magnetic properties, soft magnetic properties, nonmagnetic properties, and magnetic permeability), electric and electronic properties (such as electric conductivity, insulating properties, piezoelectric properties, pyroelectric properties, and dielectric properties), chemical properties (such as adsorption, desorption, catalytic activity, water absorption, oil absorption, ion conductivity, oxidation reduction properties, electrochemical properties, and electrochromic properties), mechanical properties (such as abrasion resistance), thermal properties (such as heat transfer, heat insulation, and infrared radiation properties), and biological functions (such as biocompatibility and antithrombogenicity).

Functional elements may be prepared by coating a composition for a functional layer onto a structure for pattern formation. The composition for a functional layer may be a composition that enables only one of unexposed areas and exposed areas in the structure for pattern formation with a pattern formed thereon to be wetted.

For the pattern, the numerical value of the wettability is not limited so far as the surface of the pattern has areas different from each other in wettability, that is, functional layer composition-depositable areas and functional layer composition-undepositable areas. The surface having areas different from each other in wettability may be the surface of the substrate per se or the substrate surface after surface treatment such as dampening water treatment.

Although no particular limitation is imposed, for example, when the surface having areas different from each other in wettability is the surface of the substrate per se, preferably, the unexposed areas of the structure for pattern formation have a critical surface tension of not more than 50 mN/m, preferably not more than 30 mN/m. Preferred materials include silicone resin and silicone resin having a fluorocarbon group. The composition for a functional layer preferably comprises a material having a higher surface tension than the critical surface tension on the unexposed areas of the structure for pattern formation.

In this case, compositions for a functional layer usable herein include liquid compositions of ultraviolet curable monomers or the like not diluted with any solvent and liquid compositions diluted with solvents. In the case of liquid compositions diluted with solvents, preferred solvents are those having high surface tension, such as water and ethylene glycol.

The lower the viscosity of the composition for a functional layer, the shorter the pattern formation time. In the case of liquid compositions diluted with solvents, an increase in viscosity due to evaporation of solvents and a change in surface tension occur at the time of pattern formation. Therefore, the solvents preferably have low volatility.

The composition for a functional layer may be applied by coating means, such as dip coating, roll coating, or blade coating, nozzle ejection means including ink jetting, electroless plating or the like. When the composition for a functional layer contains as a binder a component curable by ultraviolet light, heat, electron beams or the like, curing treatment permits a pattern of various functional layers to be formed through the structure for pattern formation on the substrate.

After the formation of a functional layer on the whole area, the functional layer in its portions on the unexposed areas may be removed by utilizing a difference in adhesion between the interface of exposed areas/functional layer and the interface of unexposed areas/functional layer, for example, by post treatment, such as intimate contact with a pressure-sensitive adhesive tape followed by separation of the functional layer in its contemplated areas, blowing of air, or solvent treatment, thereby performing patterning.

The unexposed areas and the exposed areas are not required to completely repel the functional layer or to permit the functional layer to be completely deposited thereon, and a pattern of areas different from each other in amount of deposition due to different adhesion may be formed.

Further, the functional layer may be formed by vacuum formation such as PVD or CVD. Even when the functional layer is formed on the whole area, utilization of a difference between adhesion of exposed areas to functional layer and the adhesion of unexposed areas to functional layer enables patterning, for example, by post treatment, for example, separation using a pressure-sensitive adhesive tape, blowing of air, or solvent treatment, thereby performing patterning. In the case of film formation using vacuum, the functional layer may be laminated on the whole area of the structure for pattern formation, or alternatively, reactivity with the exposed areas or the unexposed areas may be utilized to selectively form the functional layer on the exposed areas or the unexposed areas.

Compositions for a functional layer include those wherein properties of the functional layer can be developed by mere formation of a functional layer on the structure for pattern formation and those wherein mere formation of a functional layer on the structure for pattern formation does not develop properties of the functional layer and, after the layer formation, post treatment, such as chemical treatment, ultraviolet treatment, or heat treatment, is necessary.

Next, elements which can be prepared using the structure for pattern formation according to the present invention will be described.

Color filters for liquid crystal display devices and the like have a high definition pattern with a plurality of color pixels of red, green, blue and the like formed thereon. Application of the structure for pattern formation according to the present invention can realize the production of high definition color filters. For example, pattern-wise exposure of a photocatalyst-containing layer provided on a transparent glass substrate followed by coating of a colored layer composition for a color filter onto the exposed photocatalyst-containing layer permits the colored layer composition to be coated only onto exposed areas due to a change in wettability of the exposed areas. This can reduce the amount of the composition for a colored layer used. Further, since the layer of the composition for a colored layer is formed only onto the pattern, use of a photosensitive resin composition as the composition for a colored layer can eliminate the need to provide the step of development or the like, and simple photocuring after the coating can provide a high resolution color filter.

The structure for pattern formation according to the present invention may be used in the production of microlenses. For example, light is circularly applied to the photocatalyst-containing layer provided on the transparent substrate to form a wettability-varied circular pattern. When a composition for a lens is then dropped on wettability-varied areas, the droplets are spread only onto the exposed areas, and further dropping of the composition results in varied contact angle of the droplet. Subsequent curing provides lenses having various shapes or focal lengths. Therefore, high definition microlenses can be obtained.

Use of the structure for pattern formation according to the present invention in metal film formation by electroless plating results in the formation of metal films of a desired pattern.

For example, a desired metal pattern may be formed by applying light to the structure for pattern formation according to the present invention to form a pattern of areas having predetermined increased critical surface tension, i.e., high critical surface tension areas, treating the high critical surface tension areas with a pretreatment liquid for chemical plating and immersing the pretreated material in a chemical plating liquid to form a desired metal pattern. According to this method, a metal pattern can be formed without the formation of a resist pattern, making it possible to produce printed boards, electronic circuit elements and the like.

The structure for pattern formation according to the present invention may be used in the formation of a metal or other pattern by film formation techniques using vacuum.

For example, a pattern having higher adhesion is prepared by light irradiation, and a metal component, such as aluminum, is then heated in vacuo to deposit the meal component on the whole area of the structure for pattern formation to form a thin meal film. Since there is a difference in bond strength of thin metal layer between pattern-formed areas and pattern-unformed areas, a patterned thin metal layer may be formed by pressing a pressure sensitive adhesive against the surface of the thin film and removing the thin film, or by removing the thin film with a chemical.

When the removal is carried out using a pressure sensitive adhesive, bringing the adhesive face of a sheet coated with a pressure sensitive adhesive into contact with the surface of the thin film followed by separation of the sheet coated with the pressure sensitive adhesive permits the thin film in its areas other than the pattern-formed areas to be separated due to a difference in adhesion between the pattern-formed areas and the pattern-unformed areas. Thus, a metal pattern can be formed. According to this method, a metal pattern can be formed without the formation of any resist pattern. This makes it possible to prepare printed boards, electronic circuit elements and the like having a higher definition pattern than the printing method.

The process for producing an element according to the present invention will be described with reference to the accompanying drawings.

FIG. 9 is a cross-sectional view illustrating one embodiment of the process for producing an element according to the present invention.

Figure 9A:
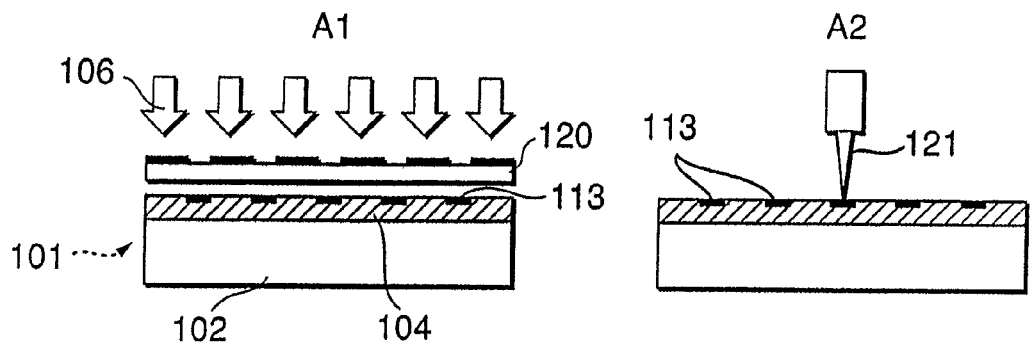
FIG. 9 is a diagram showing one embodiment of the process for producing an element according to the present invention.

In the step of pattern-wise exposure shown in FIG. 9(A), as shown in A1, a structure 101 for pattern formation comprising a substrate 102 having thereon a photocatalyst-containing layer 104 is subjected to exposure 106 through a photomask 120 according to a pattern of an element to be formed. Alternatively, as shown in A2, a pattern is formed directly on the structure 101 for pattern formation by a laser 121 having a wavelength in an ultraviolet region or the like. Thus, areas 113 having specific wettability are formed on the surface of the structure for pattern formation.

Figure 9B:
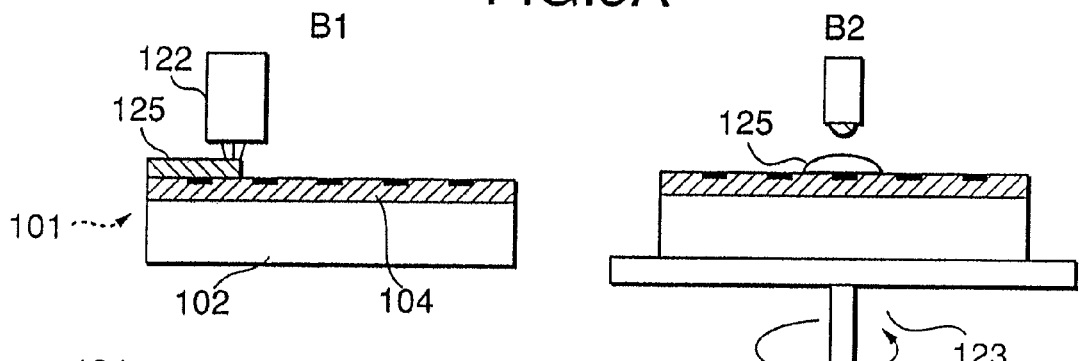

Next, in the step of forming a film on the whole area shown in FIG. 9(B), a functional layer 125 is formed on the whole area of the structure for pattern formation by coating using a blade coater 122 as shown in B1, by coating using a spin coater 123 as shown in B2, or by film formation means 124 utilizing vacuum, such as CVD, as shown in B3.

The exposed areas and the unexposed areas of the functional layer 125 provided on the structure for pattern formation are different from each other in adhesion due to a difference in surface free energy created by exposure of the structure for pattern formation.

Figure 9C:
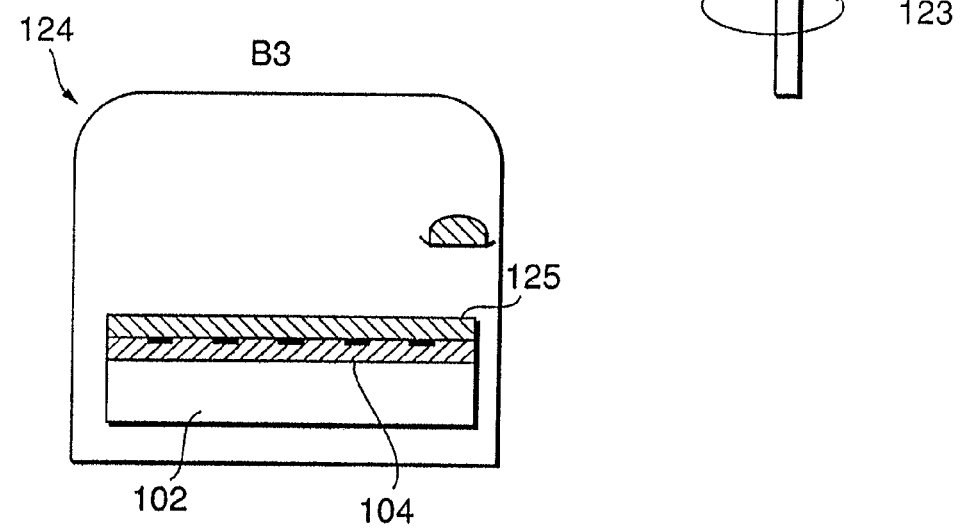
Figure 9C:
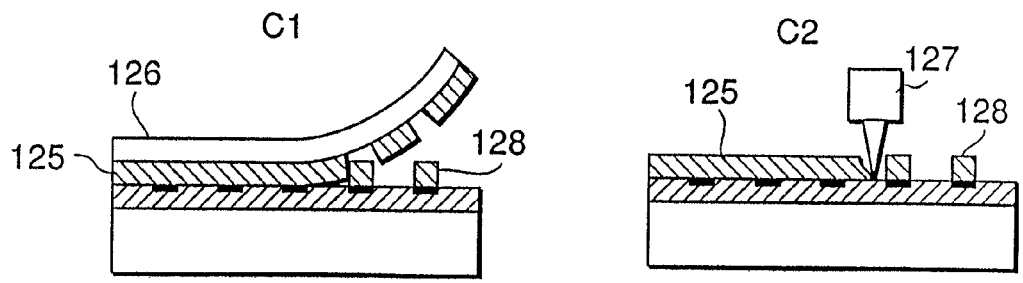

Next, in the step of separation shown in FIG. 9(C), a functional layer 128 is formed by bringing the adhesive face of a pressure sensitive adhesive tape 126 into intimate contact with the functional layer and separating the tape from the end of the functional layer to remove the functional layer in its areas formed on the unexposed areas, by ejecting air through an air ejection nozzle 127, or by removing the functional layer in its areas having low adhesion with the aid of a release agent.

FIG. 10 is a cross-sectional view illustrating another embodiment of the process for producing an element according to the present invention.

Figure 10A:
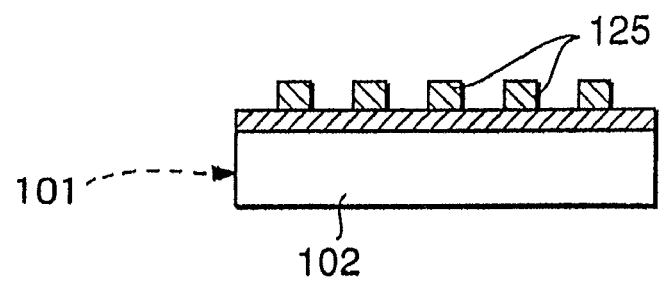
FIG. 10 is a diagram showing another embodiment of the process for producing an element according to the present invention.
Figure 10B:
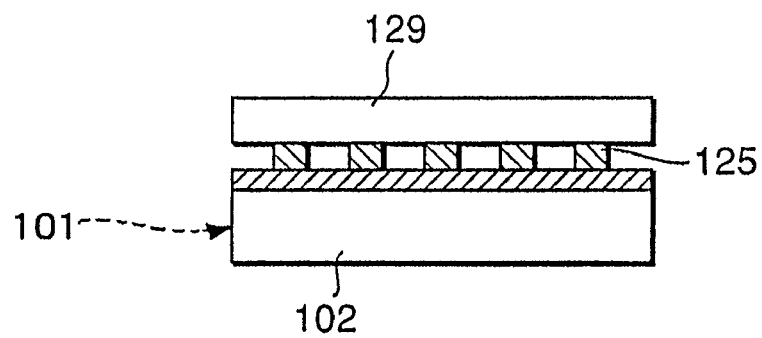

As with the process shown in FIG. 9, in the process shown in FIG. 10, a functional layer 125 is formed on a structure 101 for pattern formation by a method as shown in FIG. 10(A). Subsequently, as shown in FIG. 10(B), a substrate 129 for element formation is brought into intimate contact with the functional layer.

Figure 10C:
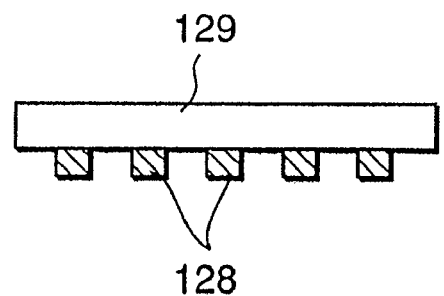

As shown in FIG. 10(C), the functional layer 125 is transferred onto the substrate 129 for element formation to prepare an element having a functional layer 128.

FIG. 11 is a cross-sectional view illustrating still another embodiment of the process for producing an element according to the present invention.

Figure 11A:
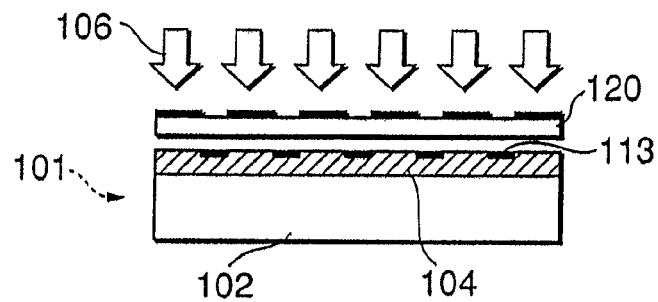
FIG. 11 is a diagram showing still another embodiment of the process for producing an element according to the present invention.

As shown in FIG. 11(A), a structure 101 for pattern formation comprising a substrate 102 having thereon a photocatalyst-containing layer 104 is subjected to exposure 106 according to a pattern of an element to be formed through a photomask 120. Thus, areas 113 having specific wettability are formed.

Figure 11B:
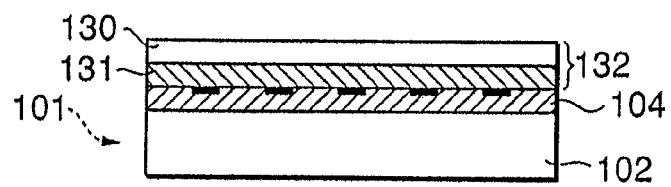

Next, as shown in FIG. 11(B), a thermal transfer material 132 comprising a hot-melt composition layer 131 provided on a sheet 130 is put on the structure for pattern formation so that the surface of the hot-melt composition layer faces the exposed surface of the structure for pattern formation.

Figure 11C:
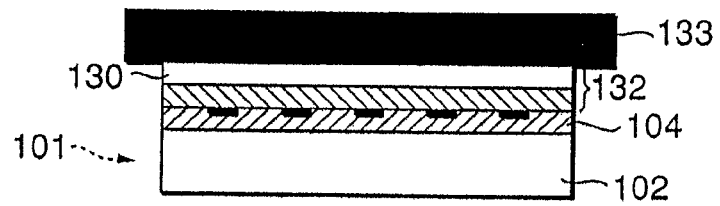

As shown in FIG. 11(C), a hot plate 133 is then pressed against the thermal transfer material 132 on its sheet side.

Figure 11D:
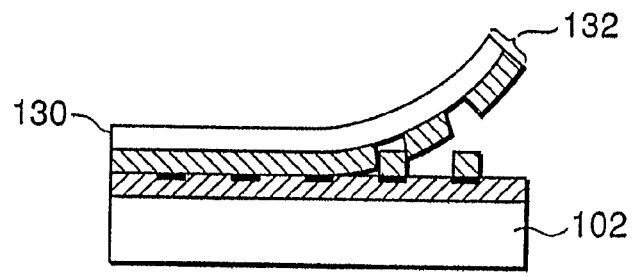
Figure 11E:
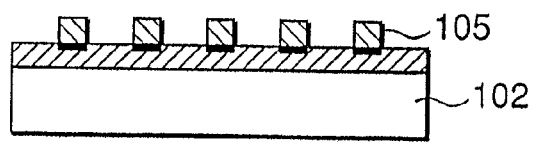

As shown in FIG. 11(D), after cooling, the thermal transfer material 132 is removed to finally form a pattern 105 as shown in FIG. 11(E).

FIG. 12 is a cross-sectional view illustrating a further embodiment of the process for producing an element according to the present invention.

Figure 12A:
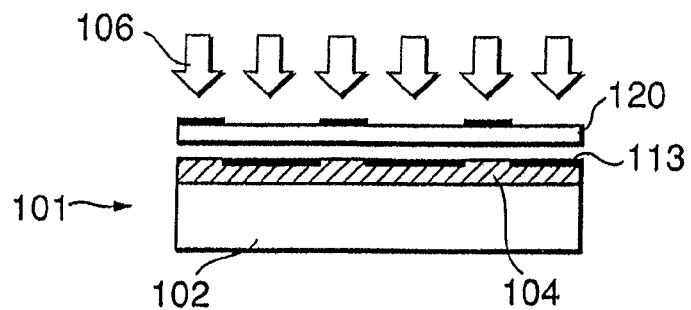
FIG. 12 is a diagram showing a further embodiment of the process for producing an element according to the present invention.

As shown in FIG. 12(A), a structure 101 for pattern formation is exposed through a photomask 102 to form unexposed areas and areas 113 having specific wettability.

Figure 12B:
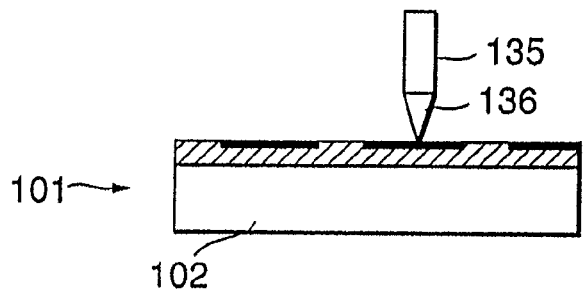

As shown in FIG. 12(B), an ultraviolet curable resin composition 136 is ejected through an ejection nozzle 135 toward the wettability-varied areas 113.

Figure 12C:
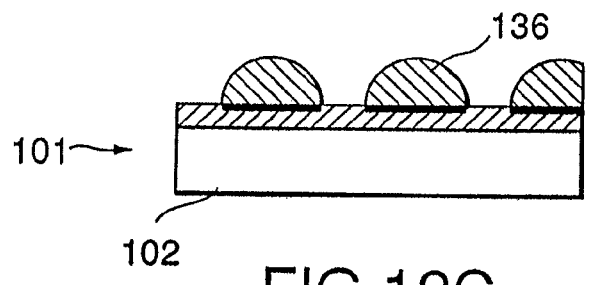

As shown in FIG. 12(C), the ultraviolet curable resin composition ejected onto the exposed areas is risen due to a difference in surface tension created by a difference in wettability between the unexposed areas and the exposed areas.

Figure 12D:
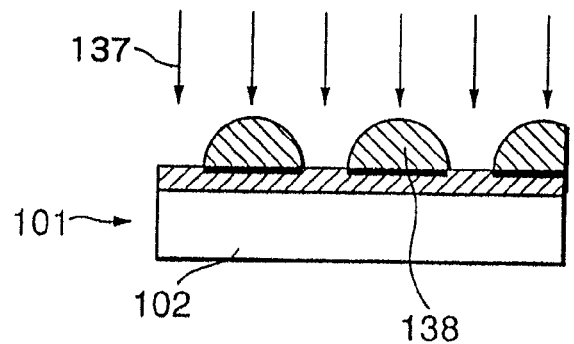

Next, as shown in FIG. 12(D), ultraviolet light 137 for curing can be applied to form microlenses 138.

Re: Second Invention B

The best mode for carrying out the invention will be described with reference to the accompanying drawings.

Color Filter of Present Invention

Figure 13:
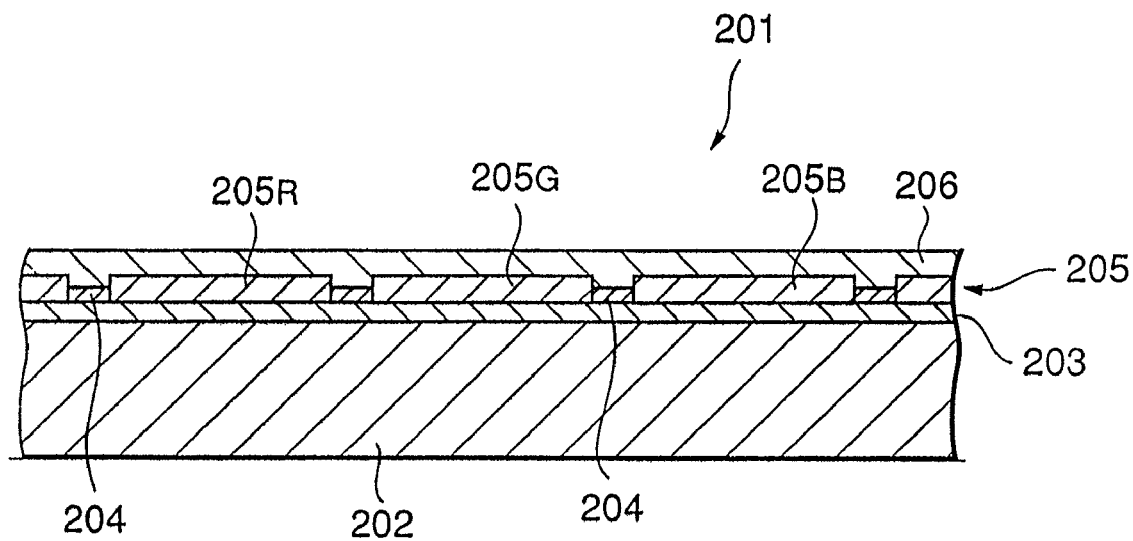
FIG. 13 is a schematic cross-sectional view showing one embodiment of the color filter according to the present invention.

FIG. 13 is a schematic longitudinal sectional view showing one embodiment of the color filter according to the present invention. In FIG. 13, a color filter 201 according to the present invention comprises a transparent substrate 202, a photocatalyst-containing layer 203 as a wettability-variable component layer provided on the transparent substrate 202, a black matrix (a light shielding layer) 204 and a colored layer 205 of a plurality of colors provided on the photocatalyst-containing layer 203 in its areas having specific wettability (high critical surface tension areas), and a protective layer 206 provided so as to cover the black matrix 204 and the colored layer 205. In this color filter 201, the black matrix 204 is located at each boundary region between two adjacent colored layers 205.

Figure 14:
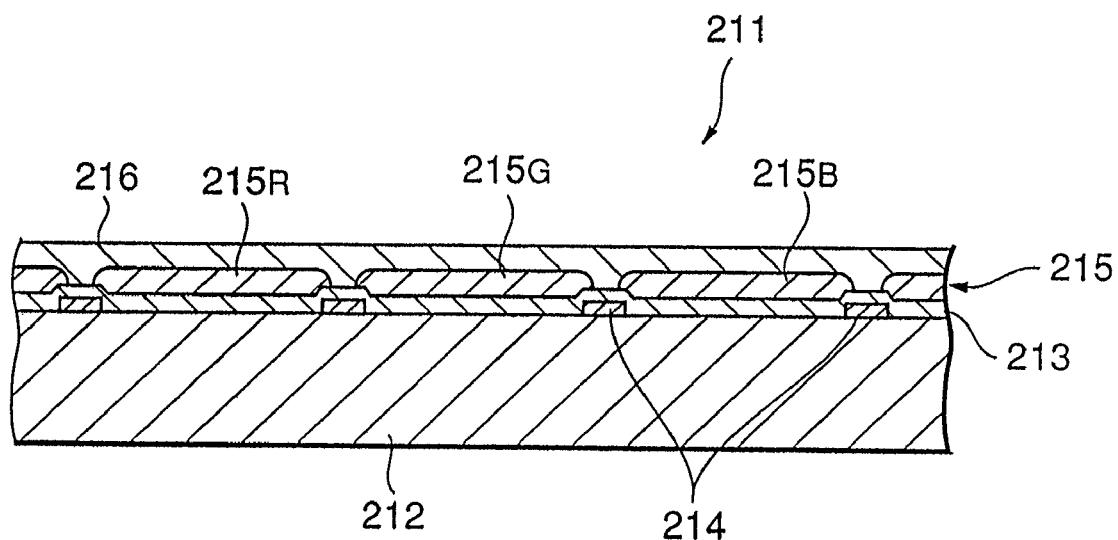
FIG. 14 is a schematic cross-sectional view showing another embodiment of the color filter according to the present invention.

FIG. 14 is a schematic longitudinal sectional view showing another embodiment of the color filter according to the present invention. In FIG. 14, a color filter 211 according to the present invention comprises a transparent substrate 212, a black matrix (a light shielding layer) 214 provided on the transparent substrate 212, a photocatalyst-containing layer 213 as a wettability-variable component layer provided on the transparent substrate 212 so as to cover the black matrix 214, a colored layer 215 of a plurality of colors provided on the photocatalyst-containing layer 213 in its areas having specific wettability (high critical surface tension areas), and a protective layer 216 provided so as to cover the colored layer 215. In this color filter 211, the black matrix 214 is located at each boundary region between two adjacent colored layers 215.

Figure 15:
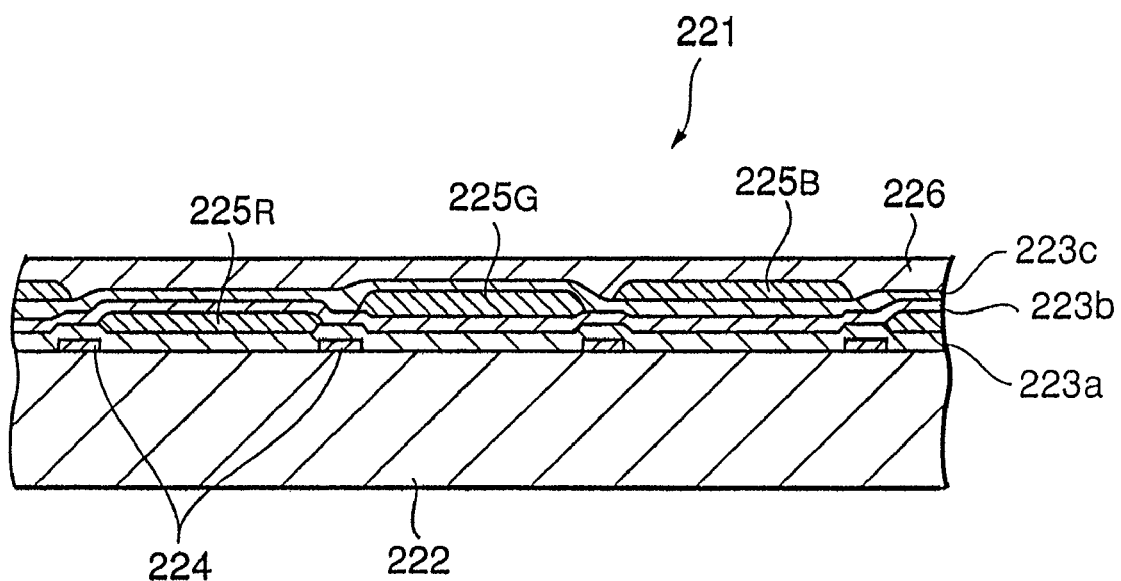
FIG. 15 is a schematic cross-sectional view showing still another embodiment of the color filter according to the present invention.

FIG. 15 is a schematic longitudinal sectional view showing still another embodiment of the color filter according to the present invention. In FIG. 15, a color filter 221 according to the present invention comprises: a transparent substrate 222; a black matrix (a light shielding layer) 224 provided on the transparent substrate 222; provided on the transparent substrate 222 so as to cover the black matrix 224 in the following order, a laminate comprising a photocatalyst-containing layer 223a as a first wettability-variable component layer and a red colored layer 225R provided on the photocatalyst-containing layer 223a in its areas having specific wettability (high critical surface tension areas), a laminate comprising a photocatalyst-containing layer 223b as a second wettability variable component layer and a green colored layer 225G provided on the photocatalyst-containing layer 223b in its areas having specific wettability (high critical surface tension areas), and a laminate comprising a photocatalyst-containing layer 223c as a third wettability-variable component layer and a blue colored layer 225B provided on the photocatalyst-containing layer 223c in its areas having specific wettability (high critical surface tension areas); and a protective layer 226 provided so as to cover the colored layer 225. In this color filter 221, the black matrix 224 is located at each boundary region between two adjacent colored layers 225.

Figure 16:
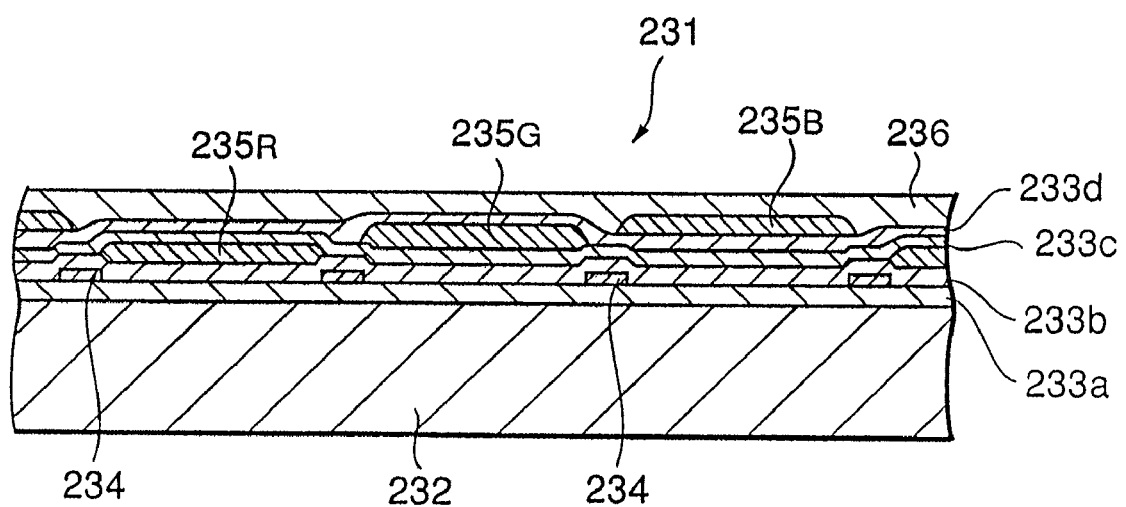
FIG. 16 is a schematic cross-sectional view showing a filter embodiment of the color filter according to the present invention.

FIG. 16 is a schematic longitudinal sectional view showing a further embodiment of the color filter according to the present invention. In FIG. 16, a color filter 231 according to the present invention comprises: a transparent substrate 232; a photocatalyst-containing layer 233a as a first wettability-variable component layer provided on the transparent substrate 232; a black matrix (a light shielding layer) 234 provided on the photocatalyst-containing layer 233a in its areas having specific wettability (high critical surface tension areas); provided on the first photocatalyst-containing layer 233a so as to cover the black matrix 234 in the following order, a laminate comprising a photocatalyst-containing layer 233b as a second wettability-variable component layer and a red colored layer 235R provided on the photocatalyst-containing layer 233b in its areas having specific wettability high critical surface tension areas), a laminate comprising a photocatalyst-containing layer 233c as a third wettability-variable component layer and a green colored layer 235G provided on the photocatalyst-containing layer 233c in its areas having specific wettability (high critical surface tension areas), and a laminate comprising a photocatalyst-containing layer 233d as a fourth wettability-variable component layer and a blue colored layer 235B provided on the photocatalyst-containing layer 233d in its areas having specific wettability (high critical surface tension areas); and a protective layer 236 provided so as to cover the colored layer 235. In this color filter 231, the black matrix 234 is located at each boundary region between two adjacent colored layers 235.

Next, the construction of color filters according to the present invention will be described.

(Transparent Substrate)

Materials for transparent substrates 202, 212, 222, and 232 constituting the color filters 201, 211, 221, and 231 include transparent rigid materials, such as quartz glass, Pyrex glass, and synthetic quartz sheets, and flexible transparent flexible materials, such as transparent resin films and optical resin sheets. Among them, particularly glass 7059 manufactured by Corning has small coefficient of thermal expansion and hence has excellent dimensional stability and workability in heat treatment at a high temperature. Further, this glass is an alkali-free glass not containing an alkali component and hence is suitable in color filters for active matrix type color liquid crystal display derives.

(Wettability-Variable Component Layer)

The photocatalyst-containing layer 203, 213, 223, or 233 as the wettability-variable component layer constituting the color filter 201, 211, 221, or 231 comprises at least a binder and a photocatalyst and, upon exposure to light, permits the critical surface tension to be increased through photocatalytic action to form a high critical surface tension layer.

The mechanism of the following action of the photocatalyst typified by titanium oxide, in the photocatalyst-containing layer according to the present invention has not been fully elucidated yet. However, it is considered that carriers produced by light irradiation changes the chemical structure of the organic material through a direct reaction with a neighboring compound, or otherwise active oxygen species produced in the presence of oxygen and water.

Proposals utilizing the photocatalytic action include one wherein oil stains are decomposed by light irradiation to hydrophilify the oil stains, enabling the oil stains to be washed away by water, one wherein a high critical surface tension layer is formed on the surface of glass or the like to impart antifogging properties, and one wherein a photocatalyst-containing layer is formed on the surface of tiles or the like to form the so-called antimicrobial tiles or the like that can reduce the number of bacteria floating in air.

According to the present invention, when a photocatalyst-containing layer is used as the wettability-variable component layer, the photocatalyst varies the wettability of light exposed areas through the action of organic groups as a part of the binder or the oxidation, decomposition or the like of additives to bring the exposed areas to a high critical surface tension state, creating a large difference in wettability between exposed areas and unexposed areas and enhancing the receptivity and repellency to the composition for a light shielding layer and the composition for a colored layer. This can realize the color filter.

The surface having high critical surface tension is not limited by the numerical value of the wettability. However, for example, the wettability in terms of contact angle with water is preferably not more than 40°, more preferably not more than 10°. In the present invention, the contact angle may be measured by dropping a water droplet on the surface through a microsyringe and, 30 sec after that, measuring the contact angle using a contact angle goniometer (Model CA-Z, manufactured by Kyowa Interface Science Co., Ltd.).

Photocatalysts usable in the present invention include metal oxides known as photosemiconductors, such as titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$). Among them, titanium oxide is particularly preferred because it has high band gap energy and is chemically stable, nontoxic, and easily available.

Titanium oxide may be in anatase form or rutile form with anatase form of titanium oxide being preferred. The excitation wavelength of the anatase form of titanium oxide is not more than 380 nm. Examples of the anatase form of titanium oxide include hydrochloric acid peptization type titania (anatase form) sols (STS-02, average particle diameter 7 nm, manufactured by Ishihara Sangyo Kaisha Ltd.; and ST-K01, manufactured by Ishihara Sangyo Kaisha Ltd.) and nitric acid peptization type titania (anatase form) sols (TA-15, average particle diameter 12 nm, manufactured by Nissan Chemical Industries Ltd.).

A photocatalyst having a smaller particle diameter can more effectively causes the photocatalytic reaction and hence is preferred. Use of a photocatalyst having an average particle diameter of preferably not more than 50 nm, more preferably not more than 20 nm, is preferred. Further, the photocatalyst having a smaller particle diameter can advantageously provide a photocatalyst-containing layer having smaller surface roughness. A surface roughness of the photocatalyst-containing layer exceeding 10 nm is unfavorable because the lowering in the water repellency and the oil repellency of the photocatalyst-containing layer in its unexposed areas is unsatisfactory.

According to the present invention, the binder used in the photocatalyst-containing layer preferably has a binding energy high enough to avoid the decomposition of the main skeleton upon photoexcitation of the photocatalyst, and example thereof include (1) organopolysiloxanes that hydrolyze and polycondensate a chloro- or alkoxysilane or the like by a sol-gel reaction or the like to develop large strength and (2) organopolysiloxanes obtained by crosslinking reactive silicones having excellent water repellency or oil repellency.

In the case of (1), the organopolysiloxane is composed mainly of a hydrolysis condensate or a cohydrolysis condensate of at least one member selected from silicon compounds represented by general formula $Y_nSiX_{4-n}$ wherein n is 1 to 3; Y represents an alkyl, fluoroalkyl, vinyl, amino, or epoxy group; and X represents a halogen or a methoxy, ethoxy, or acetyl group.

Specific examples thereof include methyltrichlorosilane, methyltribromosilane, methyltrimethoxysilane, methyltriethoxysilane, methyltriisopropoxysilane, methyl-tri-t-butoxysilane; ethyltrichlorosilane, ethyltribromosilane, ethyltrimethoxysilane, ethyltriethoxysilane, ethyltriisopropoxysilane, ethyl-tri-t-butoxysilane; n-propyltrichlorosilane, n-propyltribromosilane, n-propyltrimethoxysilane, n-propyltriethoxysilane, n-propyltriisopropoxysilane, n-propyl-tri-t-butoxysilane; n-hexyltrichlorosilane, n-hexyltribromosilane, n-hexyltrimethoxysilane, n-hexyltriethoxysilane, n-hexyltriisopropoxysilane, n-hexyl-tri-t-butoxysilane; n-decyltrichlorosilane, n-decyltribromosilane, n-decyltrimethoxysilane, n-decyltriethoxysilane, n-decyltriisopropoxysilane, n-decyl-tri-t-butoxysilane; n-octadecyltrichlorosilane, n-octadecyltribromosilane, n-octadecyltrimethoxysilane, n-octadecyltriethoxysilane, n-octadecyltriisopropoxysilane, n-octadecyl-tri-t-butoxysilane; phenyltrichlorosilane, phenyltribromosilane, phenyltrimethoxysilane, phenyltriethoxysilane, phenyltriisopropoxysilane, phenyl-tri-t-butoxysilane; tetrachlorosilane, tetrabromosilane, tetramethoxysilane, tetraethoxysilane, tetrabutoxysilane, dimethoxydiethoxysilane; dimethyldichlorosilane, dimethyldibromosilane, di-methyldimethoxysilane, dimethyldiethoxysilane; diphenyldichlorosilane, diphenyldibromosilane, diphenyldimethoxysilane, diphenyldiethoxysilane; phenylmethyldichlorosilane, phenylmethyldibromosilane, phenylmethyldimethoxysilane, phenylmethyldiethoxysilane; trichlorohydrosilane, tribromohydrosilane, trimethoxyhydrosilane, triethoxyhydrosilane, triisopropoxyhydrosilane, tri-t-butoxyhydrosilane; vinyltrichlorosilane, vinyltribromosilane, vinyltrimethoxysilane, vinyltriethoxysilane, vinyltriisopropoxysilane, vinyl-tri-t-butoxysilane; trifluoropropyltrichlorosilane, trifluoropropyltribromosilane, trifluoropropyltrimethoxysilane, trifluoropropyltriethoxysilane, trifluoropropyltriisopropoxysilane, trifluoropropyl-tri-t-butoxysilane; γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyl-tri-t-butoxysilane; γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyl-tri-t-butoxysilane; γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyl-tri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyl-tri-t-butoxysilane; β-(3,4-epoxycyclohexylethyltrimethoxysilane, β-(3,4-epoxycyclohexyl)ethyltriethoxysilane; and partial hydrolyzates thereof; aid mixtures thereof.

Further, polysiloxanes containing fluoroalkyl groups are particularly preferred as the binder. Specific examples thereof include a hydrolysis condensate or a cohydrolysis condensate of at least one member selected from the following fluoroalkylsilanes. In general, polysiloxanes known as fluorine silane coupling agents may be used.

$CF_3(CF_2)_3CH_2CH_2Si(OCH_3)_3$,
$CF_3(CF_2)_5CH_2CH_2Si(OCH_3)_3$,
$CF_3(CF_2)_7CH_2CH_2Si(OCH_3)_3$,

CF$_3$(CF$_2$)$_9$CH$_2$CH$_2$Si(OCH$_3$)$_3$,
(CF$_3$)$_2$CF(CF$_2$)$_4$CH$_2$CH$_2$Si(OCH$_3$)$_3$,
(CF$_3$)$_2$CF(CF$_2$)$_6$CH$_2$CH$_2$Si(OCH$_3$)$_3$,
(CF$_3$)$_2$CF(CF$_2$)$_8$CH$_2$CH$_2$Si(OCH$_3$)$_3$,
CF$_3$(C$_6$H$_4$)C$_2$H$_4$Si(OCH$_3$)$_3$,
CF$_3$(CF$_2$)$_3$(C$_6$H$_4$)C$_2$H$_4$Si(OCH$_3$)$_3$,
CF$_3$(CF$_2$)$_5$(C$_6$H$_4$)C$_2$H$_4$Si(OCH$_3$)$_3$,
CF$_3$(CF$_2$)$_7$(C$_6$H$_4$)C$_2$H$_4$Si(OCH$_3$)$_3$,
CF$_3$(CF$_2$)$_3$CH$_2$CH$_2$SiCH$_3$(OCH$_3$)$_2$,
CF$_3$(CF$_2$)$_5$CH$_2$CH$_2$SiCH$_3$(OCH$_3$)$_2$,
CF$_3$(CF$_2$)$_7$CH$_2$CH$_2$SiCH$_3$(OCH$_3$)$_2$,
CF$_3$(CF$_2$)$_9$CH$_2$CH$_2$SiCH$_3$(OCH$_3$)$_2$,
(CF$_3$)$_2$CF(CF$_2$)$_4$CH$_2$CH$_2$SiCH$_3$(OCH$_3$)$_2$,
(CF$_3$)$_2$CF(CF$_2$)$_6$CH$_2$CH$_2$SiCH$_3$(OCH$_3$)$_2$,
(CF$_3$)$_2$CF(CF$_2$)$_8$CH$_2$CH$_2$SiCH$_3$(OCH$_3$)$_2$,
CF$_3$(C$_6$H$_4$)C$_2$H$_4$SiCH$_3$(OCH$_3$)$_2$,
CF$_3$(CF$_2$)$_3$(C$_6$H$_4$)C$_2$H$_4$SiCH$_3$(OCH$_3$)$_2$,
CF$_3$(CF$_2$)$_5$(C$_6$H$_4$)C$_2$H$_4$SiCH$_3$(OCH$_3$)$_2$,
CF$_3$(CF$_2$)$_7$(C$_6$H$_4$)C$_2$H$_4$SiCH$_3$(OCH$_3$)$_2$,
CF$_3$(CF$_2$)$_3$CH$_2$CH$_2$Si(OCH$_2$CH$_3$)$_3$,
CF$_3$(CF$_2$)$_5$CH$_2$CH$_2$Si(OCH$_2$CH$_3$)$_3$,
CF$_3$(CF$_2$)$_7$CH$_2$CH$_2$Si(OCH$_2$CH$_3$)$_3$,
CF$_3$(CF$_2$)$_9$CH$_2$CH$_2$Si(OCH$_2$CH$_3$)$_3$, and
CF$_3$(CF$_2$)$_7$SO$_2$N(C$_2$H$_5$)C$_2$H$_4$CH$_2$Si(OCH$_3$)$_3$.

Use of the polysiloxanes containing fluoroalkyl groups as the binder results in markedly improved water repellency and oil repellency of the photocatalyst-containing layer in its unexposed areas and can develop the function of inhibiting the deposition of the black matrix composition and the composition for a colored layer.

Examples of reactive silicones (2) include compounds having a skeleton represented by the following general formula B-1.

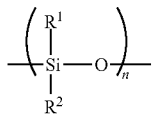

Formula B-1 wherein n is an integer of two or more; and R$^1$ and R$^2$ represent a substituted or unsubstituted alkyl, alkenyl, aryl, or cyanoalkyl group having 1 to 10 carbon atoms. Not more than 40% by mole of the whole is accounted for by vinyl, phenyl, or phenyl halide. R$^1$ and R$^2$ preferably represent a methyl group because the surface free energy of the silicone is the smallest. The molar proportion of the methyl group is preferably not less than 60%. Further, the chain end or the side chain has in its molecular chain at least one reactive group, such as a hydroxyl group.

A stable organosilicon compound not causing any crosslinking reaction, such as dimethylpolysiloxane, together with the organopolysiloxane, may be incorporated into the binder.

According to the present invention, the photocatalyst-containing layer may comprise a surfactant in addition to the photocatalyst and the binder. Specific examples of surfactants usable herein include hydrocarbon nonionic surfactants, such as NIKKOL BL, BC, BO, and BB series manufactured by Nikko Chemicals Co., Ltd.; and fluoro or silicone nonionic surfactants, such as ZONYL FSN and FSO, manufactured by E.I. du Pont de Nemours & Co., SurfluonS-141 and 145 manufactured by Asahi Glass Co., Ltd., Megafac F-141 and 144 manufactured by Dainippon Ink and Chemicals, Inc., Ftergent F-200 and E-251, manufactured by Neos Co., Ltd.; Unidyne DS-401 and 402 manufactured by Daikin Industries, Ltd., and Fluorad FC-170 and 176 manufactured by Sumitomo-3M Ltd. Cationic, anionic, and amphoteric surfactants may also be used.

Further, besides the surfactant, the following compound may be incorporated into the photocatalyst-containing layer: oligomers and polymers, such as polyvinyl alcohol, unsaturated polyesters, acrylic resins, polyethylene, diallyl phthalate, ethylene propylene diene monomer, epoxy resin, phenolic resin, polyurethane, melamine resin, polycarbonate, polyvinyl chloride, polyamide, polyimide, styrene butadiene rubber, chloroprene rubber, polypropylene, polybutylene, polystyrene, polyvinyl acetate, polyester, polybutadiene, polybenzimidazole, polyacrylonitrile, epichlorohydrin, polysulfide, and polyisoprene.

The photocatalyst-containing layer 203, 213, 223, or 233 constituting the color filter 201, 211, 221, or 231 may be formed by dispersing a photocatalyst, a binder and optionally other additives in a solvent to prepare a coating liquid and coating the coating liquid. Preferred solvents usable herein include alcoholic organic solvents, such as ethanol and isopropanol. The coating liquid may be coated by a conventional coating method such as spin coating, spray coating, dip coating, roll coating, or bead coating. When the coating liquid contains an ultraviolet curable component as the binder, the photocatalyst-containing layer may be formed by curing through ultraviolet irradiation.

The content of the photocatalyst in the photocatalyst-containing layer may be generally 5 to 60% by weight, preferably 20 to 40% by weight. The thickness of the photocatalyst-containing layer is preferably not more than 10 µm.

According to the present invention, besides the photocatalyst-containing layer, an organic polymeric resin layer may be used as the wettability-variable component layer for color filter 201, 211, 221, or 231. Organic polymers, such as polycarbonate, polyethylene, polyethylene terephthalate, polyamide, and polystyrene, when exposed to ultraviolet light, particularly exposed to ultraviolet light containing a large amount of a component of low wavelengths of not more than 250 nm, cause cleavage of polymer chains to reduce the molecular weight. This creates surface roughening to change the wettability and hence brings the exposed areas to a high critical surface tension state. This phenomenon can be utilized to create a large difference in wettability between exposed areas and unexposed areas, thereby enhancing the receptivity and repellency to the composition for a light shielding layer and the composition for a colored layer to obtain a color filter. As described above, the high critical surface tension refers to a state of preferably not more than 40°, more preferably not more than 10°, in terms of contact angle with water.

(Black Matrix)

The black matrixes 204 and 234 constituting the color filters 201 and 231 are formed respectively on the photocatalyst-containing layer 203 in its high critical surface tension areas and the first photocatalyst-containing layer 233a in its high critical surface tension areas and are located at each boundary region between display pixels of colored layers 205 and 235 and outside the colored layer formation regions. The black matrix 204 or 234 comprises a resin binder containing fine particles of carbon, a metal oxide, an inorganic pigment, an organic pigment or the like. The thickness of the black matrix may be in the range of 0.5 to 10 µm. The resin binder may comprise one aqueous resin or a mixture of two or more aqueous resins selected from polyacrylamide, polyvinyl alcohol, gelatin, casein, cellulose and the like. Further, an o/w emulsion type resin composition, for example, an emulsion of a reactive silicone, may also be used as the resin binder.

The black matrix 214 or 224 constituting the color filter 211 or 221 is provided at each boundary region between display pixels of the color layer 215 or 225 and outside the colored layer formation regions. The black matrix 214 or 224 may be formed by forming an about 1000 to 2000 Å-thick thin metal film of chromium or the like by sputtering, vacuum deposition or the like and patterning the thin film, by forming a resin layer of a polyimide resin, an acrylic resin, an epoxy resin or the like containing light shielding particles, such as fine particles of carbon, and patterning the resin layer, by forming a photosensitive resin layer containing light shielding particles, such as fine particles of carbon or a metal oxide, and patterning the photosensitive resin layer, or by other method.

(Colored Layer)

The colored layer 205, 215, 225 or 235 is provided on the photocatalyst-containing layer in its high critical surface tension areas, and a red pattern, a green pattern, and a blue pattern are arranged in a desired pattern form. The colored layer comprises a layer of a colorant, such as an inorganic pigment, an organic pigment, or a dye, or comprises a layer of a binder containing the colorant. The resin binder may be one aqueous resin or a mixture of two or more aqueous resins selected from polyacrylamide, polyvinyl alcohol, gelatin, casein, cellulose and the like. An o/w emulsion type resin composition, for example, an emulsion of a reactive silicone, may also be used as the resin binder.

The red pattern, the green pattern, and the blue pattern constituting the colored layer may be arranged in any conventional form of stripe, mosaic, triangle, four pixel disposition and the like.

(Protective Layer)

The protective layer 206, 216, 226 or 236 functions to flatten the surface of the color filter and to prevent the elution of the colored layer or the components contained in the colored layer and the photocatalyst-containing layer into a liquid crystal layer. The thickness of the protective layer may be determined by taking into consideration the light transmission of the material used, the surface state of the color filter and the like, for example, may be in the range of 0.1 to 2.0 µm. The protective layer may be formed using a material selected from, for example, conventional transparent photosensitive resins, two-component curable transparent resins and the like that have light transmittance and the like required of the transparent protective layer.

Process for Producing Color Filter According to Present Invention

First Embodiment

Next, an embodiment of the process for producing a color filter according to the present invention will be described by taking a color filter 201 shown in FIG. 13 as an example with reference to FIG. 17.

(First Step)

Figure 17A:
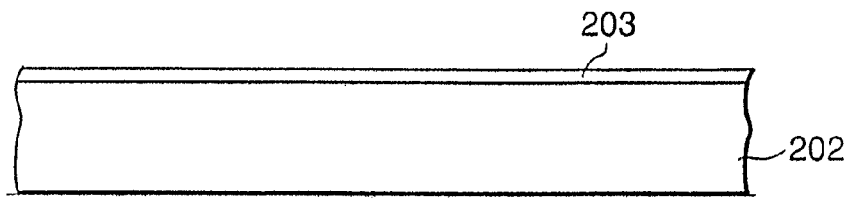
FIG. 17 is a flow diagram illustrating one embodiment of the process for producing a color filter according to the present invention.
Figure 17B:
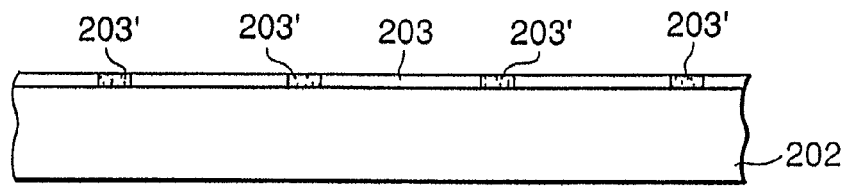

In the first step, a photocatalyst-containing layer 203 as a wettability-variable component layer is formed on a transparent substrate 202 (FIG. 17(A)). The photocatalyst-containing layer 203 may be formed by dispersing the photocatalyst, the binder, and optionally other additives in a solvent to prepare a coating liquid, coating the coating liquid, and allowing hydrolysis and polycondensation to proceed to strongly fix the photocatalyst in the binder. Preferred solvents usable herein include alcoholic organic solvents, such as ethanol and isopropanol. The coating liquid may be coated by a conventional coating method, such as spin coating, spray coating, dip coating, roll coating, or bead coating.

Next, the photocatalyst-containing layer 203 in its black matrix forming areas are exposed to light to bring light exposed areas 203' to a high critical surface tension state through photocatalytic action. Thus, areas having specific wettability are formed (FIG. 17(B)). This exposure to light may be pattern-wise exposure by means of a mercury lamp, a metal halide lamp, a xenon lamp or the like through a photomask for a black matrix. Alternatively, a laser, such as an excimer laser or a YAG laser, may be applied to directly form a pattern of the black matrix. The wavelength of the light used in this light irradiation may be generally not more than 400 nm, preferably not more than 380 nm. The exposure in the light irradiation may be one that is necessary for the light exposed areas 203' to develop high critical surface tension (for example, a water contact angle of not more than 10°).

Figure 17C:
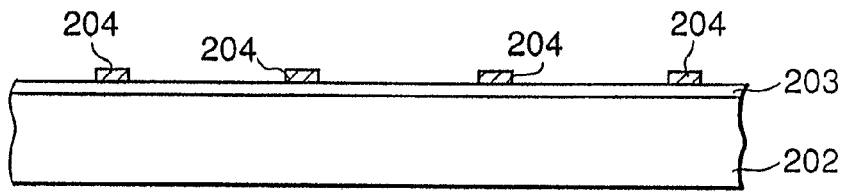

A coating composition for the black matrix is then deposited on the light exposed areas 203' and cured to form a black matrix 204 (FIG. 17(C)). The black matrix composition may be deposited on the exposed areas 203' by coating the coating composition onto the photocatalyst-containing layer 203 according to a conventional coating method, such as spray coating, dip coating, roll coating, or bead coating. In this case, the coating composition is repelled by the unexposed areas having low critical surface tension and removed, so that the coating composition is selectively deposited only onto the exposed areas having high critical surface tension (areas having specific wettability) 203'. Alternatively, the black matrix composition may be deposited onto the exposed areas 203' by a nozzle ejection method, such as ink jetting. In this case, the black matrix composition fed into the exposed areas 203' through the nozzle ejection is homogeneously diffused and deposited in the exposed areas 203' showing high critical surface tension, whereas the black matrix composition are not diffused in the unexposed areas having low critical surface tension. In this case, even though the coating composition fed by the nozzle ejection overflows from the exposed areas 203', the overflowed composition is repelled by the unexposed areas having low critical surface tension and finally deposited within the exposed areas 203'.

Further, the formation of the black matrix 204 may be carried out by film formation utilizing vacuum. Specifically, the black matrix 204 may be formed by a method which comprises forming a thin metal film on the exposed photocatalyst-containing layer 203 by vapor deposition or the like and patterning the thin metal film utilizing a difference in adhesion between the unexposed areas and the exposed areas 203', that is, by separation using a pressure-sensitive adhesive tape, by solvent treatment or by other method.

(Second Step)

Figure 17D:
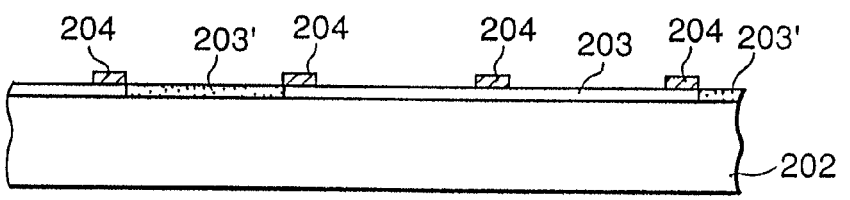
Figure 17E:
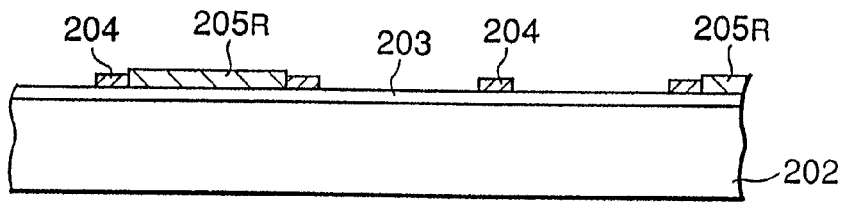
Figure 17F:
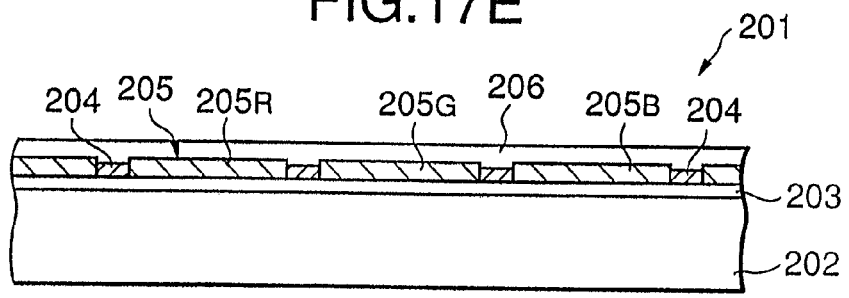

Next, red pattern 205R forming areas on the photocatalyst-containing layer 203 are exposed to light to bring exposed areas 203' to a high critical surface tension state through photocatalytic action to form areas having specific wettability (FIG. 17(D)). As with the light irradiation in the step of forming the black matrix (first step), this light irradiation may be any of pattern-wise exposure and light beam exposure. A coating composition for a red pattern is fed to the photocatalyst-containing layer 203. As with the feed of the coating composition in the step of forming the black matrix (first step), the coating composition for a red pattern may be fed by a coating method, a nozzle ejection method, such as ink jetting, a film formation method utilizing vacuum or the like. The coating composition fed to the photocatalyst-containing layer is repelled by the black matrix 204 and the unexposed areas having low critical surface tension and removed, so that the coating composition is selectively deposited only onto the exposed areas 203' having high critical surface tension. The coating composition for a red pattern deposited onto the exposed areas 203' is cured to form a red pattern 205R (FIG. 17(E)). When the red pattern 205R is formed by the film formation method utilizing vacuum, a thin film of the coating composition for a red pattern is formed on the exposed photocatalyst-containing layer 203 by vapor deposition or the like, followed by patterning of the thin film utilizing a difference in adhesion between the unexposed areas and the exposed areas 203', that is, by separation using a pressure-sensitive adhesive tape, by solvent treatment or by other method, to form a red pattern 205R.

The same procedure as used in the formation of a red pattern is repeated to form a green pattern 205G and a blue pattern 205B. Thus, a colored layer 205 comprising a red pattern, a green pattern, and a blue pattern is formed. A protective layer 206 is formed on the colored layer 205 to obtain a color filter 201 shown in FIG. 13 (FIG. 17 (F)).

When the nozzle ejection method is used in the second step and each color pattern (pixel) is surrounded by the black matrix 204, it is possible to form a colored layer by a method which comprises applying light to the whole areas of the photocatalyst-containing layer 203 with the black matrix 204 formed thereon in the first step to bring the whole area of the photocatalyst-containing layer to a high critical surface tension through photocatalytic action and feeding and homogeneously diffusing and depositing a coating composition for a color pattern onto the pattern forming areas for each color through a nozzle, followed by curing to form a colored layer.

When an organic polymeric resin layer is used as the wettability-variable component layer, light irradiation is carried out using ultraviolet light containing a large amount of a component of low wavelengths of not more than 250 nm.

Second Embodiment

Next, the second embodiment of the process for producing a color filter according to the present invention will be described by taking a color filter 211 shown in FIG. 14 as an example with reference to FIG. 18.
(First Step)

Figure 18A:
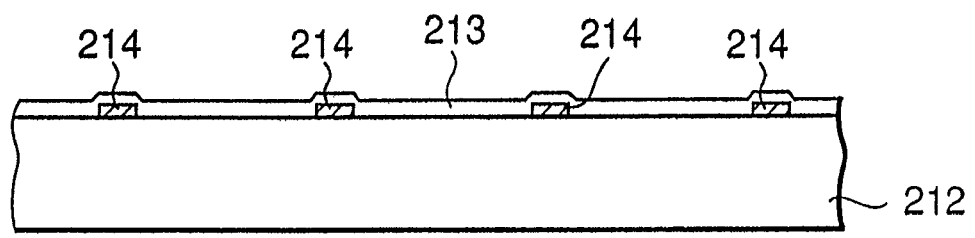
FIG. 18 is a flow diagram illustrating another embodiment of the process for producing a color filter according to the present invention.
Figure 18B:
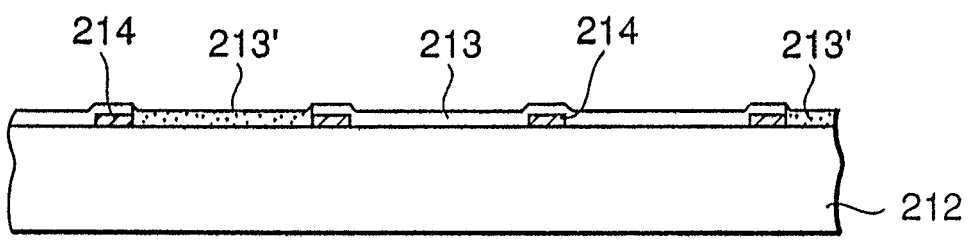
Figure 18C:
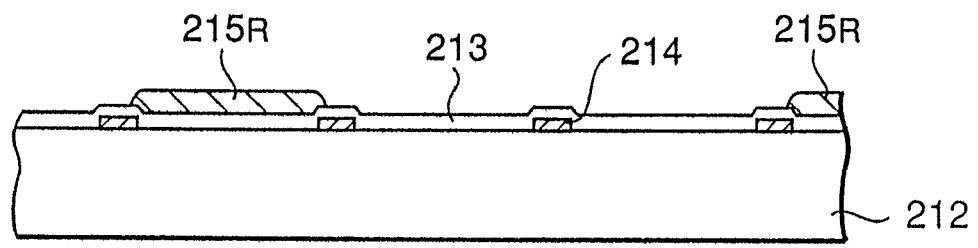
Figure 18D:
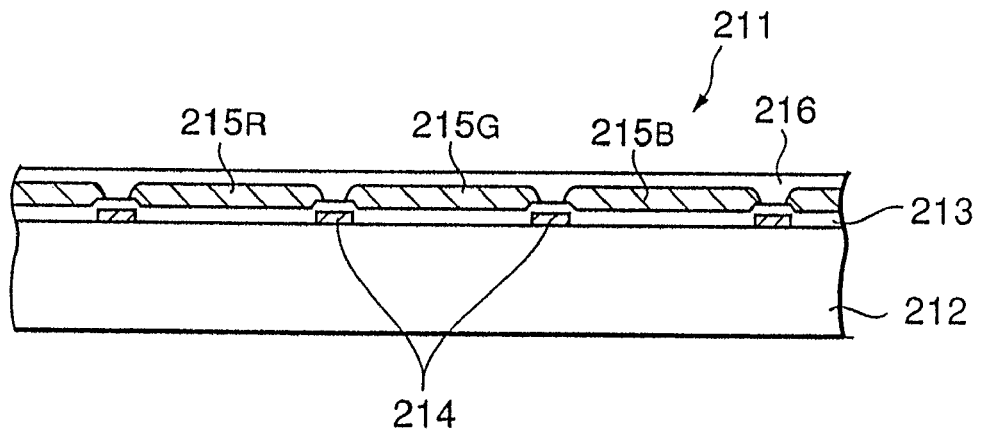

In the first step, a photocatalyst-containing layer 213 is formed on a transparent substrate 212 with a black matrix 214 previously formed thereon (FIG. 18(A)). The photocatalyst-containing layer 213 may be formed in the same manner as used in the formation of the photocatalyst-containing layer in the first embodiment.

Next, the photocatalyst-containing layer 213 in its red pattern forming areas are exposed to light to bring light exposed areas 213' to a high critical surface tension state through photocatalytic action. Thus, areas having specific wettability are formed (FIG. 18(B)). As with the light irradiation in the step of forming a black matrix (first step) in the first embodiment, the light irradiation may be pattern-wise exposure or light beam exposure.
(Second Step)

Next, a coating composition for a red pattern is fed to the photocatalyst-containing layer 213. As with the feed of the coating composition in the step of forming the black matrix (first step) in the first embodiment, the coating composition for a red pattern may be fed by a coating method, a nozzle ejection method, such as ink jetting, a film formation method utilizing vacuum or the like. The coating composition fed to the photocatalyst-containing layer is repelled by the unexposed areas having low critical surface tension and removed, so that the coating composition is selectively deposited only onto the exposed areas 213' having high critical surface tension. The coating composition for a red pattern deposited onto the exposed areas 213' is cured to form a red pattern 215R (FIG. 18(C)).

The same procedure as used in the formation of the red pattern is repeated to form a green pattern 215G and a blue pattern 215B. Thus, a colored layer 215 comprising a red pattern, a green pattern, and a blue pattern is formed. A protective layer 216 is formed on the colored layer 215 to obtain a color filter 211 shown in FIG. 14 (FIG. 18(D)).

Figure 19:
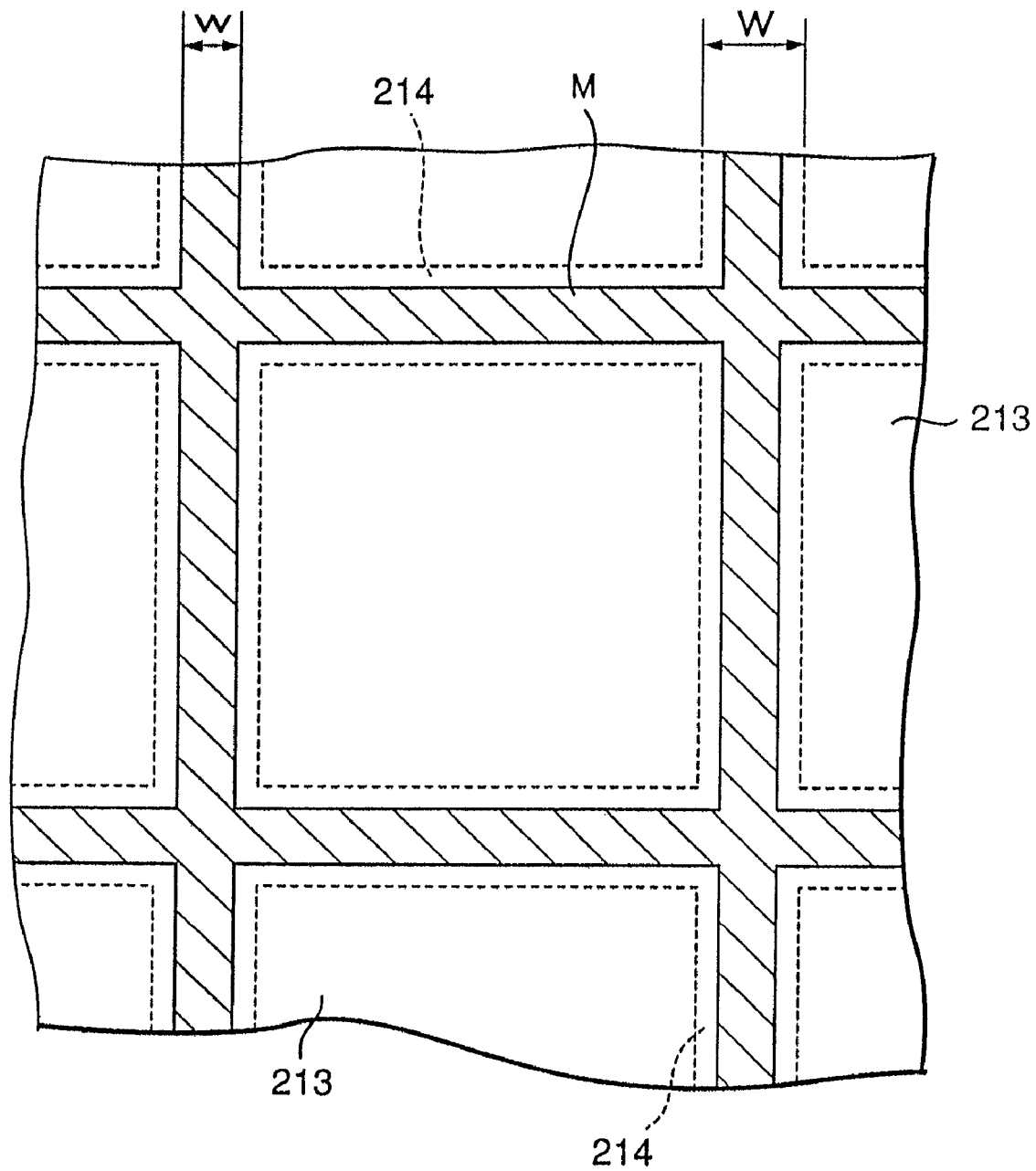
FIG. 19 is a plan view showing the state of a mask at the time of light exposure of a photocatalyst-containing layer in the process for producing a color filter according to the present invention shown in FIG. 18.
Figure 20A:
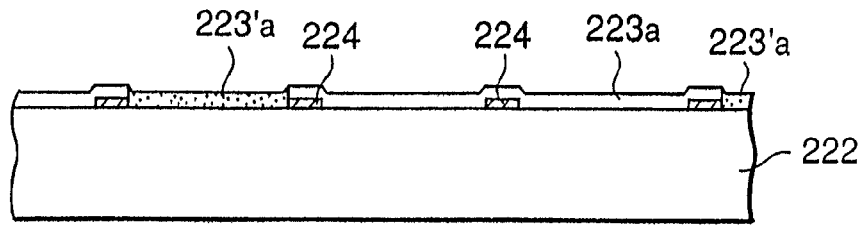
FIG. 20 is a flow diagram illustrating another embodiment of the process for producing a color filter according to the present invention.
Figure 20B:
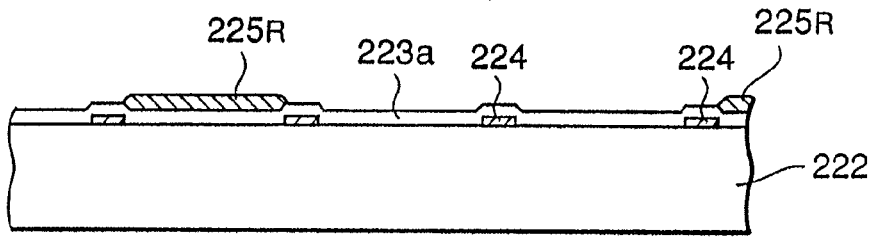
Figure 20C:
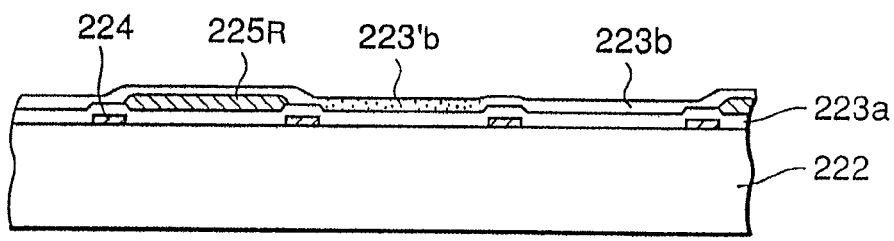
Figure 20D:
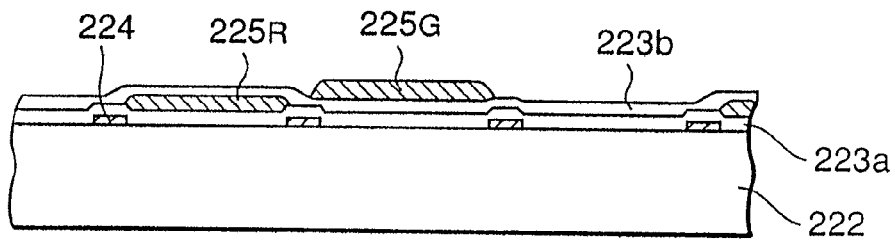
Figure 20E:
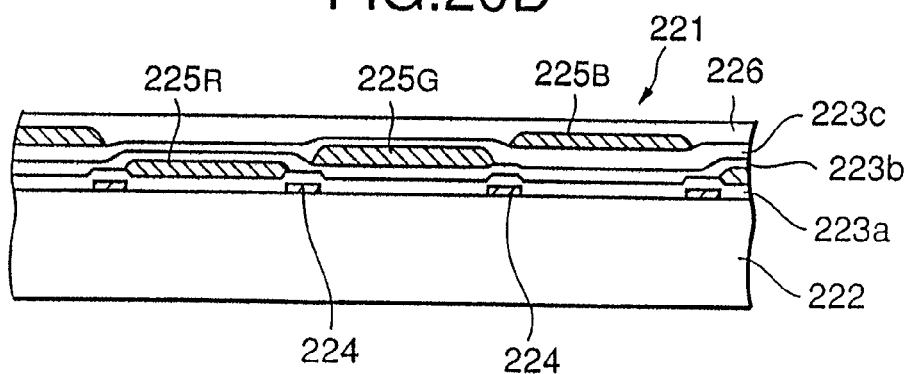

When the nozzle ejection method is used in the second step and a pattern of the black matrix 214 is formed so as to surround each color pattern (pixel), it is possible to form a colored layer by a method which comprises applying light to the whole area of the photocatalyst-containing layer 213 formed on the transparent substrate 212 in the first step so as to cover the black matrix 214 through a mask M, as shown in FIG. 19, having a light shielding pattern (a hatched region shown in FIG. 19) of which the line width (w) is smaller than the line with (W) of the black matrix 214, thereby bringing the whole area of the photocatalyst-containing layer to a high critical surface tension state through photocatalytic action, and, thereafter, feeding and homogeneously diffusing and depositing a coating composition for a color pattern onto the pattern forming areas for each color through a nozzle, followed by curing to form a colored layer.

When an organic polymeric resin layer is used as the wettability-variable component layer, light irradiation is carried out using ultraviolet light containing a large amount of a component of low wavelengths of not more than 250 nm.

Third Embodiment

Next, the third embodiment of the process for producing a color filter according to the present invention still be described by taking a color filter 221 shown in FIG. 15 as an example with reference to FIG. 20.

At the outset, a first photocatalyst-containing layer 223a is formed on a transparent substrate 222 with a black matrix 224 previously formed thereon. Next, the photocatalyst-containing layer 223a in its red pattern forming areas are exposed to light to bring light exposed areas 223'a to a high critical surface tension state through photocatalytic action. Thus, areas having specific wettability are formed (FIG. 20(A)). The first photocatalyst-containing layer 223a may be formed in the same manner as used in the formation of the photocatalyst-containing layer 203 in the first embodiment. As with the light irradiation in the step of forming a black matrix (first step) in the first embodiment, the exposure of the first photocatalyst-containing layer 223a to light may be pattern-wise exposure or light beam exposure. Next, a coating composition for a red pattern is fed to the first photocatalyst-containing layer 223a. As with the feed of the coating composition in the step of forming the black matrix (first step) in the first embodiment, the coating composition for a red pattern may be fed by a coating method, a nozzle ejection method, such as ink jetting, a film formation method utilizing vacuum or the like. The coating composition fed to the first photocatalyst-containing layer is repelled by the unexposed areas having low critical surface tension and removed, so that the coating composition is selectively deposited only onto the exposed areas 223'a having high critical surface tension. The coating composition for a red pattern deposited onto the exposed areas 223'a is cured to form a red pattern 225R (FIG. 20(B)). Thus, a laminate comprising a first photocatalyst-containing layer 223a and a red pattern 225R formed on the photocatalyst-containing layer 223a in its exposed areas (high critical surface tension areas) 223'a is formed on the transparent substrate 222.

In the same manner as used in the formation of the red pattern, a second photocatalyst-containing layer 223b is formed. The photocatalyst-containing layer 223b on its green pattern 225G forming areas is exposed to light to bring exposed areas 223'b to a high critical surface tension state through photocatalytic action. Thus, areas having specific wettability are formed (FIG. 20(C)). A coating composition for a green pattern is deposited onto the exposed areas 223'b, following by curing to form a green pattern 225G (FIG. 20 (D)). Thus, a laminate comprising a second photocatalyst-containing layer 223b and a green pattern 225G formed on the photocatalyst-containing layer 223b in its exposed areas (high critical surface tension areas) 223'b is formed on the transparent substrate 222.

The above procedure is repeated to form, on the transparent substrate 222, a laminate comprising a third photocatalyst-containing layer 223c and a blue pattern 225B formed on the photocatalyst-containing layer 223c in its exposed areas (high critical surface tension areas) 223'c. Thus, a colored layer 225 comprising a red pattern, a green pattern, and a blue pattern is formed. A protective layer 226 is formed on the colored layer 225 to obtain a color filter 221 shown in FIG. 15 (FIG. 20(E)).

When an organic polymeric resin layer is used as the wettability-variable component layer, the light irradiation is carried out using ultraviolet light containing a large amount of a component of low wavelengths of not more than 250 nm.

Fourth Embodiment

Next, the fourth embodiment of the process for producing a color filter according to the present invention will be described by taking a color filter 231 shown in FIG. 16 as an example with reference to FIG. 21.
(First Step)
In the first step, a first photocatalyst-containing layer 233a is formed on a transparent substrate 232. The photocatalyst-containing layer 233a on its black matrix forming areas is exposed to light to bring exposed areas 233'a to a high critical surface tension state through photocatalytic action. Thus, areas having specific wettability are formed (FIG. 21(A)). The first photocatalyst-containing layer 233a may be formed in the same manner as used in the formation of the photocatalyst-containing layer 203 in the first embodiment. As with the light irradiation in the step of forming a black matrix (second step) in the first embodiment, the exposure of the first photocatalyst-containing layer 233a to light may be pattern-wise exposure or light beam exposure.

Figure 21A:
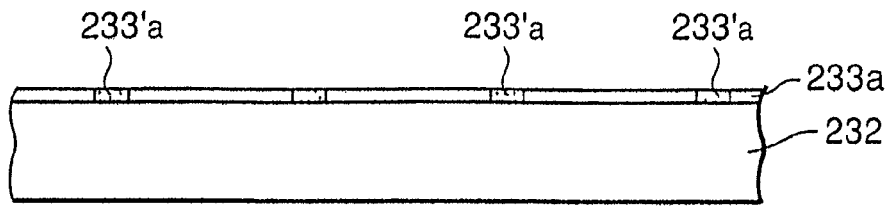
FIG. 21 is a flow diagram illustrating still another embodiment of the process for producing a color filter according to the present invention.
Figure 21B:
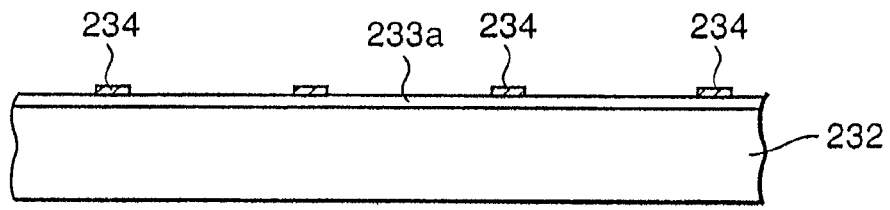
Figure 21C:
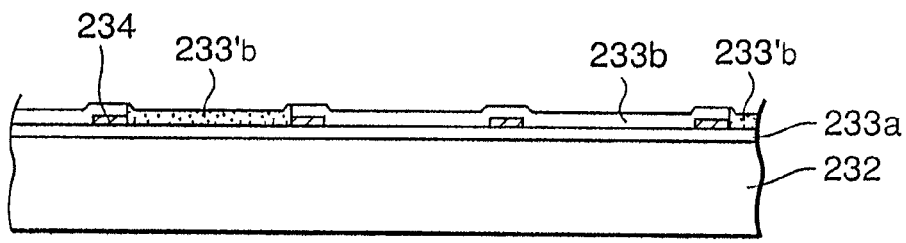
Figure 21D:
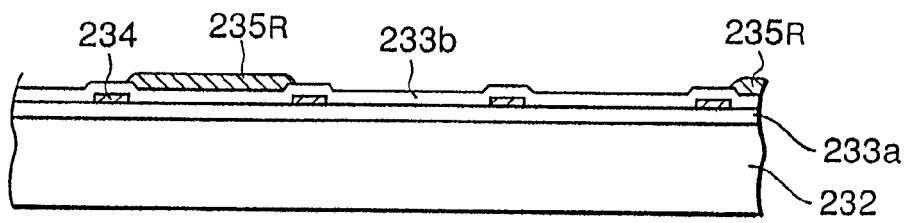
Figure 21E:
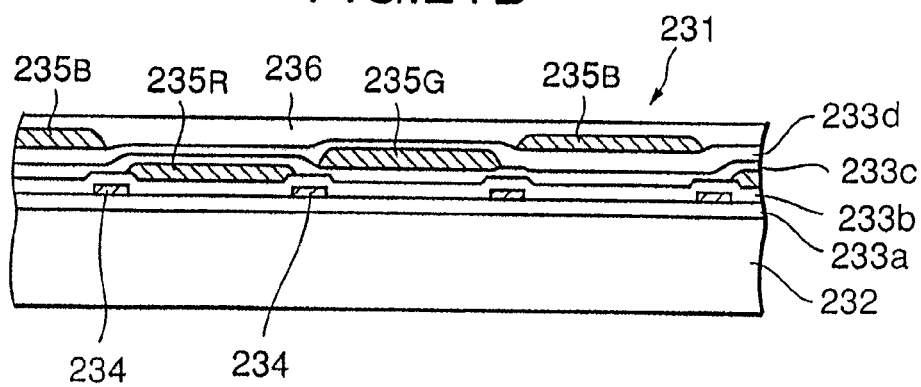

Next, a coating composition for a black matrix is deposited on the exposed areas 233'a, followed by curing to form a black matrix 234 (FIG. 21(B)). As with the deposition of the black matrix composition in the step of forming a back matrix (first step) in the first embodiment, the deposition of the black matrix composition onto the exposed areas 233'a may be carried out by a coating method, a nozzle ejection method, such as ink jetting, a film formation method utilizing vacuum or the like.
(Second Step)
A second photocatalyst-containing layer 233b is formed onto the first catalyst-containing layer 233a so as to cover the black matrix 234 formed on the first step. The photocatalyst-containing layer 233b on its red pattern forming areas is exposed to light to bring exposed areas 233'b to a high critical surface tension state through photocatalytic action. Thus, areas having specific wettability are formed (FIG. 21(C)). The second photocatalyst-containing layer 233a may be formed in the same manner as used in the formation of the first photocatalyst-containing layer 233a. As with the exposure of the first photocatalyst-containing layer 233a to light, the exposure of the second photocatalyst-containing layer 233b to light may be pattern-wise exposure or light beam exposure. Subsequently, a coating composition for a red pattern is fed to the second photocatalyst-containing layer 233b. As with the feed of the coating composition in the step of forming a black matrix (second step) in the first embodiment, the feed of the coating composition for a red pattern may be fed by a coating method, a nozzle ejection method, such as ink jetting, a film formation method utilizing vacuum or the like. The coating composition fed to the photocatalyst-containing layer is repelled by the black matrix 234 and the unexposed areas having low critical surface tension and removed, so that the coating composition is selectively deposited only onto the exposed areas 233'b having high critical surface tension. The coating composition for a red pattern deposited onto the exposed areas 233'b is cured to form a red pattern 235R (FIG. 21(D)). Thus, a laminate comprising a second catalyst-containing layer 233b and a red pattern 235R formed on the photocatalyst-containing layer 233b in its exposed areas (high critical surface tension areas) 233'b is formed on the first photocatalyst-containing layer 233a.

The same procedure is repeated to form, on the second photocatalyst-containing layer 233b, a laminate comprising a third photocatalyst-containing layer 233c and a green pattern 235G formed on the photocatalyst-containing layer 233c in its exposed areas (high critical surface tension areas) 233'c. Further, a laminate comprising a fourth photocatalyst-containing layer 233d and a blue pattern 235B formed on the photocatalyst-containing layer 233d in its exposed areas (high critical surface tension areas) 233'd is formed on the third photocatalyst-containing layer 233c. Thus, a colored layer 235 comprising a red pattern, a green pattern, and a blue pattern is formed. A protective layer 236 is formed on the colored layer 235 to obtain a color filter 231 shown in FIG. 16 (FIG. 21(E)).

As described above, according to the present invention, the composition for a black matrix and the composition for a colored layer can be deposited selectively onto the black matrix or colored layer forming areas. Therefore, the coating composition can be very efficiently utilized.

When an organic polymeric resin layer is used as the wettability-variable component layer, the light irradiation is carried out using ultraviolet light containing a large amount of a component of low wavelengths of not more than 250 nm.

In the above embodiments of the color filter and the process for producing a color filter, the number of colors and position of the colored layer and the like are illustrative only and are not intended to limit the present invention.

Re: Third Invention C
Pattern Based on Difference in Wettability
(Wettability)

The substrate used in the present invention has on its surface areas different from each other in wettability, that is, areas on which a liquid containing a lens forming material (hereinafter referred to also as "lens composition") is depositable and areas on which the lens composition is undepositable. The numerical value of the wettability is not particularly limited so far as the surface of the substrate has areas different from each other in wettability. The surface having areas different from each other in wettability may be the surface of the substrate per se or the substrate surface after surface treatment such as dampening water treatment.

In the present invention, the wettability may be evaluated, for example, by the contact angle of the surface with a liquid containing only a dispersion force component, such as a saturated hydrocarbon liquid, a liquid having a hydrogen bond, such as water, or a liquid containing a dispersion force component and a polar component, such as methylene iodide, or by surface free energy of the solid surface or the critical surface tension of the solid surface. Although no particular limitation is imposed, the wettability of the substrate used in the present invention may be, for example, not less than 70 dyne/cm for areas having higher wettability and, for example, not more than 30 dyne/cm for areas having lower wettability.

(Wettability Variation Method)

Methods for varying the wettability of the surface of the substrate to form a pattern include, but are not limited to, a method wherein the surface of the substrate is modified, a method wherein a film having different wettability is partially formed on the surface of the substrate, a method wherein a film on the surface of the substrate is partially removed to form areas having different wettability, and a method wherein a film is formed on the whole surface of the substrate followed by partial modification of the film.

Among them, a preferred method is to form a film on the whole surface of the substrate followed by partial modification of the film. In particular, the formation of a photocatalyst-containing layer, of which the wettability is variable upon light irradiation on the whole surface of the substrate, followed by light irradiation to form a pattern is more advantageous, for example, in that development is unnecessary, no waste is produced in the transfer or removal at the time of pattern formation, areas having different wettability can be formed without providing a large difference in level, and the material is inexpensive. Further, microlenses can be mass produced with high accuracy.

(Form of Pattern)

A composition for a lens may be deposited onto either the wettability-varied areas or the wettability-unvaried areas, and the form of the pattern is not particularly limited so far as lenses can be formed. Preferably, the pattern for the lens composition deposited may be in any of square, circle, regular hexagon and the like.

The number of areas on which the lens composition are to be deposited is not limited. Preferably, a large number of deposited areas are orderly provided.

The size of the pattern may be properly designed according to applications. The process for producing a lens according to the present invention also features the formation of fine microlenses. For example, microlenses having a very small diameter of, for example, 2 μm can be produced.

Although the area ratio of the lens composition-deposited region to the lens composition-undeposited region is not limited, it may be, for example, 10000:1 to 1:10000.

Lens (Lens Forming Material)

Materials for the lens of the present invention are not particularly limited so far as they are transparent materials that, after deposition as a liquid onto a substrate, can be cured and, after curing, can function as a lens according to applications.

Examples of materials usable for the lens of the present invention include combinations of photocurable resins with photopolymerization initiators, and thermosetting resins. Among them, photocurable resins, such as ultraviolet curable resins, are preferred because they can be easily and rapidly cured and the temperature of the lens forming material and the substrate does not become high at the time of curing.

When the material is colored with a colorant to prepare a color lens having the function of a color filter, colorants usable herein include dyes, inorganic pigments, and organic pigments.

More specific examples of materials usable for lenses are as follows.

(1) Photocurable Resin Composition

Photocurable resin compositions which may be preferably used in the present invention are highly transparent to visible light. The photocurable resin composition refers to a monomer or an oligomer that has at least one functional group and is ionically polymerized or radically polymerized by ions or radical generated upon application of a curing energy radiation to a photopolymerization initiator to increase the molecular weight or to form a crosslinked structure. The functional group refers to an atomic group or a bonding form causative of reactions of vinyl, carboxyl, or hydroxyl groups.

Monomers and oligomers usable herein include unsaturated polyester, enethiol, acrylic and other monomers and oligomers. Among them, acrylic monomers and oligomers are preferred from the viewpoints of curing speed and the range of selectable properties. Representative examples of acrylic monomers and oligomers usable herein include the following compounds.

(1-1) Monofunctional Compounds

2-Ethylhexyl acrylate, 2-ethylhexyl EO adduct acrylate, ethoxy diethylene glycol acrylate, 2-hydroxyethyl acrylate, 2-hydroxypropyl acrylate, caprolactone adduct of 2-hydroxyethyl acrylate, 2-phenoxyethyl acrylate, phenoxydiethylene glycol acrylate, nonyl phenol EO adduct acrylate, acrylate which has been caprolactone added to nonyl phenol EO adduct, 2-hydroxy-3-phenoxypropyl acrylate, tetrahydrofurfuryl acrylate, furfuryl alcohol caprolactone adduct acrylate, acryloylmorpholine, dicyclopentenyl acrylate, dicyclopentanyl acrylate, dicyclopentenyloxyethyl acrylate, isobornyl acrylate, 4,4-dimethyl-1,3-dioxolane caprolactone adduct acrylate, and 3-methyl-5,5-dimethyl-1,3-dioxolane caprolactone adduct acrylate.

(1-2) Polyfunctional Compounds

Hexanediol diacrylate, neopentyl glycol diacrylate, polyethylene glycol diacrylate, tripropylene glycol diacrylate, hydroxypivalic acid neopentyl glycol ester diacrylate, hydroxypivalic acid neopentyl glycol ester caprolactone adduct diacrylate, acrylic acid adduct of 1,6-hexanediol diglycidyl ether, diacrylate of acetal compound of hydroxypivalaldehyde with trimethylolpropane, 2,2-bis[4-(acryloyloxydiethoxy)phenyl]propane, 2,2-bis[4-(acryloyloxydiethoxy)phenyl]methane, hydrogenated bisphenol ethylene oxide adduct diacrylate, tricyclodecane dimethanol diacrylate, trimethylolpropane triacrylate, pentaerythritol triacrylate, trimethylolpropane propylene oxide adduct triacrylate, glycerin propylene oxide adduct triacrylate, mixture of dipentaerythritol hexaacrylate with pentaacrylate, dipentaerythritol caprolactone adduct acrylate, tris(acryloyloxyethyl) isocyanurate, 2-acryloyloxyethyl phosphate and the like.

(2) Photopolymerization Initiator

The photopolymerization initiator used in the present invention is not particularly limited and may be selected from conventional polymerization initiators. Representative examples of photopolymerization initiators usable herein include the following compounds.

(2-1) Carbonyl Compounds

Acetophenone, benzophenone, Michler's ketone, benzyl, benzoin, benzoin ether, benzyl dimethyl ketal, benzoin benzoate, α-acyloxime ester and the like.

(2-2) Sulfur Compounds

Tetramethylthiuram monosulfide, thioxanthones and the like.

(2-3) phosphorus Compounds 2,4,6-Trimethylbenzoyl diphenylphosphinoxide and the like (3) Thermoplastic Resin Composition Thermoplastic resin compositions having high transparency to visible light region. Preferred are thermoplastic resin compositions that are excellent in transparency, as well as in optical properties, such as refractive index, dispersion properties, and birefringence. Representative examples of thermoplastic resin compositions usable herein include homopolymers or copolymers of polycarbonate, polymethyl methacrylate, and methyl phthalate, polyethylene terephthalate, polystyrene, diethylene glycol bisallyl carbonate, acrylonitrile/styrene copolymer, methyl methacrylate styrene copolymer, and poly(-4-methylpentene-1).

(4) Colorant

In the lens according to the present invention, dissolution of a dye in a material for a lens, dispersion of a pigment in the material for a lens or the like to color the material can provide a color lens. The colorant usable in the present invention may be any of a dye, an organic pigment and an inorganic pigment which are commonly used in color filters. Among them, materials are preferred which can provide high color density and are less likely to cause fading at the time of curing of the lens and in use, and examples thereof are as follows:

dyes, for example, azo dyes, anthraquinone dyes, indigoid dyes, phthalocyanine dyes, carbonium dyes, quinoneimine dyes, methine dyes, quinoline dyes, nitro dyes, benzoquinone dyes, naphthoquinone dyes, naphthalimide dyes, perinone dyes, pyrylium dyes, thiapyrilium dyes, azulenium dyes, and squarylium salt dyes, and organic pigments, for example, dianthraquinone, copper halogenide phthalocyanine, copper phthalocyanine, and other phthalocyanine pigments, polycyclic quinone pigments, such as perylene pigments and pyranthrone pigments, indigo pigments, quinacridone pigments, pyrrole pigments, pyrrolopyrrole pigments, and azo pigments. Other dyes and pigments may also be used so far as they can satisfy colorant requirements. Further, the colorants may be used in any combination of two or more in any desired ratio so far as there are no other limitations.

(Composition for Lens)

The composition for a lens is not particularly limited so far as the composition contains materials for the lens.

Compositions for a lens include a liquid comprising a monomer and a polymerization initiator, a solution or a dispersion of a monomer and a polymerization initiator, a liquid comprising an oligomer and a polymerization initiator, a solution or a dispersion of an oligomer and a polymerization initiator, and a solution or a dispersion of a monomer, an oligomer, and a polymerization initiator.

A material liquid for a color lens may be a solution or a dispersion prepared by dissolving or dispersing a colorant in the above material liquid.

(Areas on Which Composition for Lens is to be Deposited)

In the process for producing a lens according to the present invention, the composition for a lens may be deposited onto any area of a pattern based on a difference in wettability on the surface of a substrate. In other words, the composition may be deposited onto the surface of the substrate in its wettability-varied areas or wettability-unvaried areas. In one specific example thereof, the composition may be deposited onto high wettability areas or high critical surface tension areas, or alternatively may be deposited onto low wettability areas or low critical surface tension areas. When the composition for a lens is deposited onto the low critical surface tension areas, preferably, the high critical surface tension areas are previously coated with dampening water, followed by deposition of the composition for a lens onto the low critical surface tension areas while avoiding direct contact of the lens composition with the high critical surface tension areas.

(Adjustment of Focal Length of Lens)

One of great features of the process for producing a lens according to the present invention is that the adjustment of the focal length of the lens, that is, varying the curvature, can be very easily performed.

Figure 22A:
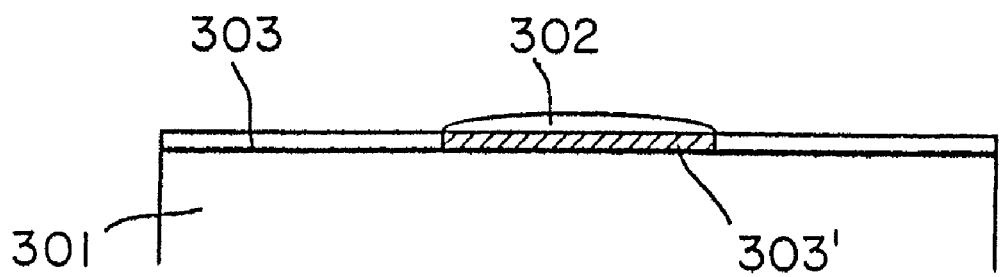
FIG. 22 is a diagram illustrating regulation of the focal length in the process for producing a lens according to the present invention.
Figure 22B:
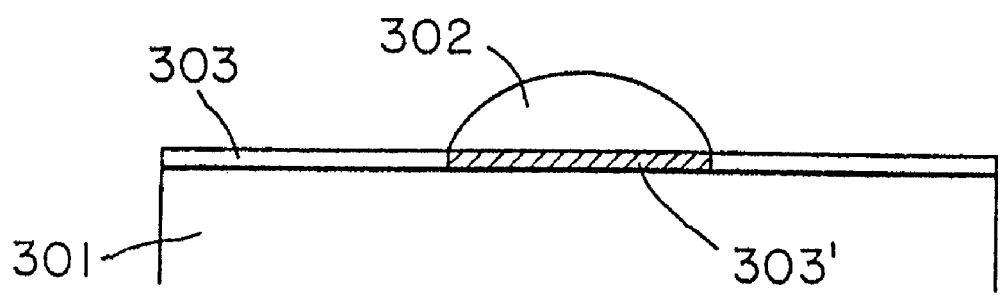
Figure 22C:
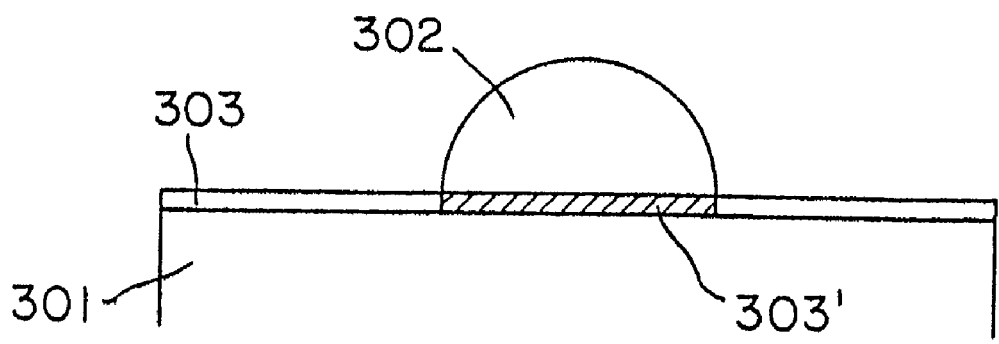

A specific example of the adjustment of the focal length of the lens according to the present invention will be described with reference to FIG. 22. A photocatalyst-containing layer 303 having low wettability by the composition for a lens is provided on a transparent substrate 301. A part of the photocatalyst-containing layer 303 constitutes a wettability-varied photocatalyst-containing layer having high wettability by the composition for a lens and corresponding to areas on which the composition for a lens is to be deposited (hereinafter referred to also as "modified photocatalyst-containing layer 303'). Further, a composition 302 for a lens is deposited on the modified photocatalyst-containing layer 303'. FIG. 22(A) shows an embodiment wherein a small amount of the composition 302 for a lens has been deposited. Even when the amount of the composition 302 for a lens is small, the composition is spread over the whole modified photocatalyst-containing layer 303', making it possible to form microlenses having small curvature and long focal length. FIG. 22(B) shows an embodiment wherein a medium amount of the composition for a lens has been deposited. As compared with FIG. 22 (A), microlenses having larger curvature and shorter focal length are formed. FIG. 22(C) shows an embodiment wherein a large amount of the composition for a lens has been deposited. Although the amount of the composition 302 for a lens is large, the composition is not spread on the photocatalyst-containing layer 303 having low wettability. As a result, microlenses having high curvature and short focal length are formed.

Thus, the process for producing a lens according to the present invention has an advantage that the focal length of the microlens can be simply regulated by varying the amount of the composition for a lens deposited per place. Further, since the size of the bottom is specified by the size of the pattern, advantageously, a change in amount of the composition for a lens does not results in a change in the size of the bottom. Furthermore, even though the composition for a lens is deposited on a position slightly deviated from an originally predetermined position, the difference in wettability permits the position of the composition for a lens to be corrected to the position of the pattern. Therefore, a microlens array having very high positional accuracy can be advantageously produced.

(Deposition of Composition for Lens by Coating)

In the process for producing a lens according to the present invention, the composition for a lens may be deposited by coating onto the surface of the substrate. Specific examples of coating methods usable herein include dip coating, roll coating, bead coating, spin coating, air doctor coating, blade coating, knife coating, rod coating, gravure coating, rotary screen coating, kiss coating, slot orifice coating, spray coating, cast coating, and extrusion coating. These coating methods are advantageous in that a large amount of lens shapes can be prepared in short time.

An array of lenses of a plurality of colors may be produced by repeating, one color by one color as many times as required for the necessary number of colors, the step of forming a pattern based on a difference in wettability on the surface of the substrate, the step of depositing the colored composition for a lens by the coating method as described above, and optionally the step of curing the composition for a lens.

(Deposition of Composition for Lens by Ejection Through Nozzle)

In the process for producing a lens according to the present invention, the composition for a lens can be deposited onto the surface of the substrate by ejection through a nozzle. Specific examples of ejection methods usable herein include ejection using microsyringe, ejection using a dispenser, ink jetting, a method wherein the composition for a lens is ejected from a needle by external stimulation, such as an electric field, a method wherein the composition for a lens is ejected from a vibrating element, such as piezo element, which is vibrated by external stimulation, and a method wherein a composition for a lens deposited on a needle is deposited on the surface of the substrate. These methods are advantageous in that lens shapes having a large contact angle and large height can be prepared.

When an array of lenses of a plurality of colors is produced, nozzles in the necessary number of colors as described above are used, and colored compositions for a lens containing materials for lenses of respective colors are ejected through respective nozzles and deposited onto the surface of the substrate.

When an array of lenses of a plurality of colors is produced through a nozzle for a single color, the array of color lenses may be produced by repeating, one color by one color as many times as required for the necessary number of colors, the step of forming a pattern based on a difference in wettability on the surface of the substrate, the step of depositing the colored composition for a lens by ejection through the nozzle as described above, and optionally the step of curing the composition for a lens.

(Microlens Array)

In the process for producing a lens according to the present invention, preferably, microlenses are orderly arranged to produce a microlens array. The sequence of the microlens array correspond to the pattern based on a difference in wettability, and the shape of the bottom of the microlens also corresponds to the pattern based on a difference in wettability. Therefore, the position and shape of the microlenses according to a preferred embodiment of the present invention are high. Further, the accuracy of the composition for a lens can be deposited only onto areas having high wettability. In this case, the contact is more intimate, and, hence, microlenses having higher strength can be produced. The contact surface can be designed to be not only circular but also polygonal. Therefore, as compared with circular lenses, the area of other portions than the lens shape can be reduced, making it possible to easily produce an array of microlenses having a high numerical aperture.

Further, deposition of the colored composition for a lens can provide, as with the above microlenses, an array of color microlenses having high positional and shape accuracy, high adhesion and strength, and high numerical aperture can be easily produced.

FIG. 23 is a cross-sectional view of a microlens array according to a preferred embodiment of the present invention. The microlens array comprises: a substrate 301 having thereon a photocatalyst-containing layer 303 and a wettability-varied modified photocatalyst-containing layer 303'; and lenses 302 provided on the unmodified photocatalyst-containing layer 303.

FIG. 24 is a cross-sectional view of a color microlens array according to a preferred embodiment of the present invention. The color microlens array comprises: a substrate 301 having thereon a photocatalyst-containing layer 303 and a wettability-varied modified photocatalyst-containing layer 303'; and a first color lens 315, a second color lens 316, and a third color lens 317 provided on the unmodified photocatalyst-containing layer 303.

Substrate

For the material constituting the substrate, a pattern based on a difference in wettability may be formed on the surface thereof either in itself or by forming a layer. The material is not particularly limited so far as it may form microlenses. When the material for the substrate is transparent and the transparent material is used, there is no need to provide the step of removing the lenses from the substrate. This is very effective in producing a microlens array. Materials for the above substrate are not particularly limited and may be inorganic or organic materials so far as they are commonly used in the production of microlens arrays. Preferred examples thereof include soda glass, quartz glass, optical glass (BSC7, manufactured by HOYA), glass for electronics (such as alkali-free glass), translucent ceramics, plastic films and sheets of polycarbonate, methyl methacrylate homopolymer or copolymer, polyethylene terephthalate, and polystyrene.

The shape and thickness of the substrate may be varied depending-upon applications, and the substrate may be in any fold commonly used in the art.

Photocatalyst-Containing Layer (Principle of Variation in Wettability)

According to a preferred embodiment of the present invention, a photocatalyst capable of creating a chemical change in materials (such as a binder) around it upon light irradiation may be used to form a pattern based on a difference in wettability on light exposed areas. The mechanism of the action of the photocatalyst typified by titanium oxide according to a preferred embodiment of the present invention has not been fully elucidated. However, it is considered that carriers produced in the photocatalyst upon light irradiation directly change the chemical structure of the binder and the like, or otherwise active oxygen species produced in the presence of oxygen and water changes the chemical structure of the binder and the like. Thus, the wettability of the surface of the substrate is varied.

According to a preferred embodiment of the present invention, the photocatalyst changes the wettability of light exposed areas through oxidation, decomposition or the like of organic groups as a part of the binder and additives to bring the exposed areas to a high critical surface tension state. This creates a large difference in wettability between the exposed areas and the unexposed areas to record pattern information.

(Photocatalyst Material)

Preferred photocatalyst materials usable in the present invention include, for example, metal oxides known as photosemiconductors, such as titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$). Among them, titanium oxide is particularly preferred because it has high band gap energy and is chemically stable, nontoxic, and easily available.

Titanium oxide as the photocatalyst may be in anatase form or rutile form with anatase form of titanium oxide being preferred. Specific examples of anatase form of titanium oxide usable herein include hydrochloric acid peptization type titania sols (STS-02, average crystal diameter 7 nm, manufactured by Ishihara Sangyo Kaisha Ltd.) and nitric acid peptization type titania sols (TA-15, average crystal diameter 12 nm, manufactured by Nissan Chemical Industries Ltd.).

Preferably, the photocatalyst has a small particle diameter because the photocatalytic reaction takes place efficiently to render the surface roughness of the photocatalyst-containing layer small. The average particle diameter is preferably not more than 50 nm, more preferably not more than 20 nm.

The content of the photocatalyst in the photocatalyst-containing layer is preferably 5 to 60% by weight, more preferably 20 to 40% by weight.

(Binder Component)

According to a preferred embodiment of the present invention, the binder used in the photocatalyst-containing layer preferably has a binding energy high enough to avoid the decomposition of the main skeleton upon photoexcitation of the photocatalyst, and example thereof include (1) organopolysiloxanes that hydrolyze and polycondensate a chloro- or alkoxysilane or the like by a sol-gel reaction or the like to develop large strength and (2) organopolysiloxanes obtained by crosslinking reactive silicones having excellent water repellency or oil repellency.

In the case of (1), the organopolysiloxane is composed mainly of a hydrolysis condensate or a cohydrolyzate of at least one member selected from silicon compounds represented by general formula $Y_nSiX_{4-n}$ wherein n is 1 to 3; Y represents an alkyl, fluoroalkyl, vinyl, amino, or epoxy group; and X represents a halogen or a methoxy, ethoxy, or acetyl group.

Specific examples thereof include methyltrichlorosilane, methyltribromosilane, methyltrimethoxysilane, methyltriethoxysilane, methyltriisopropoxysilane, methyl-tri-t-butoxysilane; ethyltrichlorosilane, ethyltribromosilane, ethyltrimethoxysilane, ethyltriethoxysilane, ethyltriisopropoxysilane, ethyl-tri-t-butoxysilane; n-propyltrichlorosilane, n-propyltribromosilane, n-propyltrimethoxysilane, n-propyltriethoxysilane, n-propyltriisopropoxysilane, n-propyl-tri-t-butoxysilane; n-hexyltrichlorosilane, n-hexyltribromosilane, n-hexyltrimethoxysilane, n-hexyltriethoxysilane, n-hexyltriisopropoxysilane, n-hexyl-tri-t-butoxysilane; n-decyltrichlorosilane, n-decyltribromosilane, n-decyltrimethoxysilane, n-decyltriethoxysilane, n-decyltriisopropoxysilane, n-decyl-tri-t-butoxysilane; n-octadecyltrichlorosilane, n-octadecyltribromosilane, n-octadecyltriethoxysilane, n-octadecyltriethoxysilane, n-octadecyltriisopropoxysilane, n-octadecyl-tri-t-butoxysilane; phenyltrichlorosilane, phenyltribromosilane, phenyltrimethoxysilane, phenyltriethoxysilane, phenyltriisopropoxysilane, phenyl-tri-t-butoxysilane; tetrachlorosilane, tetrabromosilane, tetramethoxysilane, tetraethoxysilane, tetrabutoxysilane, dimethoxydiethoxysilane; dimethyldichlorosilane, dimethyldibromosilane, dimethyldimethoxysilane, dimethyldiethoxysilane; diphenyldichlorosilane, diphenyldibromosilane, diphenyldimethoxysilane, diphenyldiethoxysilane; phenylmethyldichlorosilane, phenylmethyldibromosilane, phenylmethyldimethoxysilane, phenylmethyldiethoxysilane; trichlorohydrosilane, tribromohydrosilane, trimethoxyhydrosilane, triethoxyhydrosilane, triisopropoxyhydrosilane, tri-t-butoxyhydrosilane; vinyltrichlorosilane, vinyltribromosilane, vinyltrimethoxysilane, vinyltriethoxysilane, vinyltriisopropoxysilane, vinyl-tri-t-butoxysilane; trifluoropropyltrichlorosilane, trifluoropropyltribromosilane, trifluoropropyltrimethoxysilane, trifluoropropyltriethoxysilane, trifluoropropyltriisopropoxysilane, trifluoropropyl-tri-t-butoxysilane; γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyl-tri-t-butoxysilane; γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyl-tri-t-butoxysilane; γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyl-tri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyl-tri-t-butoxysilane; β-(3,4-epoxycyclohexyl)ethyltrimethoxysilane, β-(3,4-epoxycyclohexyl)ethyltriethoxysilane; and partial hydrolyzates thereof; and mixtures thereof.

The binder is particularly preferably a polysiloxane containing a fluoroalkyl group, specifically at least one member selected from hydrolysis condensates and cohydrolysis condensates of the following fluoroalkylsilanes. Polysiloxanes generally known as fluorosilane coupling agents may also be used.

$CF_3(CF_2)_3CH_2CH_2Si(OCH_3)_3$,
$CF_3(CF_2)_5CH_2CH_2Si(OCH_3)_3$,
$CF_3(CF_2)_7CH_2CH_2Si(OCH_3)_3$,
$CF_3(CF_2)_9CH_2CH_2Si(OCH_3)_3$,
$(CF_3)_2CF(CF_2)_4CH_2CH_2Si(OCH_3)_3$,
$(CF_3)_2CF(CF_2)_6CH_2CH_2Si(OCH_3)_3$,
$(CF_3)_2CF(CF_2)_8CH_2CH_2Si(OCH_3)_3$,
$CF_3(C_6H_4)C_2H_4Si(OCH_3)_3$,
$CF_3(CF_2)_3(C_6H_4)C_2H_4Si(OCH_3)_3$,
$CF_3(CF_2)_5(C_6H_4)C_2H_4Si(OCH_3)_3$,
$CF_3(CF_2)_7(C_6H_4)C_2H_4Si(OCH_3)_3$,
$CF_3(CF_2)_3CH_2CH_2SiCH_3(OCH_3)_2$,
$CF_3(CF_2)_5CH_2CH_2SiCH_3(OCH_3)_2$,
$CF_3(CF_2)_7CH_2CH_2SiCH_3(OCH_3)_2$,
$CF_3(CF_2)_9CH_2CH_2SiCH_3(OCH_3)_2$,
$(CF_3)_2CF(CF_2)_4CH_2CH_2SiCH_3(OCH_3)_2$,
$(CF_3)_2CF(CF_2)_6CH_2CH_2SiCH_3(OCH_3)_2$,
$(CF_3)_2CF(CF_2)_8CH_2CH_2SiCH_3(OCH_3)_2$,
$CF_3(C_6H_4)C_2H_4SiCH_3(OCH_3)_2$,
$CF_3(CF_2)_3(C_6H_4)C_2H_4SiCH_3(OCH_3)_2$,
$CF_3(CF_2)_5(C_6H_4)C_2H_4SiCH_3(OCH_3)_2$,
$CF_3(CF_2)_7(C_6H_4)C_2H_4SiCH_3(OCH_3)_2$,
$CF_3(CF_2)_3CH_2CH_2Si(OCH_2CH_3)_3$,
$CF_3(CF_2)_5CH_2CH_2Si(OCH_2CH_3)_3$,
$CF_3(CF_2)_7CH_2CH_2Si(OCH_2CH_3)_3$,
$CF_3(CF_2)_9CH_2CH_2Si(OCH_2CH_3)_3$, and
$CF_3(CF_2)_7SO_2N(C_2H_5)C_2H_4CH_2Si(OCH_3)_3$.

Use of polysiloxanes containing fluoroalkyl groups as the binder results in markedly improved water repellency and oil repellency of the photocatalyst-containing layer in its unexposed areas and can improve the function of inhibiting deposition of lens compositions and coating compositions for black matrixes.

Examples of reactive silicones (2) include compounds having a skeleton represented by the following general formula.

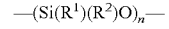

wherein n is an integer of two or more; and $R^1$ and $R^2$ represent a substituted or unsubstituted alkyl, alkenyl, aryl, or cyanoalkyl group having 1 to 10 carbon atoms. Preferably, not more than 40% by mole of the whole is accounted for by vinyl, phenyl, or phenyl halide. $R^1$ and/or $R^2$ preferably represent a methyl group because the surface free energy of the silicone is the smallest. The molar proportion of the methyl group is preferably not less than 60%. Further, the chain end or the side chain has in its molecular chain at least one reactive group, such as a hydroxyl group.

A stable organosilicon compound not causing any crosslinking reaction, such as dimethylpolysiloxane, together with the organopolysiloxane, may be incorporated into the binder.

(Other Components of Photocatalyst-Containing Layer)

A surfactant may be incorporated into the photocatalyst-containing layer preferably used in the present invention from the viewpoint of lowering the wettability of unexposed areas. The surfactant is not particularly limited so far as it can be removed by decomposition. Specific examples of preferred surfactants usable herein include hydrocarbon surfactants, such as NIKKOL BL, BC, BO, and BB series manufactured by Nihon Surfactant Kogyo K.K.; and fluoro or silicone nonionic surfactants, such as ZONYL FSN and FSO, manufactured by E.I. du Pont de Nemours & Co., Surfluon S-141 and 145 manufactured by Asahi Glass Co., Ltd., Megafac F-141 and 144 manufactured by Dainippon Ink and Chemicals, Inc., Ftergent F-200 and F-251, manufactured by Neos Co., Ltd.; Unidyne DS-401 and 402 manufactured by Daikin Industries, Ltd., and Fluorad FC-170 and 176 manufactured by Sumitomo 3M Ltd. Cationic, anionic and amphoteric surfactants may also be used.

Further, besides the surfactant, the following compound may be incorporated into the photocatalyst-containing layer preferably used in the present invention: oligomers and polymers, such as polyvinyl alcohol, unsaturated polyesters, acrylic resins, polyethylene, diallyl phthalate, ethylene propylene diene monomer, epoxy resin, phenolic resin, polyurethane, melamine resin, polycarbonate, polyvinyl chloride, polyamide, polyimide, styrene butadiene rubber, chloroprene rubber, polypropylene, polybutylene, polystyrene, polyvinyl acetate, nylon, polyester, polybutadiene, polybenzimidazole, polyacrylonitrile, epichlorohydrin, polysulfide, and polyisoprene.

(Method for Forming Photocatalyst-Containing Layer)

The method for forming the photocatalyst-containing layer is not particularly limited. For example, a photocatalyst-containing coating liquid may be coated onto a substrate by spray coating, dip coating, roll coating, bead coating or the like to form a photocatalyst-containing layer. When the coating liquid contains an ultraviolet curable component as the binder, the photocatalyst-containing composition layer may be formed on the substrate by curing through ultraviolet irradiation.

When a coating liquid containing a photocatalyst or the like is used, solvents used in the coating liquid is not particularly limited. For example, organic solvents, for example, alcohols, such as ethanol and isopropanol, may be used.

(Light for Exposure to Induce Photocatalytic Action)

The exposure light for inducing photocatalytic action is not particularly limited so far as the photocatalyst can be excited. Examples thereof include ultraviolet light, visible light, infrared radiation and, in addition, electromagnetic waves and radiations having shorter or longer wavelength than these lights.

For example, the anatase form of titania is used as the photocatalyst, the excitation wavelength thereof is not more than 380 nm. Therefore, in this case, the photocatalyst can be excited by ultraviolet light. Ultraviolet light sources usable herein include mercury lamps, metal halide lamps, xenon lamps, excimer laser, and other ultraviolet light sources. The wettability of the layer surface may be varied by varying the intensity, exposure and the like.

FIG. 25 is an explanatory view showing one embodiment of the process for producing a microlens using the above photocatalyst according to a preferred embodiment of the present invention. As shown in FIG. 25(A), a photocatalyst-containing layer 303 is formed on a substrate 301, a photomask 304 is put on the photocatalyst-containing layer 303, and light 305 is applied to the photocatalyst-containing layer 303 through the photomask 304 to form a modified photocatalyst-containing layer 303'. Next, as shown in FIG. 25(B), a composition for a lens ejected through an ejection nozzle 306 and deposited onto the modified photocatalyst-containing layer 303' to form a lens 302.

Light Shielding Layer

The light shielding layer preferably used in the lens of the present invention is formed so that the position and the shape conform to the position and the shape of the lens. The light shielding layer functions to prevent incidence of unnecessary light around the lens into the lens. More preferably, the light shielding layer is provided on a microlens array.

According to a preferred embodiment of the present invention, the light shielding layer may be formed by any method without limitation. Preferably, however, as with the lens, the light shielding layer is formed by utilizing a difference in wettability. Specifically, a pattern based on a difference in wettability for a light shielding pattern corresponding to the lens pattern is formed on the backside of a transparent substrate that is the side on which the lens is not formed. A liquid containing a material for a light shielding layer is deposited onto areas having specific wettability for the light shielding layer pattern of the substrate, and the liquid containing a material for the light shielding layer is cured to produce lenses having a light shielding layer.

The material for the light shielding layer is not limited so far as it is generally used in the art. An example of the material for the light shielding layer is a thin layer of a light shielding resin layer formed using a coating material of an acrylic thermoplastic resin containing carbon black.

Figure 26:
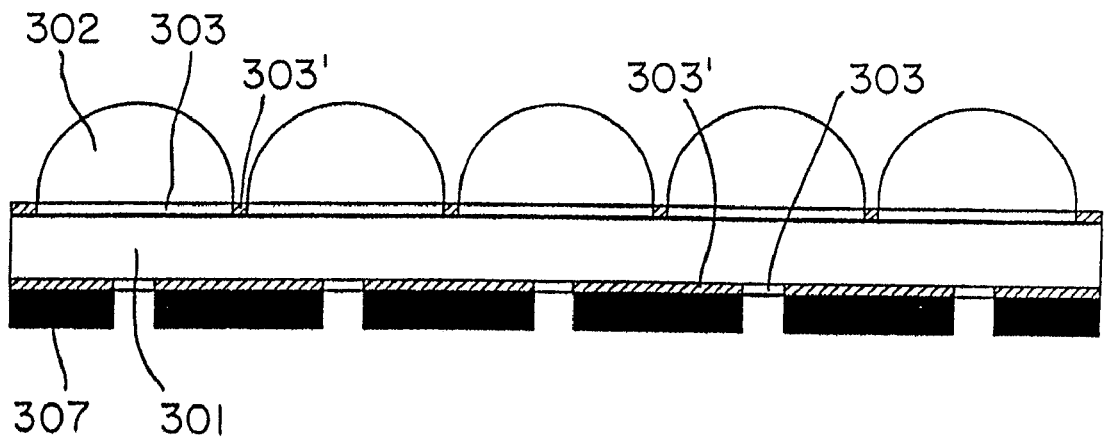
FIG. 26 is a cross-sectional view showing one embodiment of a microlens array having a light shielding layer according to a preferred embodiment of the present invention.

FIG. 26 shows a cross-sectional view showing a microlens array having a light shielding layer according to a preferred embodiment of the present invention. In FIG. 26, a photocatalyst-containing layer 303 is provided on a substrate 301. A lens 302 is provided on the photocatalyst-containing layer 303 in its areas other than the modified catalyst-containing layer 303'. Further, the photocatalyst-containing layer 303 is provided also on the substrate 301 in its side (backside) not provided with the lens 302, and a light shielding layer 307 is provided on the modified photocatalyst-containing layer 303'.

Figure 27:
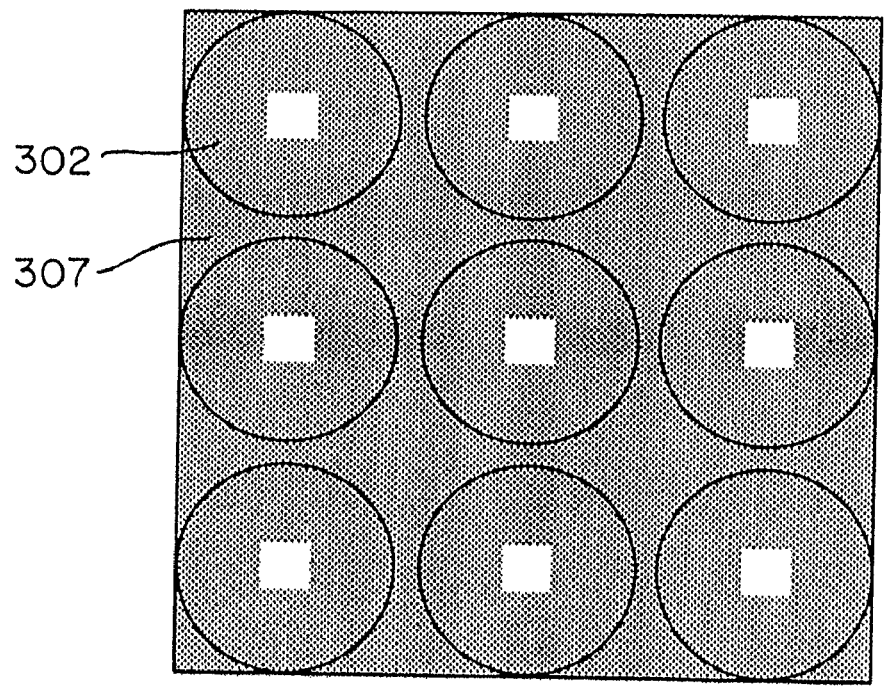
FIG. 27 is a plan view, showing a microlens array having a light shielding layer according to a preferred embodiment of the present invention, as viewed from the light shielding layer side.

FIG. 27 is a plan view of a microlens array having a light shielding layer as viewed from the side on which the light shielding layer is provided. As can be seen from the drawing, an opening of the light shielding layer 307 is provided at a position corresponding to the center of the lens 302.

Application to Image Pick-Up Device

The microlens array according to a preferred embodiment of the present invention can be preferably used as a component adjacent to or in intimate contact with an image pick-up element, for example, CCD, in order to enhance the photosensitivity of image pick-up devices. In this case, preferably, a light shielding layer is provided, for example, from the viewpoint of avoiding an adverse effect onto properties, such as a lowering in contrast due to stray light. The thickness of the photocatalyst-containing layer is preferably small for enhancement of light transmission, prevention of the photocatalyst-containing layer from developing color due to interference of light, and other purposes. The thickness is preferably not more than 1 μm, more preferably not more than 0.2 μm.

Figure 28:
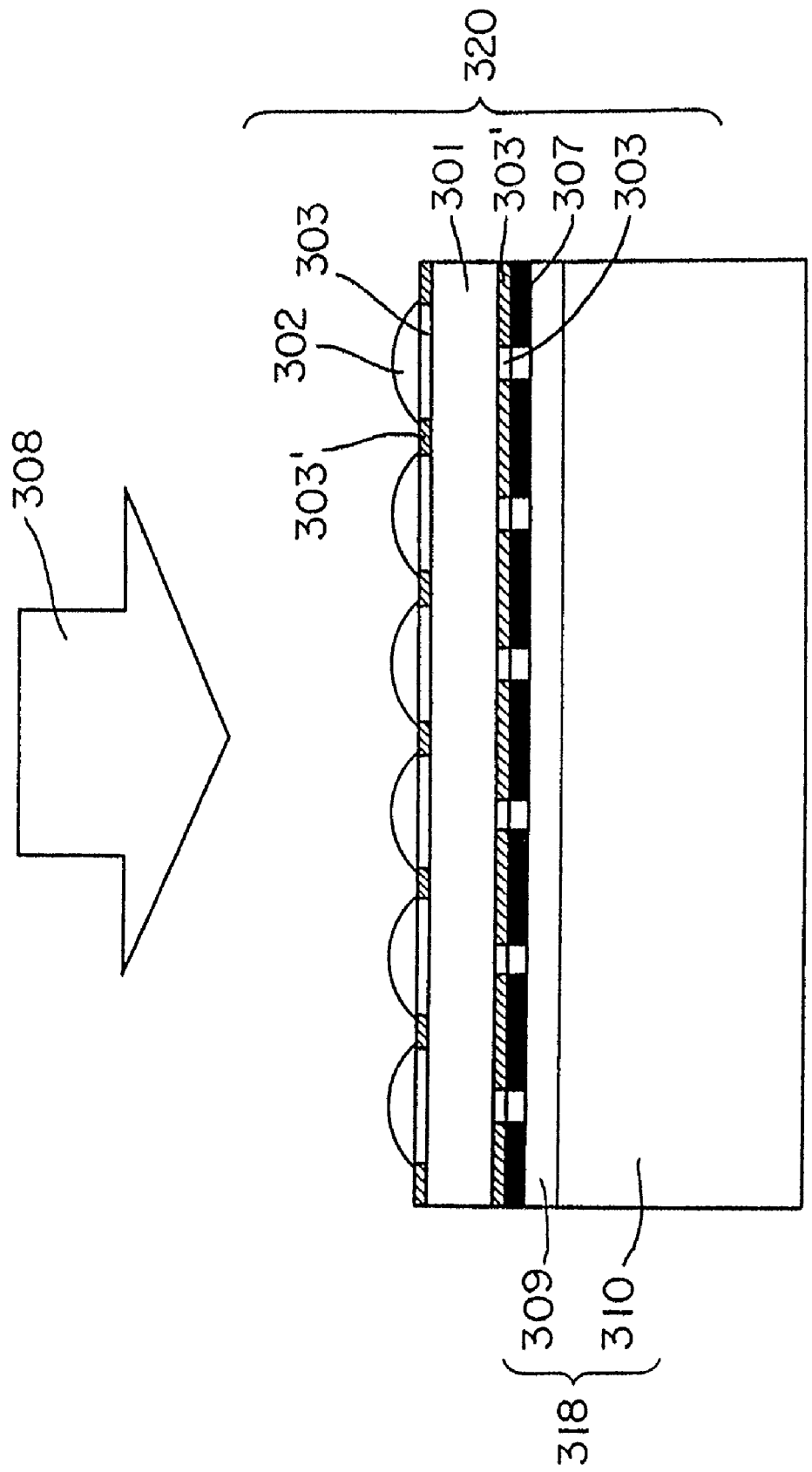
FIG. 28 is a cross-sectional view showing one embodiment of an image pick-up device using a microlens array having a light shielding layer according to a preferred embodiment of the present invention.

FIG. 28 is a cross-sectional view showing one embodiment of an image pick-up device using a microlens array having a light shielding layer. In the image pick-up device, a microlens array 320 having a light shielding layer 307 is provided on an image pick-up element section 318 comprising a color filter 309 and a photoelectric transducer 301. Incident light 308 enters the image pick-up element section 318 through the microlens array.

The color microlens array according to a preferred embodiment of the present invention can have both the function of the color filter as a constituent element of the image pick-up element and the function of the microlens array. This can realize an image pick-up element that has a simple construction not using any color filter and the function of the microlens array. In this case, preferably, a light shielding layer is provided, for example, from the viewpoint of avoiding an adverse effect on properties, such as a lowering in contrast and a lowering in chroma due to stray light. The thickness of the photocatalyst-containing layer is preferably small for enhancement of light transmission, prevention of the photocatalyst-containing layer from developing color due to interference of light, and other purposes. The thickness is preferably not more than 1 µm, more preferably not more than 0.2 µm.

Figure 29:
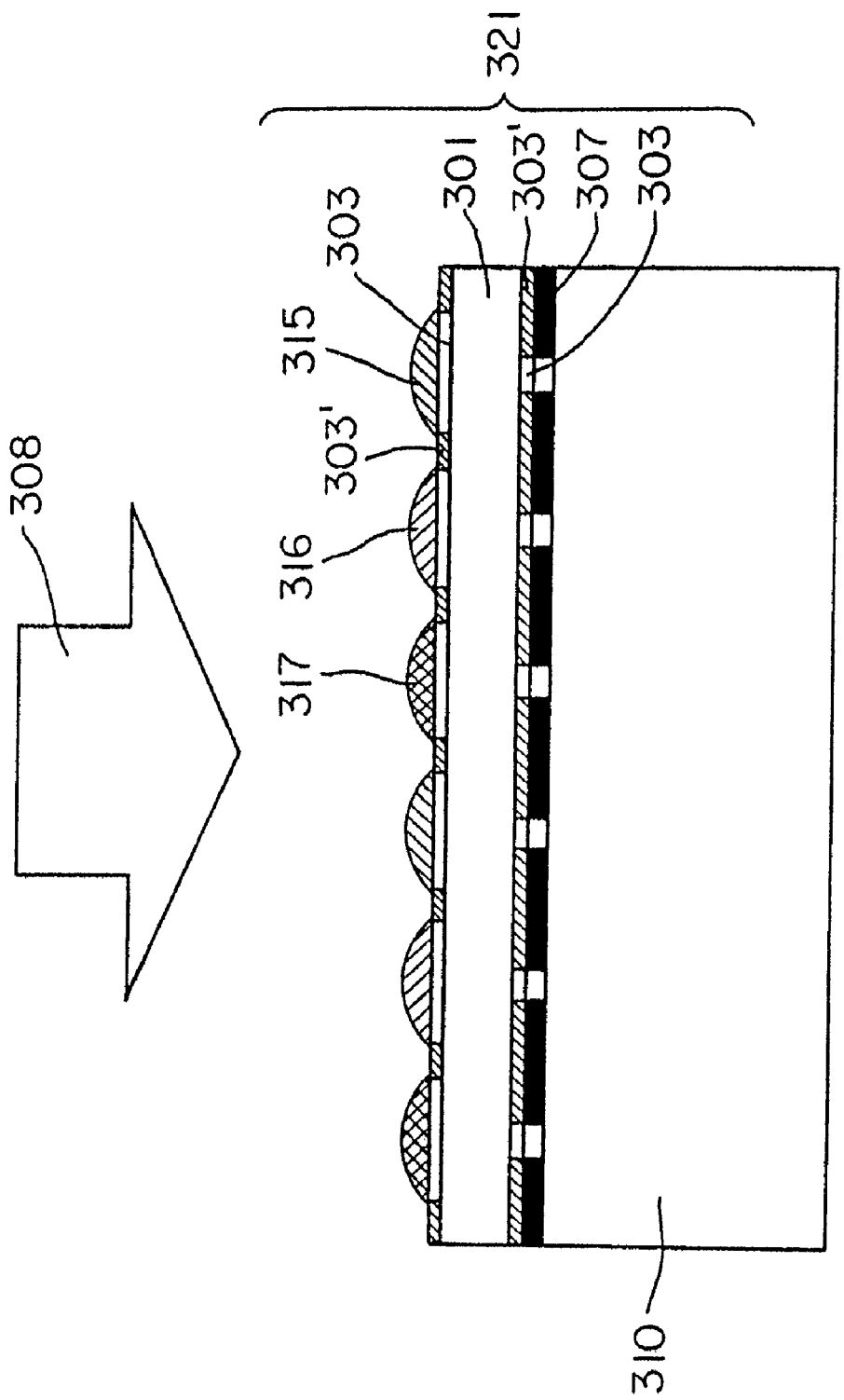
FIG. 29 is a cross-sectional view showing one embodiment of an image pick-up device comprising a color microlens array having a light shielding layer according to a preferred embodiment of the present invention.

FIG. 29 is a cross-sectional view showing one embodiment of an image pick-up device using a microlens array 321 having a light shielding layer 307. In the image pick-up device, a color microlens having a light shielding layer is provided on a photoelectric transducer. Incident light 308 enters the photoelectric transducer 310 through the color microlens array.

Application to Display

The microlens array according to a preferred embodiment of the present invention may be preferably used, for example, as a component adjacent to or in intimate contact with displays, for example, liquid crystal displays, in order to enhance the brightness in the direction of a viewer. In this case, preferably, a light shielding layer is provided in order to inhibit an adverse effect of external light around displays, such as indoor lighting and sunlight, and to improve display quality. Further, the thickness of the photocatalyst-containing layer is preferably small for enhancement of light transmission, prevention of the photocatalyst-containing layer from developing color due to interference of light, and other purposes. The thickness is preferably not more than 1 µm, more preferably not more than 0.2 µm.

Figure 30:
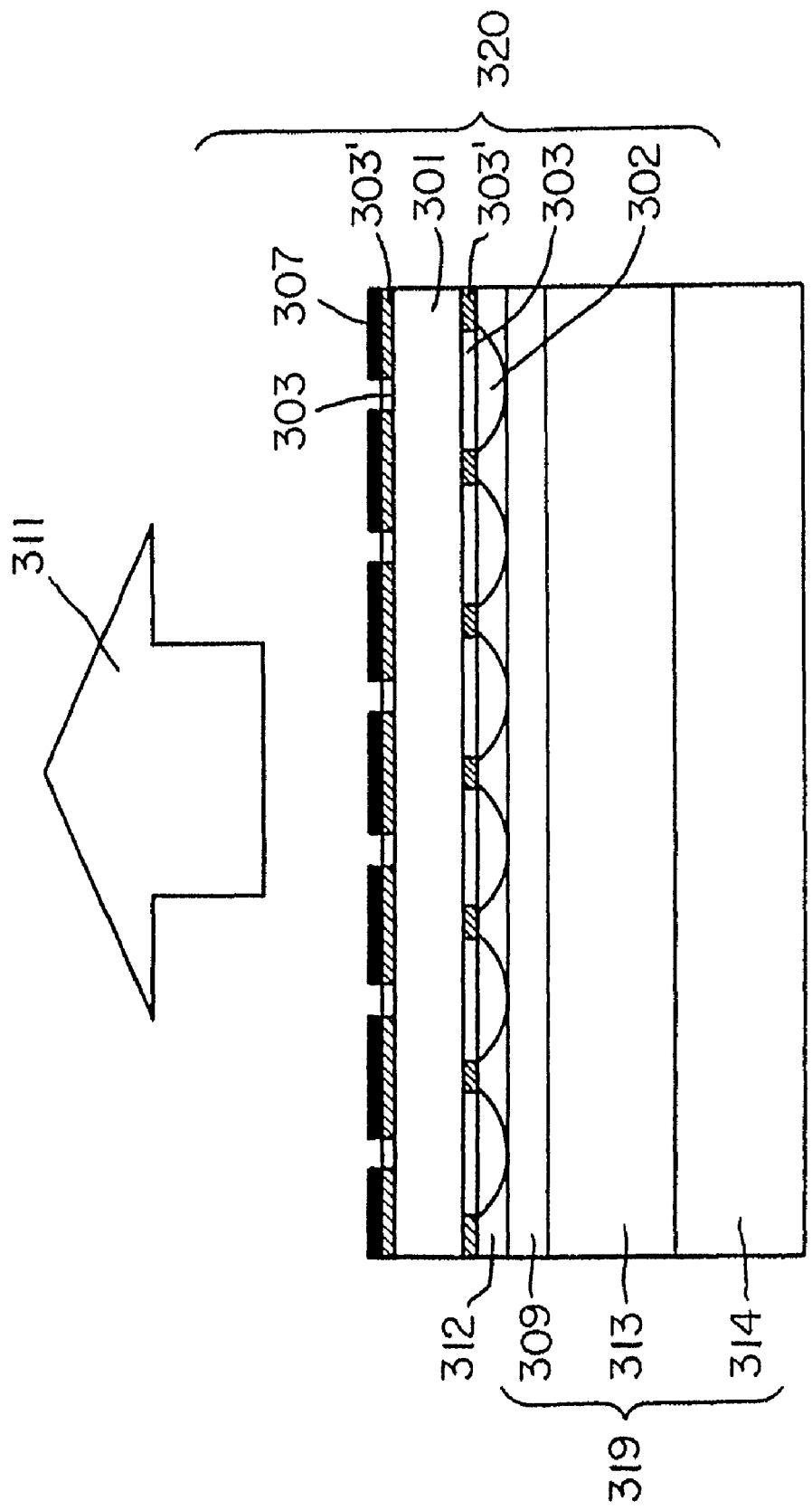
FIG. 30 is a cross-sectional view showing one embodiment of a display using a microlens array having a light shielding layer according to a preferred embodiment of the present invention.

FIG. 30 is a cross-sectional view showing one embodiment of a liquid crystal display using a microlens array 320 having a light shielding layer 307. A microlens provided with a light shielding layer is provided on a liquid crystal display. Light emitted from the liquid crystal display is released into the exterior as luminescence 311 through the microlens array.

The color microlens array according to a preferred embodiment of the present invention can have both the function of a color filter as a constituent element of the display and the function of the microlens array. This can realize a display that has a simple construction not using any color filter and the function of the microlens array.

In this case, preferably, a light shielding layer is provided in order to inhibit an adverse effect of external light around displays, such as indoor lighting and sunlight, and to improve display quality. Further, the thickness of the photocatalyst-containing layer is preferably small for enhancement of light transmission, prevention of the photocatalyst-containing layer from developing color due to interference of light, and other purposes. The thickness is preferably not more than 1 µm, more preferably not more than 0.2 µm.

Figure 31:
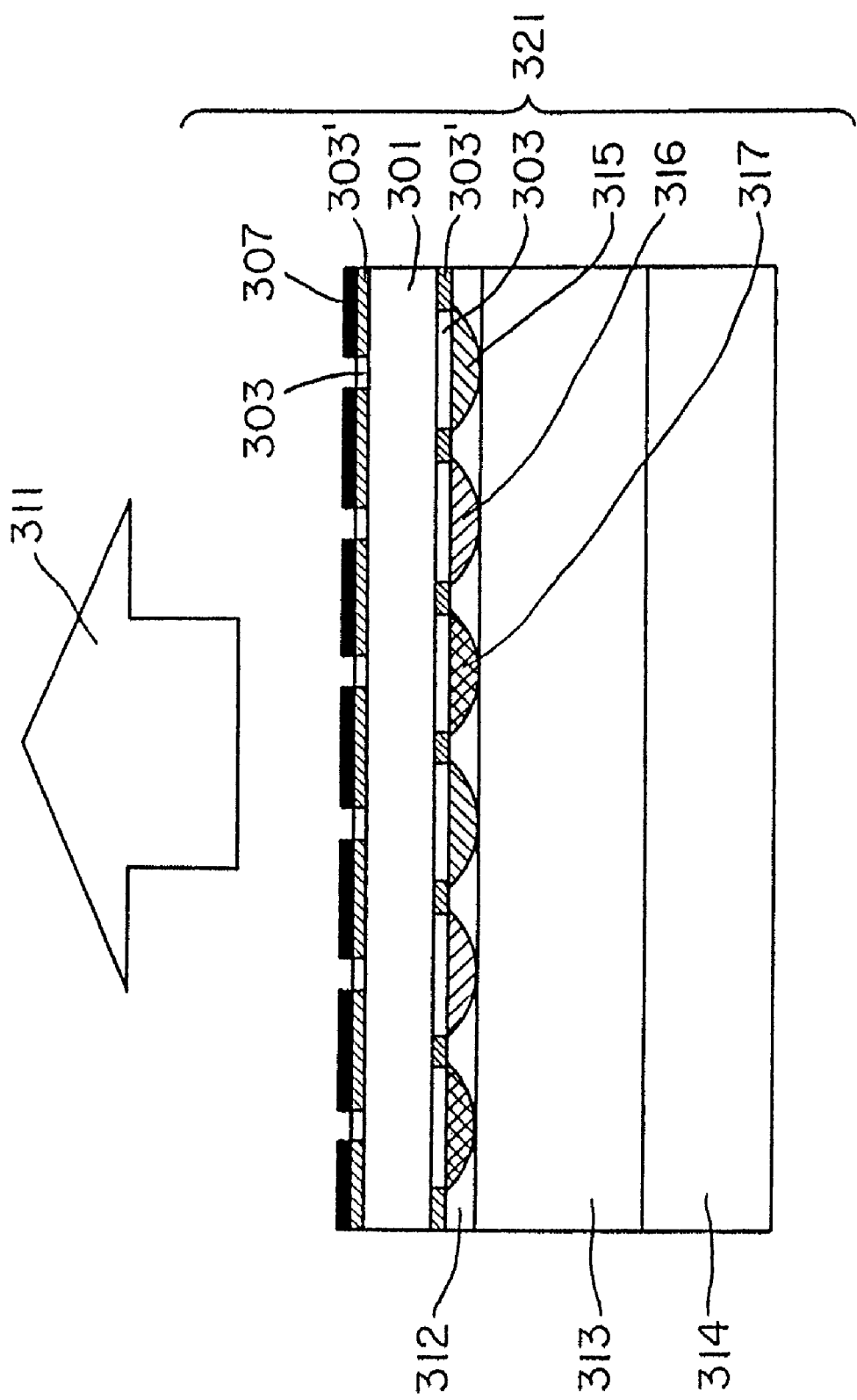
FIG. 31 is a cross-sectional view showing one embodiment of a liquid crystal display using a color microlens array having a light shielding layer according to a preferred embodiment of the present invention.

FIG. 31 is a cross-sectional view showing one embodiment of a liquid crystal display using a color microlens array having a light shielding layer. The liquid crystal display comprises a light source 314, a liquid crystal element 313, and a color microlens array 321 having a light shielding layer 307. Light emitted through the liquid crystal element 313 from the light source 314 is released into the exterior as luminescence 311 through the color microlens array 321.

Re: Fourth Invention D

According to the present invention, patterns, such as designs, images, and letters, are formed on an original plate for lithography having a photocatalyst-containing layer that can cause a chemical change in materials around the photocatalyst upon light irradiation, and the resultant plate is used as a lithographic plate.

The mechanism of action of the photocatalyst typified by titanium oxide according to the present invention has not been fully elucidated. However, it is considered that carriers produced by light irradiation changes the chemical structure of the organic material through a direct reaction with a neighboring compound, or otherwise by active oxygen species produced in the presence of oxygen and water.

Proposals utilizing the photocatalytic action include one wherein oil stains are decomposed by light irradiation to hydrophilify the oil stains, enabling the oil stains to be washed away by water, one wherein a high critical surface tension film is formed on the surface of glass or the like to impart antifogging properties, and one wherein a photocatalyst-containing layer is formed on the surface of tiles or the like to form the so-called antimicrobial tiles or the like that can reduce the number of bacteria floating in air.

According to the present invention, a change in wettability between areas where a pattern is formed and areas where no pattern is formed is created through the action of decomposition of organic materials by the photocatalyst, thereby enhancing the receptivity of the pattern-formed areas to printing ink or the ink repellency to obtain a lithographic plate.

Photocatalysts usable in the lithographic plate according to the present invention include metal oxides known as photosemiconductors, such as titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$). Among them, titanium oxide is particularly preferred because it has high band gap energy and is chemically stable, nontoxic, and easily available.

Titanium oxide may in anatase form or rutile form with anatase form of titanium oxide being preferred.

Preferably, the anatase form of titanium oxide has an average particle diameter of not more than 20 nm. Examples of anatase form of titanium oxide usable herein include hydrochloric acid peptization type titania sols (STS-02, average crystal diameter 7 nm, manufactured by Ishihara Sangyo Kaisha Ltd.) and nitric acid peptization type titania sols (TA-15, average crystal diameter 12 nm, manufactured by Nissan Chemical Industries Ltd.).

The photocatalyst-containing layer according to the present invention may be formed by dispersing a photocatalyst in a binder. The photocatalyst has a fear of decomposing the binder as well upon photoexcitation. Therefore, the binder should be composed mainly of a material having high binding energy. When use as a printing plate is taken into consideration, plate wear and abrasion resistance are also required of the photocatalyst-containing layer. Therefore, the binder is preferably a silicone resin that has a main skeleton having high binding energy, is crosslinked by a sol-gel reaction or the like to develop large strength, and, through photocatalytic action, undergoes a change in wettability. The silicone resin is composed mainly of a hydrolysis condensate or a cohydrolysis condensate of at least one member selected from silicon compounds represented by general formula $Y_nSiX_{4-n}$ wherein n is 1 to 3; Y represents an alkyl, fluoroalkyl, vinyl, amino, or epoxy group; and X represents a halogen or a methoxy, ethoxy, or acetyl group.

Specific examples thereof include methyltrichlorosilane, methyltribromosilane, methyltrimethoxysilane, methyltriethoxysilane, methyltriisopropoxysilane, methyl-tri-t-butoxysilane; ethyltrichlorosilane, ethyltribromosilane, ethyltrimethoxysilane, ethyltriethoxysilane, ethyltriisopropoxysilane, ethyl-tri-t-butoxysilane; n-propyltrichlorosilane, n-propyltribromosilane, n-propyltrimethoxysilane, n-propyltriethoxysilane, n-propyltriisopropoxysilane, n-propyl-tri-t-butoxysilane; n-hexyltrichlorosilane, n-hexyltribromosilane, n-hexyltrimethoxysilane, n-hexyltriethoxysilane, n-hexyltriisopropoxysilane, n-hexyl-tri-t-butoxysilane; n-decyltrichlorosilane, n-decyltribromosilane, n-decyltrimethoxysilane, n-decyltriethoxysilane, n-decyltriisopropoxysilane, n-decyl-tri-t-butoxysilane; n-octadecyltrichlorosilane, n-octadecyltribromosilane, n-octadecyltrimethoxysilane, n-octadecyltriethoxysilane, n-octadecyltriisopropoxysilane, n-octadecyl-tri-t-butoxysilane; phenyltrichlorosilane, phenyltribromosilane, phenyltrimethoxysilane, phenyltriethoxysilane, phenyltriisopropoxysilane, phenyl-tri-t-butoxysilane; tetrachlorosilane, tetrabromosilane, tetramethoxysilane, tetraethoxysilane, tetrabutoxysilane, dimethoxydiethoxysilane; dimethyldichlorosilane, dimethyldibromosilane, dimethyldimethoxysilane, dimethyldiethoxysilane; diphenyldichlorosilane, diphenyldibromosilane, diphenyldimethoxysilane, diphenyldiethoxysilane; phenylmethyldichlorosilane, phenylmethyldibromosilane, phenylmethyldimethoxysilane, phenylmethyldiethoxysilane; trichlorohydrosilane, tribromohydrosilane, trimethoxyhydrosilane, triethoxyhydrosilane, triisopropoxyhydrosilane, tri-t-butoxyhydrosilane; vinyltrichlorosilane, vinyltribromosilane, vinyltrimethoxysilane, vinyltriethoxysilane, vinyltriisopropoxysilane, vinyl-tri-t-butoxysilane; trifluoropropyltrichlorosilane, trifluoropropyltribromosilane, trifluoropropyltrimethoxysilane, trifluoropropyltriethoxysilane, trifluoropropyltriisopropoxysilane, trifluoropropyl-tri-t-butoxysilane; γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyl-tri-t-butoxysilane; γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyl-tri-t-butoxysilane; γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyl-tri-t-butoxysilane; γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyl-tri-t-butoxysilane; β-(3,4-epoxycyclohexyl)ethyltrimethoxysilane, β-(3,4-epoxycyclohexyl)ethyltriethoxysilane; and partial hydrolyzates thereof; and mixtures thereof.

The photocatalyst-containing layer in the original plate for lithography according to the present invention may contain a fluoroalkyl chain, specifically at least one member selected from hydrolysis condensates and cohydrolysis condensates of the following fluoroalkylsilanes. Further, compounds having fluoroalkyl groups include the following compounds. Compounds generally known as fluorosilane coupling agents may also be used.

$CF_3(CF_2)_3CH_2CH_2Si(OCH_3)_3$,
$CF_3(CF_2)_5CH_2CH_2Si(OCH_3)_3$,
$CF_3(CF_2)_7CH_2CH_2Si(OCH_3)_3$,
$CF_3(CF_2)_9CH_2CH_2Si(OCH_3)_3$,
$(CF_3)_2CF(CF_2)_4CH_2CH_2Si(OCH_3)_3$,
$(CF_3)_2CF(CF_2)_6CH_2CH_2Si(OCH_3)_3$,
$(CF_3)_2CF(CF_2)_8CH_2CH_2Si(OCH_3)_3$,
$CF_3(C_6H_4)C_2H_4Si(OCH_3)_3$,
$CF_3(CF_2)_3(C_6H_4)C_2H_1Si(OCH_3)_3$,
$CF_3(CF_2)_5(C_6H_4)C_2H_4Si(OCH_3)_3$,
$CF_3(CF_2)_7(C_6H_4)C_2H_4Si(OCH_3)_3$,
$CF_3(CF_2)_3CH_2CH_2SiCH_3(OCH_3)_2$,
$CF_3(CF_2)_5CH_2CH_2SiCH_3(OCH_3)_2$,
$CF_3(CF_2)_7CH_2CH_2SiCH_3(OCH_3)_2$,
$CF_3(CF_2)_9CH_2CH_2SiCH_3(OCH_3)_2$,
$(CF_3)_2CF(CF_2)_4CH_2CH_2SiCH_3(OCH_3)_2$,
$(CF_3)_2CF(CF_2)_6CH_2CH_2SiCH_3(OCH_3)_2$,
$(CF_3)_2CF(CF_2)_8CH_2CH_2SiCH_3(OCH_3)_2$,
$CF_3(C_6H_4)C_2H_4SiCH_3(OCH_3)_2$,
$CF_3(CF_2)_3(C_6H_4)C_2H_4SiCH_3(OCH_3)_2$,
$CF_3(CF_2)_5(C_6H_4)C_2H_4SiCH_3(OCH_3)_2$,
$CF_3(CF_2)_7(C_6H_4)C_2H_4SiCH_3(OCH_3)_2$,
$CF_3(CF_2)_3CH_2CH_2Si(OCH_2CH_3)_3$,
$CF_3(CF_2)_5CH_2CH_2Si(OCH_2CH_3)_3$,
$CF_3(CF_2)_7CH_2CH_2Si(OCH_2CH_3)_3$,
$CF_3(CF_2)_9CH_2CH_2Si(OCH_2CH_3)_3$,

Further, titanium, aluminum, zirconium, and chromium coupling agents may also be used.

Use of these coupling agents can enhance crosslinking and increase the strength.

Use of these fluoroalkylsilanes can markedly improve the oil repellency and can develop the function of inhibiting the deposition of the resin composition.

The content of the photocatalyst in the layer containing the photocatalyst and the organosiloxane is preferably 5 to 50% by weight, more preferably 20 to 40% by weight. The photocatalyst and the binder are dispersed in a solvent to prepare a coating liquid following by coating. Solvents usable herein include alcoholic organic solvents, such as ethanol and isopropanol.

Preferably, the photocatalyst has a small particle diameter because the photocatalytic reaction takes place efficiently. The average particle diameter is preferably not more than 50 nm, more preferably not more than 20 nm.

The excitation wavelength of the anatase form of titania is not more than 380 nm. Therefore, the excitation of this type of catalysts should be carried out using ultraviolet light. Ultraviolet light sources usable herein include mercury lamps, metal halide lamps, xenon lamps, excimer lamps, excimer layer, YAG laser, and other ultraviolet light sources. The wettability of the film surface may be varied by varying the ultraviolet light intensity, exposure and the like.

When the exposure is carried out using a fine beam of a laser or the like, a desired image pattern may be directly formed without use of any mask. In the case of other light sources, a pattern is formed by light irradiation using a mask with a desired pattern formed thereon. Pattern forming masks usable herein include masks wherein a pattern is formed on a metal sheet, such as vapor deposition masks, photomasks wherein a pattern is formed using a metallic chromium on a glass sheet, and, for printing applications, plate preparation films.

When a mask is used, the resolution can be enhanced by conducting the exposure in intimate contact of the mask with the photocatalyst-containing layer. In this case, however, the sensitivity is remarkably lowered. Preferably, the exposure is carried out while leaving a spacing of about 100 μm between the mask and the photocatalyst-containing layer.

The photocatalyst-containing layer may be rendered sensitive to visible light and the like by ion doping, by addition of fluorescent materials, or addition of photosensitive dyes. Examples of photosensitive dyes which may be added to the structure for pattern formation include cyanine dyes, carbocyanine dyes, dicarbocyanine dyes, hemicyanine dyes, and other cyanine dyes. Other useful dyes include diphenylmethane dyes, for example, triphenylmethane dyes, such as Crystal Violet and basic fuchsine, xanthene dyes, such as Rhodamine B, Victoria Blue, Brilliant Green, Malachite Green, Methylene Blue, pyrylium salts, benzopyrylium salts, trimethinebenzopyrylium salts, and triallylcarbonium salts.

The photocatalyst-containing coating liquid may be coated onto the substrate by spray coating, dip coating, roll coating, bead coating or the like. When an ultraviolet curable component is contained as the binder, curing by ultraviolet irradiation results in the formation of a photocatalyst-containing composition layer on the substrate. Substrates usable in the lithographic plate according to the present invention include glasses, metals, plastics, woven fabrics, and nonwoven fabrics.

The present invention will be described with reference to the accompanying drawings. FIGS. 32 and 33 are diagrams showing one embodiment of the process for producing a printing plate according to the present invention.

Figure 32A:
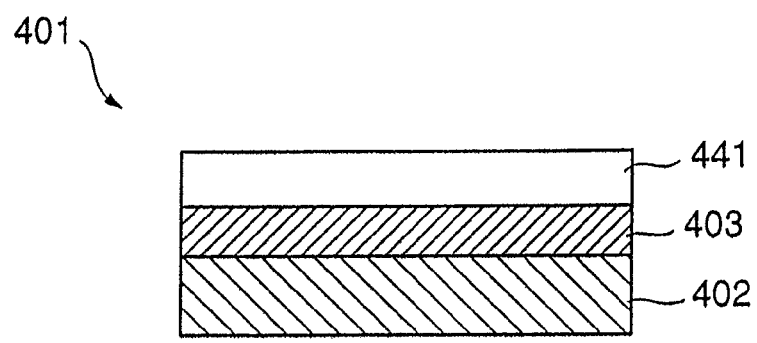
FIG. 32 is a diagram illustrating a process for producing a press plate of the printing plate according to the present invention.
Figure 32B:
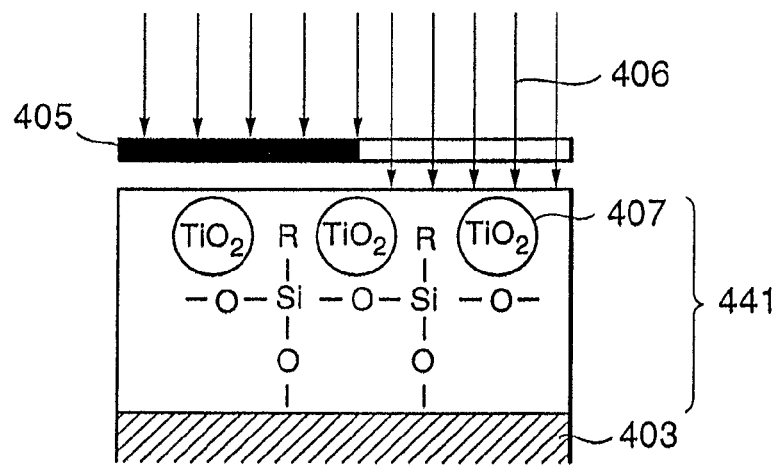
Figure 32C:
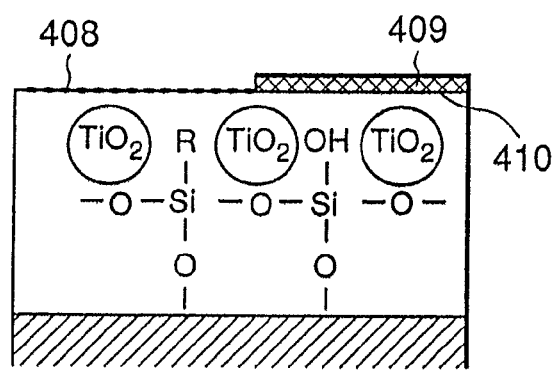

As shown in FIG. 32(A), an original plate 401 for a printing plate may be produced by forming a photocatalyst-containing composition layer 441 directly or through a primer layer 403 on a substrate 402. As shown in FIG. 32(B), in order to record pattern information, exposure 406 is carried out in a predetermined pattern 405. As shown in FIG. 32(C), alkyl chains of the silicone compound are converted to OH groups through the action of a photocatalyst 407 to change the wettability of the surface according to the exposed pattern. Unexposed areas are in the state of low surface free energy 408, while exposed areas undergo a change in wettability. Therefore, coating of a resin layer composition 409 permits a layer of the resin layer composition 409 to be selectively formed on the wettability-varied areas 410.

Figure 33A:
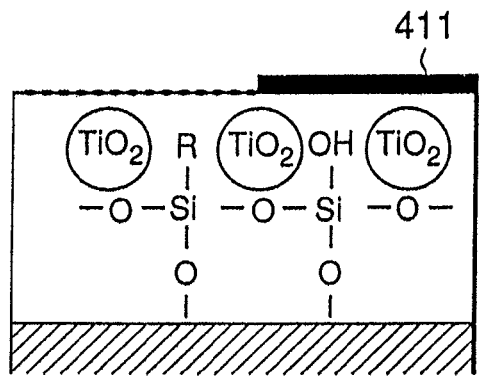
FIG. 33 is a diagram illustrating a process for producing a press plate of the printing plate according to the present invention.
Figure 33B:
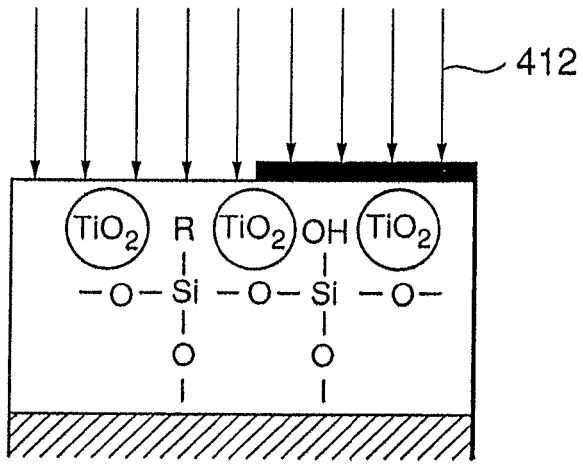

Next, as shown in FIG. 33(A), heat or ultraviolet light is applied to cure the resin layer composition 409, thereby forming a resin layer 411 that can withstand printing and the like. Further, as shown in FIG. 33(B), after the formation of the resin layer, the whole area exposure 412 is carried out without a mask and the like.

Figure 33C:
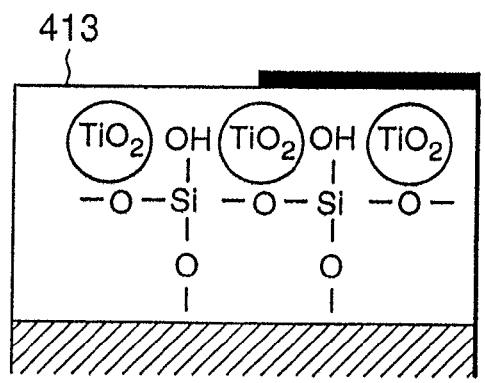

As shown in FIG. 33(C), upon exposure, the action of the photocatalyst 407 in areas not provided with the cured layer permits the alkyl chain of the silicone compound to be converted to OH group and the low surface free energy areas 408 to be brought to high surface free energy areas 413.

The lithographic plate thus obtained may be used in any of waterless plating and plating using dampening water.

FIG. 34 is a diagram illustrating use of a lithographic plate in printing.

Figure 34A:
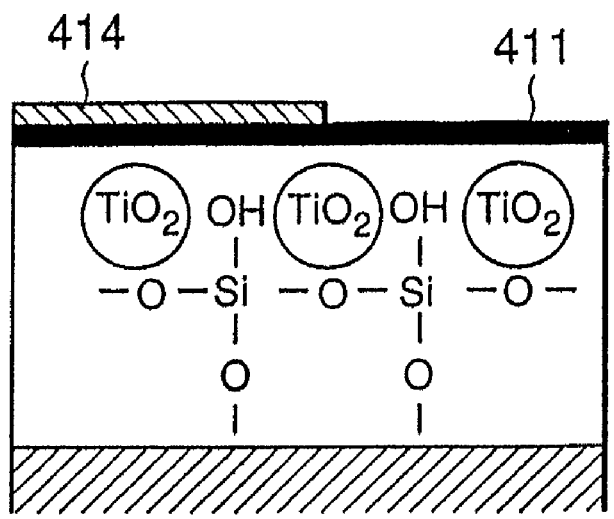
FIG. 34 is a diagram illustrating a printing process using the lithographic plate according to the present invention.
Figure 34B:
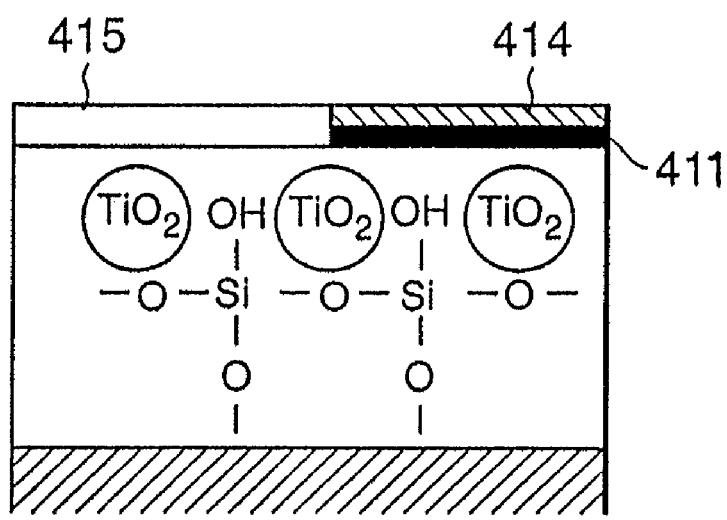

FIG. 34(A) shows an embodiment wherein the lithographic plate is used as a waterless plate in printing, and FIG. 34(B) shows an embodiment wherein the lithographic plate is used as a printing plate using dampening water.

When the resin layer 411 having low surface free energy is ink repellent, as shown in FIG. 34(A), the resin layer 411, due to the ink repellency, repels ink 414 and cannot receive the ink. The ink is deposited only onto areas not provided with the resin layer, and printing is performed by transfer of the deposited ink onto a printing medium.

On the other hand, when the resin layer 411 is receptive to ink, dampening water 415 is deposited onto areas other than the resin layer 411. Since the resin layer 411 can receive ink, printing can be carried out by transfer of ink onto a printing medium.

Further, incorporation of a photochromic material, which undergoes a change in color upon light irradiation, such as spiropyran, an organic dye decomposable through photocatalytic action or the like into the composition can form a visualized pattern.

An embodiment will be described wherein the original plate for a printing plate is a waterless plate.

The ink repellent layer used in the present invention may be formed of a silicone rubber or a fluorocompound, such as a rubber having in its molecule fluorine with the silicone rubber being preferred. The silicone rubber layer is obtained by sparsely crosslinking a linear organopolysiloxane, preferably dimethylpolysiloxane. A typical silicone rubber layer is formed of a silicone rubber comprising repeating units represented by the following formula D-1:

Formula D-1 wherein n is an integer of two or more; and $R^1$ and $R^2$ each independently represent a substituted or unsubstituted alkyl, alkenyl, aryl, or cyanoalkyl group having 1 to 10 carbon atoms. Not more than 40% of the whole $R^1$ and $R^2$ is accounted for by vinyl, phenyl, vinyl halide or phenyl halide. Not less than 60% of $R^1$ and $R^2$ is preferably accounted for by a methyl group. Further, the chain end or the side chain has in its molecular chain at least one hydroxyl group.

When the silicone rubber later applied to the printing plate according to the present invention may be a condensation tripe crosslinkable silicone rubber (an RTV or LTV silicone rubber). A silicone rubber with a part of $R^1$ and $R^2$ of the organopolysiloxane chain being substituted by a hydrogen atom may also be used as the silicone rubber. Further, silicone rubbers may also be used wherein ends represented by formulae D-2, D-3, and D-4 are crosslinked. In some cases, an excessive amount of a crosslinking agent is allowed to exist.

Formula D-2

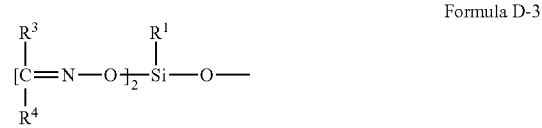

Formula D-3

Formula D-4 wherein $R^1$ and $R^2$ are as defined in formula D-1; and $R^3$ and $R^4$ represent a monovalent lower alkyl. A catalyst, such as a carboxylate of a metal, such as tin, zinc, lead, calcium, or manganese, for example, dibutyltin laurate, tin(II) octate, or a napthtenate of the above metal, or chloroplatinic acid, is added to the silicone rubber which is subjected to condensation tape crosslinking.

Regarding the formulation of the components used in the condensation type silicone rubber, for example, to 100 parts by weight of the compound comprising repeating units represented by formula D-1 are added 0.1 to 100 parts by weight of the compound having a structure represented by formula D-3 or D-4 and optionally 0 to 50 parts by weight of a conventional catalyst.

Further, a silicone rubber layer wherein crosslinking has been carried out by an addition reaction of formula D-5 with formula D-6. The silicone rubber is produced by reacting a polyvalent hydrodieneorganopolysiloxane with a polysiloxane having in its molecule two or more bonds of formula D-6, preferably by crosslinking curing of a composition comprising the following components:

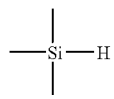
Formula D-5

Formula D-6

Specifically, (1) Organopolysiloxane having at least two alkenyl groups (preferably vinyl group), per molecule, directly bonded to silicon atom 100 parts by weight (2) Organohydrogenpolysiloxane having at least two groups of formula 5 per molecule 0.1 to 1000 parts by weight (3) Addition catalyst 0.00001 to 10 parts by weight The alkenyl group in the component (1) may be located at the end or at an intermediate position of the molecular chain. Organic groups other than the alkenyl group are substituted or unsubstituted alkyl group and aryl group. The component (1) may have a very small amount of hydroxyl group.

Hydrogen in the component (2) may be located at the end or at an intermediate position of the molecular chain. Organic groups other than hydrogen are selected from the same group as described in connection with the component (1). Regarding the organic group in the components (1) and (2), not less than 60% of the total number of groups is preferably accounted for by a methyl group from the viewpoint of ink repellency.

For the components (1) and (2), the molecular structure may be of straight chain, cyclic, or branched chain. Preferably, the molecular weight of any one of the components (1) and (2) exceeds 1000 from the viewpoint of properties of rubber. Further, preferably, the molecular weight of the component (2) exceeds 1000.

Examples of the component (1) include α,ω-divinylpolydimethylsiloxane and a methylvinyl siloxane/dimethylsiloxane copolymer with both ends thereof being a methyl group.

Examples of the component (2) includes polydimethylsiloxane with both ends thereof being a hydrogen atom, α,ω-dimethylpolymethylhydrodienesiloxane, a methylhydrodienesiloxane/dimethylsiloxane copolymer with both ends thereof being a methyl group, and a cyclic polymethylhydrodienesiloxane.

The addition catalyst in the component (3) may be properly selected from conventional catalysts. Platinum compounds are particularly preferred. Examples thereof include platinum, platinum chloride, chloroplatinic acid, and olefin coordinated platinum.

Vinyl-containing organopolysiloxanes, such as tetracyclo(methylvinyl)siloxane, carbon-carbon triple bond-containing alcohols, acetone, methyl ethyl ketone, methanol, ethanol, propylene glycol monomethyl ether and other crosslinking inhibitors may be added from the viewpoint of regulating the curing rate of the composition. In these compositions, upon mixing of the three components, an addition reaction occurs to initiate curing. The curing rate rapidly increases with increasing the reaction temperature. For this reason, in order to elongate the pot life for the composition to be converted to rubber and, at the same time, to shorten the curing time on the photocatalyst-containing layer, curing conditions are preferably such that, until the composition is completely cured, the composition is held at such high temperature conditions that the properties of the substrate and the photocatalyst-containing layer remains unchanged. This is preferred from the viewpoint of stable adhesion to the photocatalyst-containing layer.

In addition to the above components, conventional adhesion imparting agents, such as alkenyltrialkoxysilanes, hydroxyl-containing organopolysiloxanes as the composition of the condensation type silicone rubber layer, and silane (or siloxane) containing hydrolyzable function groups may be added to these compositions. Further, conventional fillers, such as silica, may also be added from the viewpoint of improving the strength of the rubber.

Further, instead of the silicone rubber, a fluororesin may be used as the ink repellent layer. Fluororesins usable herein are as follows.

(1) Copolymer resin of perfluoroalkyl methacrylate and acrylic monomer having hydroxy group, e.g., 2-hydroxyethyl methacrylate (2) Copolymer resin of perfluoroalkyl methacrylate and glycidyl methacrylate (3) Copolymer resin of perfluoroalkyl methacrylate and methacrylic acid (4) Copolymer resin of perfluoroalkyl methacrylate and maleic anhydride When the fluororesin has both an active hydrogen functional group and a functional group reactive with active hydrogen, or when a mixture of a fluororesin having an active hydrogen functional group with a fluororesin having a functional group reactive with active hydrogen is used, a crosslinking agent may be used.

Regarding the proportions of the components in the fluororesin layer, preferably 60 to 100% by weight, more preferably 80 to 98% by weight, of the whole layer is accounted for by fluororesin.

Next, the plate used with dampening water will be described.

In the plate used with dampening water, materials for the resin layer in which ink receptive areas are formed include, for example, acrylic resins using methacrylic acid, methacrylic esters or the like, vinyl acetate resin, copolymer of vinyl acetate with ethylene or vinyl chloride or the like, vinyl chloride resin, vinylidene chloride resin, vinyl acetal resin, such as polyvinylbutyral, polystyrene, copolymers including styrene/butadiene copolymer and styrene/methacrylic ester copolymer, polyethylene, polypropylene and chlorination products thereof, polyester resins (for example, polyethylene terephthalate, polyethylene isophthalate, and polycarbonate of bisphenol A), polyamide resins (for example, polycapramide, polyhexamethylene adipamide, and polyhexamethylene sebacamide), phenolic resin, xylene resin, alkyd resin, vinyl-modified alkyd resin, gelatin, cellulose ester derivatives, such as carboxymethylcellulose, waxes, polyolefins, and waxes. The resin composition is coated, and the coating is cured by heat or light. Thus, patterned areas having good ink receptivity and plate wear are formed.

Coating methods usable herein include roll coating, air knife coating, bar coating, and spin coating.

Further, according to the present invention, coating to form a thick film can prevent light to reach the underlying layer. This can prevent the photocatalytic reaction.

EXAMPLES

The following examples further illustrate the present invention.

Example A-1

30 g of Glasca HPC7002 (Japan Synthetic Rubber Co., Ltd.) and 10 g of Glasca HPC402H (Japan Synthetic Rubber Co., Ltd.), an alkylalkoxysilane, were mixed together. The mixture was stirred for 5 min in a stirring apparatus. The resultant solution was spin coated on a glass substrate having an area of 7.5 cm$^2$. The coated substrate was dried at a temperature of 150° C. for 10 min. Thus, a 2 μm-thick sodium ion block layer was formed.

Next, 15 g of Glasca HPC7002 (Japan Synthetic Rubber Co., Ltd.), 5 g of Glasca HPC402H Japan Synthetic Rubber Co., Ltd.), and a titania sol (TA-15, manufactured by Nissan Chemical Industries Ltd.) were mixed together. The resultant solution was spin coated onto the substrate with a sodium ion block layer formed thereon. The assembly was dried at a temperature of 150° C. for 10 min, permitting hydrolysis and polycondensation to proceed. Thus, a structure for pattern formation comprising a 3 μm-thick photocatalyst-containing layer with a photocatalyst being strongly fixed through an organopolysiloxane was prepared.

Figure 5:
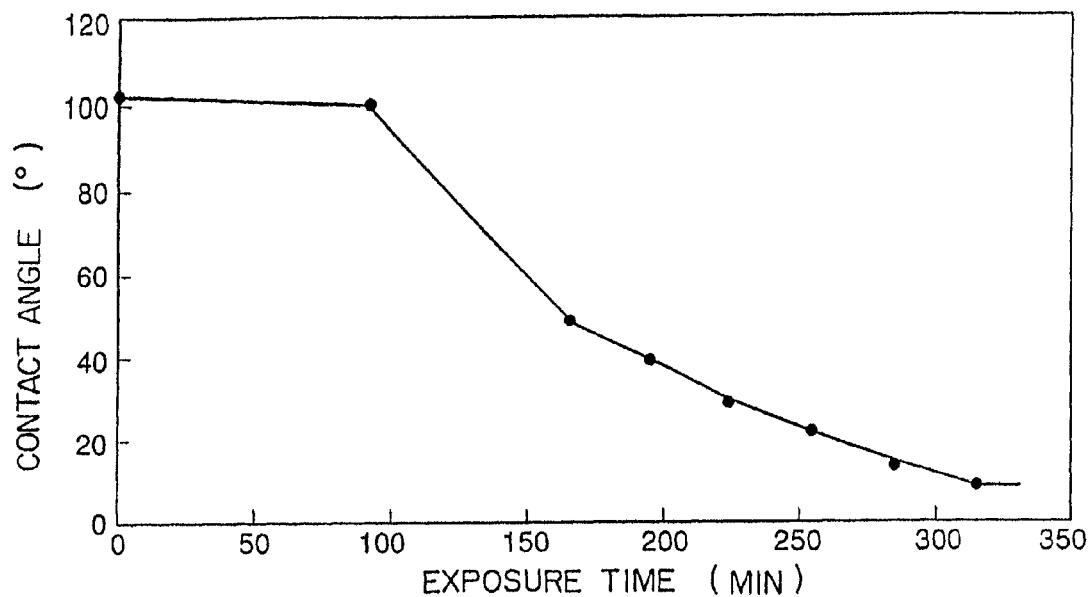
FIG. 5 is a diagram showing the relationship between light irradiation time and wettability of structures for pattern formation according to the present invention.

The structure for pattern formation was irradiated with ultraviolet light at an intensity of 6.6 mW/cm$^2$ using a xenon lamp. In this case, a change in contact angle between the structure and water with the elapse of time was measured with a contact angle goniometer (Model CA-Z, manufactured by Kyowa Interface Science Co., Ltd.). The results are shovel in FIG. 5. As is apparent from the drawing, the contact angle gradually decreased and reached not more than 10°.

Separately, the structure for pattern formation was irradiated with ultraviolet light through a lattice-like mask. Exposure to ultraviolet light at an intensity of 6.6 mW/cm$^2$ for 6 hr using a xenon lamp resulted in the formation of a pattern wherein the wettability of exposed areas and the wettability of unexposed areas were different from each other and were 9° and 102°, respectively.

Example A-2

A 20 wt % dimethylformamide solution of a composition for a primer layer (Kan-coat 90T-25-3094, manufactured by Kansai Paint Co., Ltd.) was coated on a 0.15 mm-thick degreased aluminum sheet. The coated aluminum sheet was dried at 200° C. for 1 min. Thus, a 3 μm-thick primer layer was formed. A photocatalyst-containing layer as described in Example A-1 was formed on the primer layer to prepare an original plate for a waterless printing plate.

Subsequently, a pattern was formed under conditions of Nd:YAG laser (355 nm A-Physic Star Line) and recording energy 300 mJ/cm$^2$. The printing plate thus obtained was mounted on an offset printing machine (Alpha New Ace, manufactured by Alpha Giken K.K.), and printing was carried out on a coated paper using an ink for waterless printing (Inctec Waterless S Deep Blue, manufactured by The Inctec Inc.) at a printing speed of 5000 sheets/hr. As a result, 20,000 sheets of good prints could be obtained.

Printing was carried out in the same manner as described above, except that exposure was carried out using, instead of the laser, a xenon lamp through a gradation negative film having halftone dots of 2 to 98% with 175 lines/in. As a result, good prints could be obtained.

Example A-3

3 g of Glasca HPC7002 (Japan Synthetic Rubber Co., Ltd.), a silica sol, and 1 g of HPC402H (Japan Synthetic Rubber Co., Ltd.), an alkylalkoxysilane, were mixed together. The mixture was stirred for 5 min. The resultant solution was spin coated on a glass substrate having an area of 7.5 cm$^2$. Thus, a 2 μm-thick sodium ion block layer was formed.

Next, 3 g of isopropyl alcohol. 0.75 g of a silica sol (Glasca HPC7002, manufactured by Japan Synthetic Rubber Co., Ltd.), 0.25 g of an alkylalkoxysilane (Glasca HPC402H, manufactured by Japan Synthetic Rubber Co., Ltd.), and 0.15 g of a fluoroalkylsilane (MF-160E manufactured by Tohchem Products Corporation: a 50 wt % isopropyl ether solution of N-[3-(trimethoxysilyl)propyl]-N-ethylperfluorooctane-sulfonamide) were mixed together. The resultant dispersion was stirred for 20 min while maintaining the temperature at 100° C. Thereafter, 2 g of titanium oxide (titanium oxide coating liquid ST-K01, solid content 10% by weight, manufactured by Ishihara Sangyo Kaisha Ltd.) was added thereto, followed by stirring for additional 30 min.

The resultant dispersion was spin coated on the substrate with a sodium block layer formed thereon. The assembly was dried at a temperature of 150° C. for 10 min, permitting hydrolysis and polycondensation to proceed. Thus, a 3 μm-thick photocatalyst-containing layer with a photocatalyst being strongly fixed through an organopolysiloxane was formed. The average roughness of the surface of the photocatalyst-containing layer was measured by the tracer method and found to be Ra=2 nm.

Further, the photocatalyst-containing layer was irradiated with ultraviolet light at an intensity of 70 mW/cm$^2$ for 2 min using a high pressure mercury lamp through a lattice-like mask. In this case, the contact angle of the photocatalyst-containing layer with water and n-octane was measured with a contact angle goniometer (Model CA-Z, manufactured by Kyowa Interface Science Co., Ltd.). The results are shown in Table A-4.

Example A-4

A sodium ion block layer was prepared in the same manner as in Example A-3. Next, 3 g of isopropyl alcohol, 0.4 g of an organosilane (TSL8113, manufactured by Toshiba Silicone Co., Ltd.), 0.15 g of a fluoroalkylsilane (MF-160E, manufactured by Tohchem Products Corporation: a 50 wt % isopropyl ether solution of N-[3-(trimethoxysilyl)propyl]-N-ethylperfluorooctanesulfonamide), and 2 g of titanium oxide (titanium oxide coating liquid ST-K01, solid content 10% by weight, manufactured by Ishihara Sangyo Kaisha Ltd.) were mixed together. The resultant dispersion was stirred for 20 min while maintaining the temperature at 100° C. The resultant dispersion was spin coated on the substrate with a sodium block layer formed thereon. The assembly was dried at a temperature of 150° C. for 10 min, permitting hydrolysis and polycondensation to proceed. Thus, a 3 μm-thick photocatalyst-containing layer with a photocatalyst being strongly fixed in an organopolysiloxane was formed. The average roughness of the surface of the photocatalyst-containing layer was measured by the tracer method and found to be Ra=2 nm. Further, the photocatalyst-containing layer was irradiated with ultraviolet light at an intensity of 70 mW/cm$^2$ for 2 min using a high pressure mercury lamp through a lattice-like mask. In this case, the contact angle of the photocatalyst-containing layer with water and n-octane was measured with a contact angle goniometer (Model CA-Z, manufactured by Kyowa Interface Science Co., Ltd.). The results are shown in Table A-4.

Example A-5

A 0.3 μm-thick photocatalyst-containing layer was spin coated onto a polycarbonate substrate in the same manner as in Example A-4. The photocatalyst-containing layer was irradiated with ultraviolet light at an intensity of 70 mW/cm$^2$ for 2 min using a high pressure mercury lamp through a chart mask with a resolution of 50 lp/mm.

Various liquids having known surface tension were dropped on the photocatalyst-containing layer to measure the contact angle between the photocatalyst-containing layer and the liquids with a contact angle goniometer (Model CA-Z, manufactured by Kyowa Interface Science Co., Ltd.), and the critical surface tension was determined by Zisman plotting. As a result, the critical surface tension was 14.6 mN/m for unexposed areas and was 72.3 mN/m for exposed areas.

Figure 6:
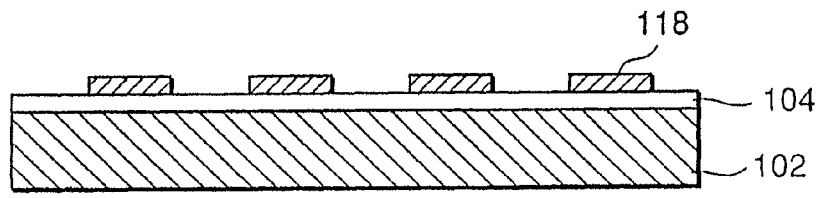
FIG. 6 is a diagram showing a further embodiment of the present invention.

Next, an ink for waterless lithography (Inctec Waterless S Deep Blue, manufactured by The Inctec Inc.) was coated on the whole area of the exposed photocatalyst-containing layer by means of an RI tester (Model RI-2 tester, manufactured by Ishikawajima Industrial Machinery Co., Ltd.). As shown in FIG. 6, in the unexposed areas, the oil repellent nature repelled the ink, and the ink was selectively coated only in the exposed areas. Thus, a deep blue stripe pattern 118 of 50 lp/mm was obtained on a transparent polycarbonate substrate 102 through a photocatalyst layer 104.

Example A-6

3 g of Glasca HPC7002 (Japan Synthetic Rubber Co., Ltd.), a silica sol, and 1 g of HPC402H (Japan Synthetic Rubber Co., Ltd.), an alkylalkoxysilane, were mixed together. The mixture was stirred for 5 min. The resultant solution was spin coated on a 0.15 mm-thick degreased aluminum sheet to form a 2 μm-thick primer layer.

Next, photocatalyst-containing layers as described in Examples A-3 and A-4 were formed on the primer layer to obtain original plates for waterless printing plates.

Subsequently, a pattern was formed under conditions of Nd:YAG laser (355 nm λ-Physic Star Line) and recording energy 200 mJ/cm$^2$. The printing plates thus obtained were mounted on an offset printing machine (Alpha New Ace, manufactured by Alpha Giken K.K.), and printing was carried out on a coated paper using an ink for waterless printing (Inctec Waterless S Deep Blue, manufactured by The Inctec Inc.) at a printing speed of 5000 sheets/hr. As a result, 20,000 sheets of good prints could be obtained.

Further, printing properties were evaluated in the same manner as described above, except that exposure was carried out using, instead of the laser, a high pressure mercury lamp at an intensity of 70 mW/cm$^2$ for 2 min through a gradation negative pattern having halftone dots of 2 to 98% with 175 lines/in. As a result, good prints could be obtained.

Example A-7

A sodium ion block layer was prepared in the same manner as in Example A-3. Next, 3 g of isopropyl alcohol, 2.2 g of an organosilane (TSL8113, manufactured by Toshiba Silicone Co., Ltd.), 0.15 g of a fluoroalkylsilane (MF-160E, manufactured by Tohchem Products Corporation: a 50% isopropyl ether solution of N-[3-(trimethoxysilyl)propyl]-N-ethylperfluorooctanesulfonamide), and 0.2 g of titanium oxide powder (ST-21, average particle diameter 20 nm, manufactured by Ishihara Sangyo Kaisha Ltd.) were mixed together. The resultant dispersion was stirred for 20 min while maintaining the temperature at 100° C. The resultant dispersion was spin coated on the substrate with a sodium ion block layer formed thereon. The assembly was dried at a temperature of 150° C. for 10 min, permitting hydrolysis and polycondensation to proceed. Thus, a 3 μm-thick photocatalyst-containing layer with a photocatalyst being strongly fixed in an organosiloxane was formed. The average roughness of the surface of the photocatalyst-containing layer was measured by the tracer method and found to be Ra=4 nm. Further, the photocatalyst-containing layer was irradiated with ultraviolet light at an intensity of 70 mW/cm$^2$ for 5 min using a high pressure mercury lamp through a lattice-like mask. In this case, the contact angle of the photocatalyst-containing layer with water and n-octane was measured with a contact angle goniometer (Model CA-Z, manufactured by Kyowa Interface Science Co., Ltd.). The results are shown in Table A-4.

Example A-8

A 0.3 μm-thick photocatalyst-containing layer formed in the same manner as in Example A-7 was irradiated with ultraviolet light at an intensity of 70 mW/cm$^2$ for 5 min using a high pressure mercury lamp through a mask with light shielding layers having a size of 150×300 μm disposed at intervals of 30 μm.

Various liquids having known surface tension were dropped on the photocatalyst-containing layer to measure the contact angle between the photocatalyst-containing layer and the liquids with a contact angle goniometer (Model CA-Z, manufactured by Kyowa Interface Science Co., Ltd.), and the critical surface tension was determined by Zisman plotting. As a result, the critical surface tension was 15.4 mN/m for unexposed areas and was 73.3 mN/m for exposed areas.

Next, 4 g of carbon black (#950, manufactured by Mitsubishi Chemical Corporation), 0.7 g of polyvinyl alcohol (Gosenol AH-26, manufactured by Nippon Synthetic Chemical Industry Co., Ltd.), and 95.3 g of water were mixed together and dissolved with heating. The solution was centrifuged at 12000 rpm and filtered through a 1-μm glass filter to prepare a composition for a light shielding pattern.

The surface tension of the composition for a light shielding pattern was measured with a tension meter (Model PD-Z, manufactured by Kyowa Interface Science Co., Ltd.) and found to be 37.5 mN/m.

Figure 7:
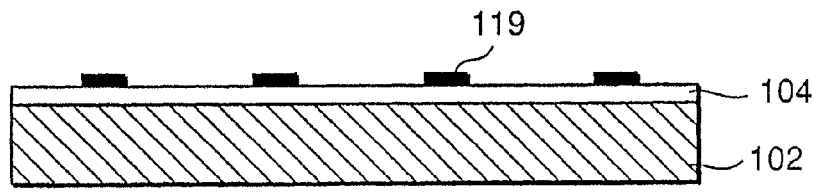
FIG. 7 is a diagram showing a further embodiment of the present invention.

This composition was blade-coated on the whole area of the exposed photocatalyst-containing layer under conditions of blade interval 40 μm and speed 0.6 m/min. As shown in FIG. 7, the composition for a light shielding pattern was repelled by the unexposed areas and was selectively coated only in the exposed areas. Heating at 100° C. for 30 min resulted in the formation of a lattice-like light shielding pattern 119 through a photocatalyst layer 104 on a glass substrate 102.

Example A-9

A sodium ion block layer was prepared in the same manner as in Example A-3. Next, 3 g of isopropyl alcohol, 2.2 g of an organosilane (TSL8113, manufactured by Toshiba Silicone Co., Ltd.), 0.15 g of a fluoroalkylsilane (MF-160E, manufactured by Tohchem Products Corporation: a 50 wt % isopropyl ether solution of N-[3-(trimethoxysilyl)propyl]-N-ethylperfluorooctanesulfonamide), and 0.2 g of titanium oxide powder (ST-21, average particle diameter 20 nm, manufactured by Ishihara Sangyo Kaisha Ltd.) were mixed together. The resultant dispersion was stirred for 20 min while maintaining the temperature at 100° C. The resultant dispersion was spin coated on the substrate with a sodium ion block layer formed thereon. The assembly was dried at a temperature of 150° C. for 10 min, permitting hydrolysis and polycondensation to proceed. Thus, a 3 μm-thick photocatalyst-containing layer with a photocatalyst being strongly fixed in an organosiloxane was formed. The average roughness of the surface of the photocatalyst-containing layer was measured by the tracer method in the same manner as in Example A-1 and found to be Ra=4 nm. Further, the photocatalyst-containing layer was irradiated with ultraviolet light at an intensity of 70 mW/cm$^2$ for 5 min using a high pressure mercury lamp through a lattice-like mask. In this case, the contact angle of the photocatalyst-containing layer with water and n-octane was measured with a contact angle goniometer (Model CA-Z, manufactured by Kyowa Interface Science Co., Ltd.). The results are shown in Table A-4.

Example A-10

A sodium ion block layer was formed on a glass substrate in the same manner as in Example A-3. A photocatalyst-containing layer was then formed in the same manner as in Example A-9, followed by exposure in the same manner as in Example A-9.

Unexposed areas and exposed areas were subjected to elementary analysis using an X-ray photoelectron spectroscopic device (ESCALAB220-I-XL, manufactured by V. G. Scientific). Quantitative calculation was conducted by Shirley's background correction and Scofield's relative sensitivity coefficient correction. The results were expressed in terms of relative value by presuming the weight of Si to be 100 and shown in Table A-1.

TABLE A-1

|  | Si | C | O | Ti | F |
|---|---|---|---|---|---|
| Unexposed area | 100 | 98 | 179 | 21 | 40 |
| Exposed area | 100 | 21 | 220 | 20 | 0 |

Table A-1 shows that exposure decreases the proportion of carbon and fluorine and increases the proportion of oxygen. As is apparent from the results of Example A-9, since the photocatalyst-containing layer has reduced contact angle with water, it is considered that organic groups bonded to silicon atoms, such as methyl and fluoroalkyl groups, have been substituted by oxygen-containing groups, such as hydroxyl groups.

Example A-11

A sodium ion block layer was prepared in the same manner as in Example A-3. Next, 3 g of isopropyl alcohol, 0.4 g of an organosilane (TSL8113, manufactured by Toshiba Silicone Co., Ltd.), 0.75 g of a fluoroalkylsilane (MF-160E, manufactured by Tohchem Products Corporation: a 50 wt % isopropyl ether solution of N-[3-(trimethoxysilyl)propyl]-N-ethylperfluorooctanesulfonamide), and 2 g of titanium oxide (titanium oxide coating liquid ST-K01, solid content 10% by weight, manufactured by Ishihara Sangyo Kaisha Ltd.) were mixed together. The resultant dispersion was stirred for 60 min while maintaining the temperature at 100° C. The resultant dispersion was spin coated on the substrate with a sodium ion block layer formed thereon. The assembly was dried at a temperature of 150° C. for 10 min, permitting hydrolysis and polycondensation to proceed. Thus, a 3 μm-thick photocatalyst-containing layer with a photocatalyst being strongly fixed in an organosiloxane was formed. Further, the photocatalyst-containing layer was irradiated with ultraviolet light at an intensity of 70 mW/cm$^2$ for 10 min using a high pressure mercury lamp through a lattice-like mask. In this case, the contact angle of the photocatalyst-containing layer with water and n-octane was measured with a contact angle goniometer (Model CA-Z, manufactured by Kyowa Interface Science Co., Ltd.). The results are shown in Table A-4.

Example A-12

A 0.3 μm-thick photocatalyst-containing layer was formed in the same manner as in Example A-4. The photocatalyst-containing layer was irradiated with ultraviolet light at an intensity of 70 mW/cm$^2$ for 2 min using a high pressure mercury lamp through a mask having light shielding layers provided at a pitch of 100 μm. A photosensitive resin composition for color pixels of a color filter was dropped by means of a dispenser (1500XL, manufactured by EFD). As a result, the composition could wet and spread on exposed areas to form pixels.

Example A-13

3 g of isopropyl alcohol, 0.3 g of an organosilane (TSL8113, manufactured by Toshiba Silicone Co., Ltd.), 0.45 g of a fluoroalkylsilane (MF-160E, manufactured by Tohchem Products Corporation: a 50 wt % isopropyl ether solution of N-[3-(trimethoxysilyl)propyl]-N-ethylperfluorooctanesulfonamide), and 2 g of titanium oxide (titanium oxide coating liquid ST-K01, solid content 10% by weight, manufactured by Ishihara Sangyo Kaisha Ltd.) were mixed together. The resultant dispersion was stirred for 20 min while maintaining the temperature at 100° C. The resultant dispersion was spin coated on a 0.3 mm-thick aluminum sheet. The coated substrate was dried at a temperature of 150° C. for 10 min, permitting hydrolysis and polycondensation to proceed. Thus, a 0.5 μm-thick photocatalyst-containing layer with a photocatalyst being strongly fixed in an organosiloxane was formed.

The structure for pattern formation thus obtained was heated on a hot plate at various temperatures. In this state, heat rays were removed from light emitted from an ultrahigh pressure mercury lamp (UXM-3500, Model ML-40D lamp house, manufactured by Ushio Inc.), and only ultraviolet light with wavelengths ranging from 241 nm to 271 nm was applied at an intensity of 8.1 mW/cm$^2$ for 300 sec. The contact angle of the photocatalyst-containing layer with water was measured with a contact angle goniometer (Model CA-Z, manufactured by Kyowa Interface Science Co., Ltd.). The results are shown in Table A-2. As is apparent from Table A-2, heating accelerated photocatalytic reaction.

TABLE A-2

| | Before exposure | After exposure |
|---|---|---|
| 25 | 130° | 118° |
| 60° C. | 130° | 40° |
| 100° C. | 130° | Below 5° |

Example A-14

A photocatalyst-containing layer was formed on a quartz glass having a size of 10 cm in length×10 cm in width in the same manner as in Example A-3. A negative-working photomask with a light-permeable portion having a size of 150 µm×300 µm disposed at intervals of 30 µm was brought to intimate contact with the structure for pattern formation or was disposed into the structure for pattern formation while leaving a space of 100 µm. Ultraviolet light with wavelengths ranging from 320 to 390 nm was then applied using a high pressure mercury lamp at an intensity of 70 mW/cm$^2$ for 2 min. The contact angle of the photocatalyst-containing layer with water was measured with a contact angle goniometer (Model CA-Z, manufactured by Kyowa Interface Science Co., Ltd.). The results are summarized in Table A-3.

TABLE A-3

| | Unexposed area | Exposed area |
|---|---|---|
| Intimate contact | 113° | Below 97° |
| Leaving space of 100 µm | 113° | Below 5° |

Example A-15

The negative-working photomask as described in Example A-14 was disposed on the structure for pattern formation while leaving a space of 100 µm in the same manner as in Example A-14. Exposure was performed in the same manner as in Example A-14, except that the exposure was carried out while spraying air onto exposing areas of the structure for pattern formation. As a result, exposure for 70 sec provided a contact angle with water of not more than 5°.

Example A-16

On a glass substrate having a size of 10 cm in length×10 cm in width×0.1 cm in thickness were formed a primer layer and a photocatalyst-containing layer in the same manner as in Example A-10. Ultraviolet light with wavelengths ranging from 320 nm to 390 nm was then applied at an intensity of 70 mW/cm$^2$ for 7 min from a high pressure mercury lamp through a photomask with a light shielding portion having a size of 100 µm in length×100 µm in width formed thereon at intervals of 20 µm.

Next, an ink ribbon comprising a hot-melt ink composition layer having the following composition as a hot-melt ink layer provided on a 10 µm-thick polyester film was brought to intimate contact with the pattern-wise exposed photocatalyst-containing layer. The assembly was then heated at 90° C., and the ink ribbon was then peeled off at a speed of 150 mm/sec and an angle of 70°.

| | |
|---|---|
| Carbon black (#25, manufactured by Mitsubishi Chemical Corporation) | 20 pts. wt. |
| Ethylene-vinyl acetate copolymer (manufactured by DuPont-Mitsui Polychemicals Co., Ltd.) | 10 pts. wt. |
| Carnauba wax | 10 pts. wt. |
| Paraffin wax (HNP-11, manufactured by Nippon Seiro Co., Ltd.) | 60 pts. wt. |

As a result, the ink was not adhered to the unexposed areas of the structure for pattern formation, and the ink could be transferred only onto the exposed areas to form a light shielding pattern.

Example A-17

On a glass substrate having a size of 10 cm in length×10 cm in width×0.1 cm in thickness were formed a primer layer and a photocatalyst-containing layer in the same manner as in Example A-10. Thus, a structure for pattern formation was prepared. Ultraviolet light with wavelengths ranging from 320 nm to 390 nm was then applied to the structure for pattern formation at an intensity of 70 mW/cm$^2$ for 7 min from a high pressure mercury lamp through a photomask with a 5 µm-width line provided thereon at the same intervals as the line width.

Next, the exposed structure for pattern formation was immersed in a liquid having a concentration of 12.5 ml/liter, prepared by diluting a sensitizer liquid for chemical plating (S-10X for glass/ceramics, manufactured by C.Uyemura & Company Ltd.), at 25° C. while swinging for 20 sec. After washing with water, the exposed structure for pattern formation was immersed in a liquid having a concentration of 12.5 ml/liter, prepared by diluting a reduction catalyst liquid (a palladium colloid catalyst A-10X, manufactured by C.Uyemura & Company Ltd.) at 25° C. while swinging for 20 sec and was then immersed with swinging for one hr in an electroless nickel plating solution (Nimuden LPX, manufactured by C.Uyemura & Company Ltd.) at 80° C. Thus, a 0.5 µm-thick nickel layer could be formed on the exposed areas.

Further, the plated structure for pattern formation was immersed with swinging for 5 min in an electroless gold plating bath (ELGB511, manufactured by C.Uyemura & Company Ltd.) at 90° C. to form a 0.1 µm-thick gold layer on the nickel pattern. The plated structure for pattern formation was then immersed with swinging for one hr in an electroless gold plating bath for thick plating (GCBEL2M, manufactured by C.Uyemura & Company Ltd.) at 60° C. to form a 2 µm-thick gold layer.

Example A-18

The same composition as described in Example A-4 was spin coated onto a quartz glass substrate having a size of 10 cm in length×10 cm in width×0.1 cm in thickness to form a 0.4 µm-thick photocatalyst-containing layer. The photocatalyst-containing layer was then irradiated with ultraviolet light using a mercury lamp at an intensity of 70 mW/cm$^2$ for 90 sec through a photomask with a pattern of rectangles having an opening size of 23 µm×12 µm. Thus, a transparent substrate comprising a photocatalyst-containing layer having thereon a rectangular pattern with high surface free energy was obtained.

A thin layer of a perylene pigment having a chemical structure represented by formula A-4 was vacuum deposited onto the whole area of the transparent substrate under conditions of degree of vacuum 1×10$^{-5}$ Torr and deposition rate 1 nm/sec. The surface of the thin layer was washed with acetone. As a result, the deposit was separated only from the unexposed areas due to the difference between the adhesion of the pigment to the exposed areas and the adhesion of the pigment to the unexposed areas. Thus, a rectangular pattern of red pigment with the size of the rectangle being 23 μm×12 μm could be obtained.

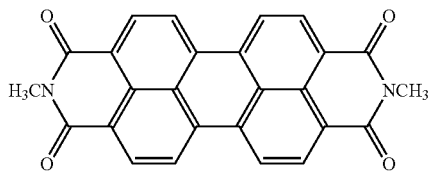

Formula A-4

Example A-19

The same composition as described in Example A-4 was spin coated onto a 100 μm-thick polyimide film to form a 0.4 μm-thick photocatalyst-containing layer. The photocatalyst-containing layer was then exposed to light using a mercury lamp at an intensity of 70 mW/cm$^2$ for 90 sec through a negative-working photomask having a circuit pattern written in a width of 50 μm to form a transparent substrate comprising a photocatalyst-containing layer having thereon a high surface energy portion.

Next, aluminum was vacuum deposited onto the whole area of the transparent substrate under conditions of degree of vacuum 1×10$^{-5}$ Torr and deposition rate 4 nm/sec. A cellophane pressure sensitive adhesive tape (JIS Z 1522, manufactured by Sekisui) was applied onto the surface of the thin layer of aluminum and then peeled off under conditions of 135° and speed 300 mm/sec. As a result, the deposit layer was separated only from the unexposed areas due to the difference between the adhesion of the thin layer of aluminum to the transparent substrate in its exposed areas and the adhesion of the thin layer of aluminum to the transparent substrate in its unexposed areas, and a circuit pattern having a circuit of 50 μm in width and 0.1 μm in layer thickness could be obtained.

Example A-20

The same composition as described in Example A-4 was spin coated onto a quartz glass substrate to form a 0.3 μm-thick photocatalyst-containing layer. The photocatalyst-containing layer was then irradiated with ultraviolet light using a mercury lamp at an intensity of 70 mW/cm$^2$ for 2 min through a mask with an opening diameter of 5 mm.

Various liquids having known surface tension were dropped on the photocatalyst-containing layer to measure the contact angle between the photocatalyst-containing layer and the liquids with a contact angle goniometer (Model CA-Z, manufactured by Kyowa Interface Science Co., Ltd.), and the critical surface tension was determined by Zisman plotting. As a result, the critical surface tension was 14.6 mN/m for unexposed areas and was 72.3 mN/m for exposed areas.

Next, 100 parts by weight of a ultraviolet curable monomer (Beam Set 770, manufactured by Arakawa Chemical Industries, Ltd.) and 5 parts by weight of a curing initiator (Irgacure1700, manufactured by Ciba Specialty Chemicals, K.K.) were mixed together to prepare an ultraviolet curable composition.

The surface tension of the ultraviolet curable monomer composition was measured with a tension meter (Model PD-Z, manufactured by Kyowa Interface Science Co., Ltd.) and found to be 35 mN/m. Further, the viscosity was measured with a viscometer (CJV5000, manufactured by Chichibu-Onoda) and found to be 4.3 mPa·sec. This ultraviolet curable monomer was spin coated on the whole area of the exposed photocatalyst-containing layer.

The ultraviolet curable monomer composition was repelled by the unexposed areas and was selectively coated only onto the exposed areas. Ultraviolet light was then applied using a high pressure mercury lamp an intensity of 70 mW/cm$^2$ for 3 min. As a result, a pattern of circles, with a diameter of 5 mm, of the ultraviolet cured resin was obtained.

Comparative Example A-1

A commercially available original plate for offset printing was evaluated for properties using a thermal plate Pearl dry (manufactured by Presstek) in the same manner as in Example A-3. The results are summarized in Table A-4.

Comparative Example A-2

A waterless offset plate HGII (manufactured by Toray Industries, Inc.), a commercially available original plate for offset printing, was evaluated for properties in the same manner as in Example A-3. The results are summarized in Table A-4.

Comparative Example A-3

A photocatalyst-containing layer was formed in the same manner as in Example A-4, except that the fluoroalkylsilane was not used. The photocatalyst-containing layer was evaluated for properties in the same manner as in Example A-4. The results are summarized in Table A-4.

Comparative Example A-4

A sodium ion block layer was prepared in the same manner as in Example A-3. Next, 3 g of isopropyl alcohol, 2.2 g of an organosilane (TSL8113, manufactured by Toshiba Silicone Co., Ltd.), 0.15 g of a fluoroalkylsilane (MP-160E, manufactured by Tohchem Products Corporation: a 50 wt % isopropyl ether solution of N-[3-(trimethoxysilyl)propyl]-N-ethylperfluorooctanesulfonamide), and 0.2 g of titanium oxide powder (ST-41, average particle diameter 50 nm, manufactured by Ishihara Sangyo Kaisha Ltd.) were mixed together. The resultant dispersion was stirred for 20 min while maintaining the temperature at 100° C. The resultant dispersion was spin coated on the substrate with a sodium ion block layer formed thereon. The assembly was dried at a temperature of 150° C. for 10 min, permitting hydrolysis and polycondensation to proceed. Thus, a 3 μm-thick photocatalyst-containing layer with a photocatalyst being strongly fixed in an organosiloxane was formed. The average roughness of the surface of the photocatalyst-containing layer was measured by the tracer method in the same manner as in Example A-1 and found to be Ra=30 nm. Further, the photocatalyst-containing layer was irradiated with ultraviolet light at an intensity of 70 mW/cm$^2$ for 5 min using a high pressure mercury lamp through a lattice-like mask. In this case, the contact angle of the photocatalyst-containing layer with water and n-octane was measured with a contact angle goniometer (Model CA-Z, manufactured by Kyowa Interface Science Co., Ltd.). The results are summarized in Table A-4.

TABLE A-4

|  | Exposed area | | Unexposed area | |
| --- | --- | --- | --- | --- |
|  | Water | n-Octane | Water | n-Octane |
| Ex. A-3 | Below 5° | Below 5° | 113° | 16° |
| Ex. A-4 | Below 5° | Below 5° | 107° | 47° |
| Ex. A-7 | Below 5° | Below 5° | 105° | 40° |
| Ex. A-9 | Below 5° | Below 5° | 100° | 30° |
| Ex. A-11 | Below 5° | Below 5° | 151° | 77° |
| Comp. Ex. A-1 | 84° | Below 5° | 105° | 11° |
| Comp. Ex. A-2 | 104° | 5° | 116° | 13° |
| Comp. Ex. A-3 | Below 5° | Below 5° | 86° | 10° |
| Comp. Ex. A-4 | 10° | 10° | 105° | 26° |

Example A-21

A 20 wt % dimethylformamide solution of a composition for a primer layer (Kan-coat 90T-25-3094, manufactured by Kansai Paint Co., Ltd.) was coated on a 0.15 mm-thick degreased aluminum sheet. The coated aluminum sheet was dried at 200° C. for 1 min. Thus, a 3 μm-thick primer layer was formed.

Next, 3 g of isopropyl alcohol, 4.2 g of an organosilane (TSL8113, manufactured by Toshiba Silicone Co., Ltd.), and 0.2 g of titanium oxide powder (ST-01, average particle diameter 7 nm, manufactured by Ishihara Sangyo Kaisha Ltd.) were mixed together. The mixture was stirred for 60 min while maintaining the temperature at 100° C. The resultant dispersion was spin coated onto the substrate having thereon a primer layer. The assembly was dried at 150° C. for 5 min, permitting hydrolysis and polycondensation to proceed. Thus, a layer was formed.

Ultraviolet irradiation was carried out using a high pressure mercury lamp at an intensity of 70 mW/cm² for 10 min. In this case, the contact angle with water and n-octane was measured with a contact angle goniometer (Model CA-Z, manufactured by Kyowa Interface Science Co., Ltd.). The results are summarized in Table A-5.

TABLE A-5

|  | Before irradiation | After irradiation |
| --- | --- | --- |
| Water | 72° | 0° |
| n-Octane | Below 6° | Below 5° |

Further, the original plate for lithography using dampening water was exposed to light from the above mercury lamp through a gradation positive-working mask having halftone dots of 2 to 98% with 175 lines/in. Thus, a pattern was formed.

Next, the printing plate thus obtained was mounted on an offset printing machine (Alpha New Ace, manufactured by Alpha Giken K.K.), and printing was carried out on a coated paper using a printing ink (ACROS (EIKUROSU) Deep Red, manufactured by The Inctec Inc.) and dampening water (a liquid prepared by diluting a clean etch liquid 20 times with water, manufactured by Nikken Chemicals Co., Ltd.) at a printing speed of 5000 sheets/hr. As a result, 20,000 sheets of good prints could be obtained.

Example A-22

2.7 g of tetraethoxysilane $Si(OC_2H_6)_4$, 38.7 g of ethanol, and 4.5 g of 2 N hydrochloric acid were mixed together. The mixture was stirred for 10 min. The resultant solution was spin coated onto a substrate, and the coated substrate was dried at 80° C. for 30 min. Thus, a 0.2 μm-thick sodium ion block layer was formed.

Tetraethoxysilane $Si(OC_2H_5)_4$ (0.62 g), 0.96 g of titania sol ((TA-15, manufactured by Nissan Chemical Industries Ltd.), 26.89 g of ethanol, and 0.32 g of pure water were mixed together. The mixture was stirred for 10 min. The resultant dispersion was spin coated on the substrate with the sodium ion block layer formed thereon. The assembly was dried at a temperature of 150° C. for 30 min, permitting hydrolysis and polycondensation to proceed. Thus, a 0.2 μm-thick photocatalyst-containing layer, having high surface free energy, with a photocatalyst being strongly fixed in silica was prepared as sample A-1.

Next, a solution of 5% by weight of an olive oil in cyclohexanone was spin coated onto the photocatalyst-containing layer of sample A-1 at a coverage of 1 g/m². The coating was dried at a temperature of 80° C. for 10 min to from an organic material layer having low surface free energy. Thus, sample A-2 was prepared.

Sample A-1 and sample A-2 were irradiated with ultraviolet light from a mercury lamp at an intensity of 230 mW/cm² for 5 min. Thereafter, the contact angle of the samples with water was measured with a contact angle goniometer (Model CA-Z, manufactured by Kyowa Interface Science Co., Ltd.). The results are summarized in Table A-6. As a result, it was found that, in sample A-2, the organic material layer was degraded and removed by photocatalytic action and this brought sample A-2 to the same state as sample A-1 which is the sample before coating. For sample A-1 having a high critical surface tension layer, the wettability after light irradiation was substantially the same as the wettability before light irradiation.

TABLE A-6

|  | Before irradiation | After irradiation |
| --- | --- | --- |
| Sample A-1 | 8° | 7° |
| Sample A-2 | 47° | 7° |

Further, a 2 wt % aqueous solution of polyvinyl alcohol (Gosenol AH-26, manufactured by Nippon Synthetic Chemical Industry Co., Ltd.) was spin coated onto the surface of sample A-1 to a thickness of 0.2 μm. The coating was heated at 80° C. for 45 min to form a film. Subsequently, the film was irradiated with ultraviolet light from a mercury lamp at an intensity of 280 mW/cm² for 8 min. The contact angle of the film with water was measured with a contact angle goniometer (Model CA-Z, manufactured by Kyowa Interface Science Co., Ltd.). As a result, the contact angle before light irradiation and the contact angle after light irradiation were 62° and not more than 5°, respectively.

Example A-23

A solution of 5% by weight of a mixture of 94.99% by weight of polydimethylsiloxane having a hydroxyl group at its both ends (degree of polymerization 700), 5% by weight of methyltriacetoxysilane, and 0.01% by weight of dibutyltin dilaurate in Isopar E (manufactured by Exxon Chemical) was spin coated onto sample A-1 of Example A-22 to a thickness of 0.2 μm. The coating was dried at 100° C. for 10 min to form a film.

The film was then irradiated with light from a mercury lamp at an intensity of 50 mW/cm² for one min. As a result, the wettability in terms of the contact angle was changed from 130° to not more than 5°.

A 20 wt % dimethylformamide solution of a composition for a primer layer (Kan-coat 90T-25-3094, manufactured by Kansai Paint Co., Ltd.) was coated onto a degreased aluminum sheet having a thickness of 0.15 mm. The coated aluminum sheet was dried at 200° C. for one min to form a 3 μm-thick primer layer.

Next, a photocatalyst-containing layer and a wettability-variable material layer as described in Example A-22 were formed onto the primer layer to prepare an original plate for waterless plate.

Subsequently, a pattern was formed under conditions of Nd:YAG laser (355 nm λ-Physic Star Line) and recording energy 200 mJ/cm$^2$. The printing plate thus obtained was mounted on an offset printing machine (Alpha New Ace, manufactured by Alpha Giken K.K.), and printing was carried out on a coated paper using an ink for waterless printing (Inctec Waterless S Deep Blue, manufactured by The Inctec Inc.) at a printing speed of 5000 sheets/hr. As a result, 20,000 sheets of good prints could be obtained.

Example A-24

A sodium block layer was formed on a soda-lime glass substrate having a size of 10 cm in length×10 cm in width×0.1 cm in thickness in the same manner as in Example A-22. A solution prepared by mixing 1 g of tetraethoxytitanium (Ti(OC$_2$H$_5$)$_4$), 9 g of ethanol, and 0.1 g of hydrochloric acid together was spin coated on the block layer.

The assembly was heated at 150° C. for 10 min to form a 0.1 μm-thick amorphous titania layer. The amorphous titania layer was heated at 400° C. for 10 min to create a phase change to an anatase form of titania layer.

A wettability-variable layer was formed on the titania layer in the same manner as in Example A-23 and then irradiated with light from a mercury lamp at an intensity of 50 mW/cm$^2$ through a chart mask having a resolution of 50 lp/mm for 2 min.

Next, an ink for waterless lithography (Inctec Waterless S Yellow, manufactured by The Inctec Inc.) was coated on the whole area of the exposed pattern forming structure by means of an RI tester (Model RI-2 tester, manufactured by Ishikawa-jima Industrial Machinery Co., Ltd.). As a result, a yellow pattern was obtained wherein the unexposed areas repelled the ink due to its oil repellency with the ink selectively coated only on the exposed area.

Example A-25

A glass substrate provided with a sodium ion block layer was prepared in the same manner as in Example A-1. Next, 0.14 g of a surfactant (BL-2, manufactured by Nihon Surfactant Kogyo K.K.), 0.62 g of tetraethoxysilane Si(OC$_2$H$_5$)$_4$, 0.96 g of a titania sol (TA-15, manufactured by Nissan Chemical Industries Ltd.), 26.89 g of ethanol, and 0.32 g of water were mixed together. The mixture was stinted for 10 min. The resultant dispersion was spin coated on the substrate with the 0.2 μm-thick sodium ion block layer formed thereon.

Figure 8:
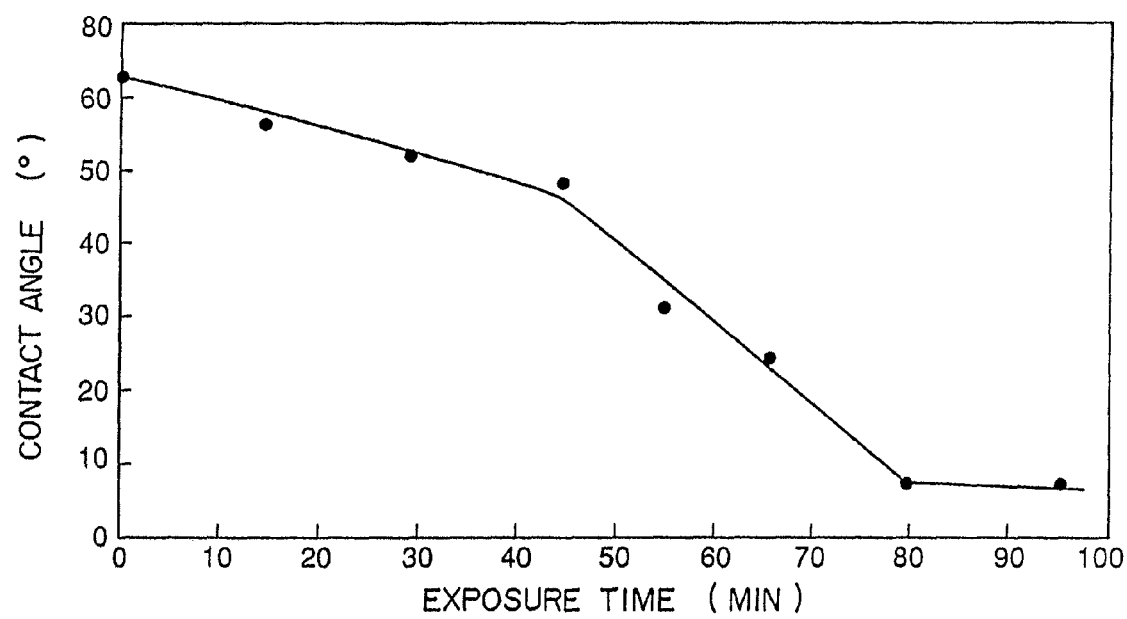
FIG. 8 is a diagram showing the relationship between light irradiation time and wettability of structures for pattern formation according to the present invention.

The assembly was then dried at a temperature of 150° C. for 30 min, permitting hydrolysis and polycondensation to proceed. Thus, a 0.2 μm-thick photocatalyst-containing layer with a photocatalyst and a surfactant being strongly fixed in silica was formed. The sample thus obtained was irradiated with ultraviolet light from a xenon lamp at an intensity of 3 mW/cm$^2$. In this case, a change in contact angle between the sample and water with the elapse of time was measured with a contact angle goniometer (Model CA-Z, manufactured by Kyowa Interface Science Co., Ltd.). The results are shown in FIG. 8. As is apparent from FIG. 8, the contact angle (63° before light irradiation) gradually decreased with the elapse of irradiation time and, about 80 min after the initiation of irradiation, reached 6°.

Example A-26

3 g of Glasca HPC7002 (Japan Synthetic Rubber Co., Ltd.), a silica sol, and 1 g of HPC402H (Japan Synthetic Rubber Co., Ltd.), an alkylalkoxysilane, were mixed together. The mixture was stirred for 5 min. The resultant solution was spin coated on a 0.15 mm-thick aluminum sheet to form a 2 μm-thick primer layer.

Next, a photocatalyst-containing layer as described in Examples A-23 was formed on the primer layer to obtain an original plate for a printing plate.

Further, the original plate for lithography using dampening water was exposed to light from the above xenon lamp through a gradation positive-working film having halftone dots of 2 to 98% with 175 lines/in. Thus, a pattern was formed.

Next, the printing plate thus obtained was mounted on an offset printing machine (Alpha New Ace, manufactured by Alpha Giken K.K.), and printing was carried out on a coated paper using an offset printing ink (ACROS (EIKUROSU) Deep Red, manufactured by The Inctec Inc.) and dampening water at a printing speed of 5000 sheets/hr. As a result, 20,000 sheets of good prints could be obtained.

Example A-27

A composition as described in Example A-4 was spin coated onto a transparent substrate of quartz glass to form a 0.4 μm-thick photocatalyst-containing layer. Subsequently, the coating was irradiated with light from a mercury lamp at an intensity of 70 mW/cm$^2$ through a mask having a circular pattern with a opening diameter of 9 mm for 90 sec. Thus, a transparent substrate having thereon a highly wettable circular pattern was obtained.

1000 g of a water-soluble ultraviolet curable ester acrylate resin (AQ-7, manufactured by Arakawa Chemical Industries, Ltd.), 50 g of a curing initiator (Irgacure184, manufactured by Ciba Specialty Chemicals, K.K.), and 25 g of water were mixed together. The mixture was stirred for 3 min. 30 μl of the mixed liquid was dropped through a microsyringe on the center of the circular pattern utilizing a difference in wettability formed on the transparent substrate.

Subsequently, light was applied from a mercury lamp at an intensity of 70 mW/cm$^2$ for 10 sec. Thus, a lens having a diameter of 9 mm and a focal length of 45 mm was prepared.

Example A-28

A composition as described in Example A-4 was spin coated onto a transparent substrate of quartz glass to form a 0.4 μm-thick photocatalyst-containing layer. Subsequently, the coating was irradiated with light from a mercury lamp at an intensity of 70 mW/cm$^2$ through a mask having a circular pattern with a opening diameter of 1 mm for 90 sec. Thus, a transparent substrate having thereon a highly wettable circular pattern was obtained.

1000 g of a water-soluble ultraviolet curable ester acrylate resin (AQ-7, manufactured by Arakawa Chemical Industries, Ltd.), 50 g of a curing initiator (Irgacure184, manufactured by Ciba Specialty Chemicals, K.K.), and 125 g of water were mixed together. The mixture was stinted for 3 min. The mixed liquid was spin coated onto the circular pattern utilizing a difference in wettability formed on the transparent substrate to a thickness of 20 μm. As a result, the mixed liquid was deposited only onto the circular portion. Subsequently, light was applied from a mercury lamp at an intensity of 70 mW/cm$^2$ for 3 sec. Thus, a lens having a diameter of 1 mm and a focal length of 2.5 mm was prepared.

Example A-29

A 20 wt % dimethylformamide solution of a primer (a primer paint for metals, Kan-coat 90T-25-3094, manufactured by Kansai Paint Co., Ltd.) was coated on a 0.23 mm-thick degreased aluminum sheet. The coated aluminum sheet was dried at 200° C. for 1 min. Thus, a 3 μm-thick primer layer was formed.

A composition comprising 9 g of polydimethylsiloxane of which both ends had been modified with OH (X-22-160AS, functional group equivalent 112, manufactured by The Shin-Etsu Chemical Co., Ltd.), 1 g of a crosslinking agent (polyisocyanate, Coronate L, manufactured by Nippon Polyurethane Industry Co., Ltd.), 0.05 g of butyltin dilaurate, 1 g of titanium oxide powder (ST-01, particle diameter 7 nm, Ishihara Sangyo Kaisha Ltd.), 5 g of 1,4-dioxane, and 5 g of isopropanol was coated onto the primer layer. The coating was dried at 120° C. for 2 min to form a 1 μm-thick photocatalyst-containing layer. Thus, an original plate for a printing plate was obtained. The average roughness of the surface of the photocatalyst-containing layer was measured by the tracer method and found to be Ra=2 nm.

The original plate was then irradiated with an excimer laser at 248 nm at an intensity of 200 mJ/cm$^2$ to form a pattern and to induce a photocatalytic reaction.

The contact angle of exposed areas with water and n-octane was measured with a contact angle goniometer (Model CA-Z, manufactured by Kyowa Interface Science Co., Ltd.). A result, a difference in wettability could be confirmed. The results of measurement are shown in Table A-7.

Example A-30

The printing plate prepared in Example A-29 was mounted on an offset printing machine (Komori Sprint Four Color Machine), and printing was carried out using a printing ink (Dri-o-color Deep Blue ink, manufactured by Dainippon Ink and Chemicals, Inc.) onto coated paper. As a result, good prints could be obtained.

Example A-31

A primer layer was formed onto a 0.23 mm-thick aluminum substrate in the same manner as in Example A-29. Subsequently, a composition comprising 8 g of polydimethylsiloxane of which both ends had been modified with OH (X-22-160AS, manufactured by The Shin-Etsu Chemical Co., Ltd.), 1 g of polydimethylsiloxane (KF96, manufactured by The Shin-Etsu Chemical Co., Ltd.), 1 g of a crosslinking agent (polyisocyanate, Coronate L, manufactured by Nippon Polyurethane Industry Co., Ltd.), 0.05 g of dibutyltin dilaurate, 1 g of titanium oxide powder (ST-01, particle diameter 7 nm, Ishihara Sangyo Kaisha Ltd.), 5 g of toluene, and 5 g of isopropanol was coated onto the primer layer. The coating was dried at 150° C. for 2 min to form a 1 μm-thick photocatalyst-containing layer. Thus, an original plate for a printing plate was obtained.

The average roughness of the surface of the photocatalyst-containing layer was measured by the tracer method and found to be Ra=2 nm.

The original plate was then irradiated with an excimer laser at 248 nm at an intensity of 200 mJ/cm$^2$ to form a pattern and to induce a photocatalytic reaction.

The contact angle of exposed areas with water and n-octane was measured with a contact angle goniometer (Model CA-Z, manufactured by Kyowa Interface Science Co., Ltd.). A result, a difference in wettability could be confirmed. The results of measurement are shown in Table A-7.

Further, in the same manner as in A-30, the printing plate thus prepared was mounted on an offset printing machine (Komori Sprint Four Color Machine), and printing was carried out using a printing ink (Dri-o-color Deep Blue ink, manufactured by Dainippon Ink and Chemicals, Inc.) onto coated paper. As a result, good prints could be obtained.

Example A-32

3 g of a silica sol (Glasca HPC7002, manufactured by Japan Synthetic Rubber Co., Ltd.) and 1 g of an alkylalkoxysilane (HPC402H, manufactured by Japan Synthetic Rubber Co., Ltd.) were mixed together, and the mixture was stirred for 5 min. The resultant solution was spin coated onto a glass substrate having an area of 7.5 cm$^2$ to form a 2 μm-thick sodium ion block layer.

Next, 3 g of isopropyl alcohol, 0.76 g of a silica sol (Glasca HPC7002, manufactured by Japan Synthetic Rubber Co., Ltd.), 0.25 g of an alkylalkoxysilane (Glasca HPC402H, manufactured by Japan Synthetic Rubber Co., Ltd.), and 0.15 g of a fluoroalkylsilane (MF-160E, manufactured by Tohchem Products Corporation: a 50 wt % isopropyl ether solution of N-[3-(trimethoxysilyl)propyl]-N-ethylperfluorooctanesulfonamide) were mixed together. The resultant dispersion was stirred for 20 min while maintaining the temperature at 100° C. Thereafter, 2 g of titanium oxide (ST-K01, a liquid for titanium oxide, solid content 10% by weight, manufactured by Ishihara Sangyo Kaisha Ltd.) was added thereto, followed by stirring for additional 30 min.

The resultant dispersion was spin coated on the substrate with a sodium block layer formed thereon. The assembly was dried at a temperature of 150° C. for 10 min, permitting hydrolysis and polycondensation to proceed. Thus, a 3 μm-thick photocatalyst-containing layer with a photocatalyst being strongly fixed by an organopolysiloxane was formed.

A dispersion prepared by mixing 1 g of polydimethylsiloxane of which both ends had been modified with OH (X-22-160AS, manufactured by The Shin-Etsu Chemical Co., Ltd.), 2 g of a silica sol (Glasca HPC7002, manufactured by Japan Synthetic Rubber Co., Ltd.), and 1 g of an alkylalkoxysilane (HPC402H, manufactured by Japan Synthetic Rubber Co., Ltd.) and stirring the mixture for 5 min was coated onto the photocatalyst-containing layer. The coating was dried at a temperature of 150° C. for 20 min. Thus, a pattern forming structure having a dried film thickness of 0.5 μm.

The average roughness of the surface of the pattern forming structure was measured by the tracer method and found to be Ra=2 nm.

The pattern forming structure was then irradiated with a YAG laser at 365 nm at an intensity of 200 mJ/cm$^2$ to form a pattern and to induce a photocatalytic reaction.

The contact angle of exposed areas with water and n-octane was measured with a contact angle goniometer (Model CA-Z, manufactured by Kyowa Interface Science Co., Ltd.). The results of measurement are shown in Table A-7.

In the same manner as in Example A-27, the original plate for a printing plate was mounted on an offset printing machine (Komori Sprint Four Color Machine), and printing was carried out using a printing ink (Dri-o-color Deep Blue ink, manufactured by Dainippon Ink and Chemicals, Inc.) onto coated paper. As a result, good prints could be obtained.

Example A-33

A primer layer was formed onto a 0.23 mm-thick aluminum substrate in the same manner as in Example A-29. 0.76 g of an emulsion type polydimethylsiloxane (an addition reaction type) (KM-768, effective component 30%, manufactured by The Shin-Etsu Chemical Co., Ltd.), 1.34 g of water, 1 g of a titanium oxide sol (STS-01, particle diameter 7 nm, manufactured by Ishihara Sangyo Kaisha Ltd.), 0.008 g of a catalyst for an addition reaction (PM-6A), and 0.012 g of a catalyst for an addition reaction (PM-6B) were mixed together. The mixture was coated onto the primer layer. The coating was dried at 160° C. for one min to form a 1 μm-thick photocatalyst-containing layer.

A mask was brought to an intimate contact with the photocatalyst-containing layer, followed by ultraviolet irradiation from a high pressure mercury lamp at an intensity of 70 mW/cm$^2$ for 10 min to conduct a photocatalytic reaction. Thereafter, the contact angle of the sample with water and n-octane was measured with a contact angle goniometer (Model CA-Z, manufactured by Kyowa Interface Science Co., Ltd.). The results are shown in Table A-7.

Example A-34

A 20 wt % dimethylformamide solution of a primer (a primer paint for metals, Kan-coat 90T-25-3094, manufactured by Kansai Paint Co., Ltd.) was coated on a 0.23 mm-thick degreased aluminum sheet. The coated aluminum sheet was dried at 200° C. for 1 min. Thus, a 3 μm-thick primer layer was formed.

3 g of a silica sol (Glasca HPC7002, manufactured by Japan Synthetic Rubber Co., Ltd.) and 1 g of an alkylalkoxysilane (HPC402H, manufactured by Japan Synthetic Rubber Co., Ltd.) were mixed together, and the mixture was stirred by means of a stirrer for 5 min. The resultant solution was blade coated onto the primer layer. The coating was dried at 100° C. for 10 min.

Next, 3 g of isopropyl alcohol, 0.75 g of a silica sol (Glasca HPC7002, solid content 12%, manufactured by Japan Synthetic Rubber Co., Ltd.), 0.25 g of an alkoxysilane (HPC402H, solid content 50%, manufactured by Japan Synthetic Rubber Co., Ltd.), 0.15 g of a fluoroalkylsilane (MF-160E, manufactured by Tohchem Products Corporation: a 50 wt % isopropyl ether solution of N-[3-(trimethoxysilyl)propyl]-N-ethylperfluorooctanesulfonamide), and 0.15 g of dimethoxydimethylsilane (TSL8112, manufactured by Toshiba Silicone Co., Ltd.) were mixed together. The resultant solution was stirred for 20 min while maintaining the temperature at 100° C. Thereafter, 2 g of a liquid for coating of titanium oxide (ST-K01, solid content 10%, manufactured by Ishihara Sangyo Kaisha Ltd.) was added thereto, followed by stirring for additional 30 min. The resultant dispersion was spin coated. The coating was dried at a temperature of 150° C. for 10 min, permitting hydrolysis and polycondensation to proceed. Thus, a 3 μm-thick photocatalyst-containing layer with a photocatalyst being strongly fixed by an organopolysiloxane was formed to obtain a structure for pattern formation. The content of dimethylsiloxane unit in the formed layer was 40%. The surface roughness of the pattern forming structure was measured by the tracer method and found to be Ra=2 nm.

The pattern forming structure was then irradiated with ultraviolet light from a high pressure mercury lamp at an intensity of 70 mW/cm$^2$ through a lattice-like mask for 5 min. The contact angle of the sample with water and n-octane was measured with a contact angle goniometer (Model CA-Z, manufactured by Kyowa Interface Science Co., Ltd.). The results of measurement are shown in Table A-7. The pattern forming structure with a pattern formed thereon was mounted on an offset printing machine (Komori Sprint Four Color Machine), and printing was carried out using an ink for waterless printing (Dri-o-color Deep Blue ink, manufactured by Dainippon Ink and Chemicals, Inc.) onto coated paper. As a result, good prints could be obtained.

Example A-35

A YAG laser at 355 nm was pattern-wise applied at an intensity of 200 mJ/cm$^2$ onto a pattern forming structure prepared as described in Example A-34 to conduct a photocatalytic reaction. The contact angle of exposed areas with water and n-octane was measured with a contact angle goniometer (Model CA-Z, manufactured by Kyowa Interface Science Co., Ltd.). The results of measurement are shown in Table A-7.

The pattern forming structure with a pattern formed thereon was mounted on an offset printing machine (Komori Sprint Four Color Machine), and printing was carried out using an ink for waterless printing (Dri-o-color Deep Blue ink, manufactured by Dainippon Ink and Chemicals, Inc.) onto coated paper. As a result, good prints could be obtained.

Example A-36

A pattern forming structure was prepared in the same manner as in Example A-31, except that the amount of dimethoxydimethylsilane (TSL8112, manufactured by Toshiba Silicone Co., Ltd.) used in the photocatalyst-containing layer was changed to 0.03 g and the content of the dimethylsiloxane unit was changed to 10%. The pattern forming structure thus obtained was evaluated in the same manner as in Example A-31. The results are shown in Table A-7.

Printing was carried out on coated paper in the same manner as in Example A-31. As a result, good prints free from smudges could be obtained.

Example A-37

A 20 wt % dimethylformamide solution of a primer (a primer paint for metals, Kan-coat 90T-25-3094, manufactured by Kansai Paint Co., Ltd.) was coated on a 0.23 mm-thick degreased aluminum sheet. The coated aluminum sheet was dried at 200° C. for 1 min. Thus, a 3 μm-thick primer layer was formed.

3 g of a silica sol (Glasca HPC7002, manufactured by Japan Synthetic Rubber Co., Ltd.) and 1 g of an alkylalkoxysilane (HPC402H, manufactured by Japan Synthetic Rubber Co., Ltd.) were mixed together, and the mixture was stirred by means of a stirrer for 5 min. The resultant solution was blade coated onto the primer layer. The coating was dried at 100° C. for 10 min.

Next, 3 g of isopropyl alcohol, 0.75 g of a silica sol (Glasca HPC7002, manufactured by Japan Synthetic Rubber Co., Ltd.), 0.25 g of an alkylalkoxysilane (HPC402H, manufactured by Japan Synthetic Rubber Co., Ltd.), 0.15 g of a fluoroalkylsilane (MF-160E, manufactured by Tohchem Products Corporation: a 50 wt % isopropyl ether solution of N-[3-(trimethoxysilyl)propyl]-N-ethylperfluorooctanesulfonamide), and 0.30 g of dimethoxydimethylsilane were mixed together. The resultant solution was stirred for 20 min while maintaining the temperature at 100° C. Thereafter, 2 g of a liquid for coating of titanium oxide (ST-K01, solid content 10%, manufactured by Ishihara Sangyo Kaisha Ltd.) was added thereto, followed by stirring for additional 30 min. The resultant dispersion was spin coated.

A dispersion prepared by mixing 3 g of isopropyl alcohol, 3 g of a silica sol (Glasca HPC7002, manufactured by Japan Synthetic Rubber Co., Ltd.), and 1 g of an alkylalkoxysilane (HPC402H, manufactured by Japan Synthetic Rubber Co., Ltd.) and stirring the mixture for 5 min was coated on the coating to form a 0.2 μm-thick coating. Thus, a pattern forming structure was prepared.

The pattern forming structure was then exposed to a YAG laser at an energy density of 200 mJ/cm$^2$ through a lattice-like mask to form a pattern. Thus, a printing plate was prepared. The contact angle of the sample thus obtained with water and n-octane was measured with a contact angle goniometer (Model CA-Z, manufactured by Kyowa Interface Science Co., Ltd.). The results of measurement are shown in Table A-7.

The pattern forming structure with a pattern formed thereon was mounted on an offset printing machine (Komori Sprint Four Color Machine), and printing was carried out using an ink for waterless printing (Dri-o-color Deep Blue ink, manufactured by Dainippon Ink and Chemicals, Inc.) onto coated paper. As a result, good prints could be obtained.

Comparative Example A-5

A machine plate was prepared in the same manner as in Example A-29, except that the substrate was not treated with the primer. The plate was mounted on a printing machine in the same manner as in Example A-30. As a result, the photocatalyst-containing layer as partially separated from the aluminum substrate, indicating that the adhesion of the photocatalyst-containing layer to the substrate was unsatisfactory. Further, the plate was crosscut with a cutter, and a peeling test was carried out using a mending tape (Scotch Mending Tape, manufactured by Sumitomo 3M Ltd.). As a result, the plate provided with a primer layer was free from the separation of the photocatalyst-containing layer, whereas the plate not provided with any primer layer caused the separation of the photocatalyst-containing layer.

Comparative Example A-6

A commercially available original plate for offset printing was evaluated for properties using a thermal plate Pearl dry (manufactured by Presstek) in the same manner as in Example A-29. The results are shown in Table A-7.

Comparative Example A-7

A waterless offset plate HGII (manufactured by Toray Industries, Inc.), a commercially available original plate for offset printing, was evaluated for properties in the same manner as in Example A-29. The results are shown in Table A-7.

Comparative Example A-8

A pattern forming structure was prepared in the same manner as in Example A-34, except that the amount of dimethoxy-dimethylsilane (TSL8112, manufactured by Toshiba Silicone Co., Ltd.) used in the photocatalyst-containing layer was changed to 0.2 g and the content of the dimethylsiloxane unit was changed to 50%. The roughness of the surface of the photocatalyst-containing layer was measured by the tracer method and found to be Ra=500 nm, indicating that the surface of the photocatalyst-containing layer is rough. This high roughness made it impossible to prepare a plate for printing.

Comparative Example A-9

A pattern forming structure was prepared in the same manner as in Example A-31, except that the amount of dimethoxy-dimethylsilane (TSL8112, manufactured by Toshiba Silicone Co., Ltd.) used in the photocatalyst-containing layer was changed to 0.01 g and the content of the dimethylsiloxane unit was changed to 5%. The pattern forming structure was evaluated in the same manner as in Example A-31. The results are shown in Table A-7. Further, the surface roughness was measured by the tracer method and found to be Ra=50 nm.

Printing was carried out on coated paper in the same manner as in Example A-34. As a result, smudges occurred.

TABLE A-7

| | Exposed area | | Unexposed area | |
|---|---|---|---|---|
| | Water | n-Octane | Water | n-Octane |
| Ex. A-29 | Below 5° | Below 5° | 113° | 16° |
| Ex. A-31 | Below 5° | Below 5° | 113° | 16° |
| Ex. A-32 | Below 5° | Below 5° | 115° | 15° |
| Ex. A-33 | Below 5° | Below 5° | 107° | 15° |
| Ex. A-34 | Below 5° | Below 5° | 113° | 16° |
| Ex. A-35 | Below 80° | Below 5° | 113° | 16° |
| Ex. A-36 | Below 70° | Below 5° | 113° | 16° |
| Ex. A-37 | Below 60° | Below 5° | 115° | 15° |
| Comp. Ex. A-6 | 84° | Below 5° | 105° | 11° |
| Comp. Ex. A-7 | 104° | Below 5° | 116° | 13° |
| Comp. Ex. A-9 | 80° | Below 5° | 115° | 20° |

In the pattern forming structures according to the first invention A, a photocatalyst-containing layer is provided on a substrate. By virtue of this construction, a pattern can be formed by varying the wettability of the surface of the substrate through photocatalytic action created in response to light irradiation. This can realize the formation of a pattern without development and other steps. Therefore, the pattern forming structures according to the present invention can be used for a wide variety of applications including original plates for printing plates and functional elements.

The following examples demonstrates use of a photocatalyst-containing layer as a wettability-variable component layer.

Example B-1

Preparation of Composition for Photocatalyst-Containing Layer

A coating liquid for a photocatalyst-containing layer (a composition for a photocatalyst-containing layer) was prepared according to the following formulation.
(Formulation of Composition for Photocatalyst-Containing Layer)

| | |
|---|---|
| Photocatalyst-containing composition (ST-K01, manufactured by Ishihara Sangyo Kaisha Ltd.) | 2 pts. wt. |
| Organoalkoxysilane (TSL8113, manufactured by Toshiba Silicone Co., Ltd. | 0.4 pt. wt. |
| Fluoroalkylsilane (MF-160E, manufactured by Tohchem Products Corporation) | 0.3 pt. wt. |
| Isopropyl alcohol | 3 pts. wt. |

This composition for a photocatalyst-containing layer was spin coated onto a transparent substrate of soda-glass. The coating was dried at a temperature of 150° C. for 10 min, permitting hydrolysis and polycondensation to proceed. Thus, a transparent photocatalyst-containing layer (thickness 0.5 μm) with a photocatalyst being strongly fixed in an organopolysiloxane was formed. The photocatalyst-containing layer was pattern-wise exposed to light from a mercury lamp (wavelength 365 nm) at an intensity of 70 mW/cm$^2$ through a mask for 50 sec. The contact angle of exposed areas and unexposed areas with water was measured with a contact angle goniometer (Model CA-Z, manufactured by Kyowa Interface Science Co., Ltd.). In this case, a water droplet was dropped on the sample through a microsyringe, and 30 sec after that, the contact angle was measured. As a result, the contact angle of the unexposed areas with water was 142°, while the contact angle of the exposed areas with water was not more than 10°. This confirms that the exposed areas function as high critical surface tension areas and a pattern can be formed by utilizing a difference in wettability between the exposed areas and the unexposed areas.

Formation of Black Matrix

A photocatalyst-containing layer was formed on a transparent substrate in the same manner as described above (corresponding to FIG. 17 (A)).

The photocatalyst-containing layer was irradiated with light from a mercury lamp (wavelength 365 nm) at an intensity of 70 mW/cm$^2$ for 50 see through a mask for a black matrix having a matrix-like opening pattern (opening line width 30 μm) so that exposed areas had high critical surface tension (not more than 10° in terms of contact angle with water) (corresponding to FIG. 17 (B)).

Separately, a mixture having the following composition was dissolved by heating at 90° C., centrifuged at 12,000 rpm, and then filtered through a 1-μm glass filter. 1% by weight of ammonium dichromate as a crosslinking agent was added to the resultant aqueous colored resin solution to prepare a coating liquid for a black matrix (a black matrix composition).

(Black Matrix Composition)

| | |
|---|---|
| Carbon black (#950, manufactured by Mitsubishi Chemical Corporation) | 4 pts. wt. |
| Polyvinyl alcohol (Gosenol AH-26, manufactured by Nippon Synthetic Chemical Industry Co., Ltd.,) | 0.7 pt. wt. |
| Ion-exchanged water | 95.3 pts. wt. |

Next, the coating liquid for a black matrix (black matrix composition) was blade coated onto the whole area of the photocatalyst-containing layer. As a result, the black matrix composition was repelled by the unexposed areas in the photocatalyst-containing layer and selectively coated only onto the exposed areas. Thereafter, the assembly was dried at 60° C. for 3 min and then exposed to light from a mercury lamp to cure the black matrix composition, followed by heat treatment at 150° C. for 30 min to form a black matrix (corresponding to FIG. 17 (C)).

Formation of Colored Layer

At the outset, each mixture having the following composition was milled and dispersed by means of a triple roll mill, centrifuged at 12,000 rpm, and then filtered through a 1-μm glass filter. 1% by weight of ammonium dichromate as a crosslinking agent was added to the resultant aqueous colored resin solutions to prepare a composition for a red pattern, a composition for a green pattern, and a composition for a blue pattern.

| (Formation of composition for red pattern) | |
|---|---|
| C.I. Pigment Red 168 | 1 pt. wt. |
| 5 wt % aqueous solution of polyvinyl alcohol (average degree of polymerization of polyvinyl alcohol 1750, degree of saponification 88 mol %) | 10 pts. wt. |
| (Formation of composition for green pattern) | |
| C.I. Pigment Green 36 | 1 pt. wt. |
| 5 wt % aqueous solution of polyvinyl alcohol (average degree of polymerization of polyvinyl alcohol 1750, degree of saponification 88 mol %) | 10 pts. wt. |
| (Formation of composition for blue pattern). | |
| C.I. Pigment Blue 60 | 1 pt. wt. |
| 5 wt % aqueous solution of polyvinyl alcohol (average degree of polymerization of polyvinyl alcohol 1750, degree of saponification 88 mol %) | 10 pts. wt. |

Next, a red pattern forming region in the photocatalyst-containing layer with the black matrix formed thereon was irradiated with light at an intensity of 70 mW/cm$^2$ for 50 sec from a mercury lamp (wavelength 365 nm) through a mask having an opening pattern for a colored layer having a size of 150 μm×300 μm so that exposed areas had high critical surface tension (not more than 10° in terms of contact angle with water) (corresponding to FIG. 17 (D)).

The composition for a red pattern was then blade coated onto the whole area of the photocatalyst-containing layer. As a result, the composition for a red pattern was repelled by unexposed areas in the photocatalyst-containing layer and selectively coated only onto exposed areas. The assembly was then dried at 60° C. for 3 min and exposed to light from a mercury lamp to cure the composition for a red pattern, followed by heat treatment at 150° C. for 30 min. Thus, a red pattern was formed (corresponding to FIG. 17 (E)).

Similarly, a green pattern forming region in the photocatalyst-containing layer was irradiated with light, and the composition for a green pattern was selectively coated only onto exposed areas, followed by curing treatment and heat treatment to form a green pattern. Further, similarly, a blue pattern forming region in the photocatalyst-containing layer was irradiated with light, and the composition for a blue pattern was selectively coated only onto exposed areas, followed by curing treatment and heat treatment to form a blue pattern.

Subsequently, a two component mixing type thermosetting agent (SS7265, manufactured by Japan Synthetic Rubber Co., Ltd.) was spin coated as a protective layer onto the colored layer. The coating was cured at 200° C. for 30 min to form a protective layer. Thus, a color filter of the present invention as shown in FIG. 13 was produced (corresponding to FIG. 17 (F)).

Example B-2

Preparation of Composition for Photocatalyst-Containing Layer

A composition for a photocatalyst-containing layer was prepared according to the following formulation.

(Formulation of Composition for Photocatalyst-Containing Layer)

| | |
|---|---|
| Photocatalyst-containing formulation (STS-01, manufactured by Ishihara Sangyo Kaisha Ltd.) | 1 pt. wt. |
| Reactive silicone (KM-768, manufactured by The Shin-Etsu Chemical Co., Ltd) | 0.76 pt. wt. |

| | |
|---|---|
| Catalyst (CAT-PM6A:CAT-PM6B = 4:6, manufactured by The Shin-Etsu Chemical Co., Ltd) | 0.02 pt. wt. |
| Water | 1.34 pts. wt. |

This composition for a photocatalyst-containing layer was spin coated onto a transparent substrate of soda-lime glass. The coating was heat treated at a temperature of 160° C. for 1 min. Thus, a transparent photocatalyst-containing layer (thickness 0.5 μm) with a photocatalyst being strongly fixed in an organopolysiloxane was formed. The photocatalyst-containing layer was pattern-wise exposed to light from a mercury lamp (wavelength 365 nm) at an intensity of 70 mW/cm$^2$ through a mask for 100 sec. The contact angle of exposed areas and unexposed areas with water was measured in the same manner as in Example B-1. As a result, the contact angle of unexposed areas with water was 115°, while the contact angle of exposed areas with water was not more than 10°. This confirms that the exposed areas function as high critical surface tension areas and a pattern can be formed by utilizing a difference in wettability between the exposed areas and the unexposed areas.

Formation of Black Matrix

A photocatalyst-containing layer was formed in the same manner as described above. The photocatalyst-containing layer in its black matrix forming region was irradiated with light from a mercury lamp (wavelength 365 nm) at an intensity of 70 mW/cm$^2$ for 100 sec. The black matrix composition was selectively coated only onto the exposed areas, followed by heat treatment to form a black matrix (corresponding to FIGS. 17 (A) to (C)).

Formation of Colored Layer

Pigment Red 168, Pigment Green 36, and Pigment Blue 60 were provided as pigments. Coating liquids for respective color patterns were prepared using these pigments according to the following formulation.

(Formulation of Compositions for Color Patterns)

| | |
|---|---|
| Pigment | 3 pts. wt. |
| Nonionic surfactant (NIKKOL BO-10TX, manufactured by Nikko Chemicals Co., Ltd.) | 0.05 pt. wt. |
| Polyvinyl alcohol (Shin-Etsu Poval AT, manufactured by The Shin-Etsu Chemical Co., Ltd) | 0.6 pt. wt. |
| Water | 97 pts. wt. |

Next, the whole area of the photocatalyst-containing layer with the black matrix formed thereon was irradiated with light at an intensity of 70 mW/cm$^2$ for 100 sec from a mercury lamp (wavelength 365 nm) so that exposed areas had high critical surface tension (not more than 10° in terms of contact angle with water).

Subsequently, the composition for a red pattern was dropped as dots having a diameter of 120 μm on the center portion of each red pattern forming region surrounded by the black matrix through a nozzle. Similarly, the composition for a green pattern was dropped as dots having a diameter of 120 μm on the center portion of each green pattern forming region surrounded by the black matrix through a nozzle. Further, the composition for a blue pattern was dropped as dots having a diameter of 120 μm on the center portion of each blue pattern forming region surrounded by the black matrix through a nozzle. The compositions for respective color pattern, which had been dropped, were repelled by the black matrix and homogeneously diffused in and selectively deposited onto respective color pattern forming regions having high critical surface tension surrounded by the black matrix. Thereafter, the assembly was heat treated at 100° C. for 45 min. Thus, a colored layer comprising a red pattern, a green pattern, and a blue pattern was formed.

A two component thermosetting agent (SS7265, manufactured by Japan Synthetic Rubber Co., Ltd.) was then spin coated as a protective layer onto the colored layer. The coating was cured at 200° C. for 30 min to form a protective layer. Thus, a color filter of the present invention having a construction as shown in FIG. 13 was produced.

Example B-3

Formation of Photocatalyst-Containing Layer

A composition for a photocatalyst-containing layer as described in Example B-1 was spin coated onto a transparent substrate of soda glass having a black matrix of a thin layer pattern having an opening size of 90 μm×300 μm and a line width of 30 μm. The coated substrate was dried at a temperature of 150° C. for 10 min, permitting hydrolysis and polycondensation to proceed. Thus, a transparent photocatalyst-containing layer (thickness 0.5 μm) with a photocatalyst being strongly fixed in an organopolysiloxane was formed (corresponding to FIG. 18 (A)).

Formation of Colored Layer

Next, the photocatalyst-containing layer was irradiated with light at an intensity of 70 mW/cm$^2$ for 50 sec from a mercury lamp (wavelength 365 nm) through a mask for a red pattern so that exposed areas had high critical surface tension (not more than 10° in terms of contact angle with water (corresponding to FIG. 18 (B)). Separately, 1 g of C.I. Pigment Red 168 was mixed into 10 g of an aqueous solution prepared by diluting an aqueous emulsion silicone (K-768, manufactured by The Shin-Etsu Chemical Co., Ltd.) three times with water. The mixture was milled and dispersed by means of a triple roll mill, centrifuged at 12,000 rpm, and then filtered through a 1-μm glass filter. 0.1 g of a curing catalyst (Catalyst PM-6A:Catalyst PM-6B=4:6 (manufactured by The Shin-Etsu Chemical Co., Ltd.)) was added to the aqueous colored resin solution to prepare a coating liquid (a thermosetting resin composition) for a red pattern.

Next, the composition for a red pattern was bar coated onto the whole area of the photocatalyst-containing layer. As a result, the composition for a red pattern was repelled by the photocatalyst-containing layer in its unexposed areas and selectively deposited only onto exposed areas. Thereafter, the coating was cured at 160° C. for 30 sec. Thus, a red pattern was formed (corresponding to FIG. 18 (C)).

Next, the photocatalyst-containing layer with a red pattern formed thereon was irradiated with light at an intensity of 70 mW/cm$^2$ for 50 sec from a mercury lamp (wavelength 365 nm) through a mask for a blue pattern so that exposed areas had high critical surface tension (not more than 10° in terms of contact angle with water).

Separately, 1 g of C.I. Pigment Blue 60 was mixed into 10 g of an aqueous solution prepared by diluting an aqueous emulsion silicone (K-768, manufactured by The Shin-Etsu Chemical Co., Ltd.) three times with water. A coating liquid (a thermosetting resin composition) for a blue pattern was prepared in the same manner as described above in connection with the coating liquid for a red pattern.

Next, the composition for a blue pattern was bar coated onto the whole area of the photocatalyst-containing layer. As a result, the composition for a blue pattern was repelled by the red pattern areas and the photocatalyst-containing layer in its unexposed areas and selectively deposited only onto exposed areas. Thereafter, the coating was cured at 160° C. for 30 sec. Thus, a blue pattern was formed.

Further, the photocatalyst-containing layer having thereon a red pattern and a blue pattern was irradiated with light at an intensity of 70 mW/cm$^2$ for 50 sec from a mercury lamp (wavelength 365 nm) through a mask for a green pattern so that exposed areas had high critical surface tension (not more than 10° in terms of contact angle with water).

Separately, 1 g of Lionol Green 2Y-301 (manufactured by Toyo Ink Manufacturing Co., Ltd.) was mixed into 10 g of a 10 wt % aqueous solution of polyvinyl alcohol (average degree of polymerization 1750, degree of saponification 88 mol %). The mixture was milled and dispersed by means of a triple roll mill, centrifuged at 12,000 rpm, and then filtered through a 1-μm glass filter. 1% by weight of ammonium dichromate as a crosslinking agent was added to the resultant aqueous colored resin solutions to prepare a coating liquid (a photosensitive resin composition) for a green pattern.

Next, the composition for a green pattern was bar coated onto the whole area of the photocatalyst-containing layer. As a result, the composition for a green pattern was repelled by the red pattern areas, the blue pattern areas, and the photocatalyst-containing layer in its unexposed areas and selectively deposited only onto exposed areas. Thereafter, the assembly was dried at 60° C. for 3 min and then exposed to light from a mercury lamp to cure the composition for a green pattern and, at the same time, to bring the photocatalyst-containing layer to a high critical surface tension state. Subsequently, heat treatment was carried out at 150° C. for 30 min to form a green pattern.

Next, a two component thermosetting agent (SS7265, manufactured by Japan Synthetic Rubber Co., Ltd.) was spin coated as a protective layer onto the colored layer. The coating was cured at 200° C. for 30 min to form a protective layer. Thus, a color filter of the present invention having a construction as shown in FIG. 14 was produced.

Example B-4

Formation of Photocatalyst-Containing Layer

A composition for a photocatalyst-containing layer as described in Example B-1 was spin coated onto a transparent substrate of soda glass having a black matrix of a thin layer pattern of chromium having an opening size of 140 μm×260 μm and a line width of 30 μm. The coated substrate was dried at a temperature of 150° C. for 10 min, permitting hydrolysis and polycondensation to proceed. Thus, a transparent photocatalyst-containing layer (thickness 0.5 μm) with a photocatalyst being strongly fixed in an organopolysiloxane was formed (corresponding to FIG. 18 (A)).

Formation of Colored Layer

Next, a mask having a light shielding pattern (pattern pitch 155 μm×275 μm) with the line width (20 μm) being smaller than the line width (30 μm) of the black matrix was registered with the black matrix, and the photocatalyst-containing layer was irradiated with light from a mercury lamp (wavelength 365 nm) through the mask at an intensity of 70 mW/cm$^2$ for 50 see so that exposed areas had high critical surface tension (not more than 10° in terms of contact angle with water) (see FIG. 19).

Each of the exposed areas (high critical surface tension areas) had a size of 150 μm×270 μm, and the unexposed areas existed in a width of 20 μm on the black matrix.

Pigment Red 168, Pigment Green 36, and Pigment Blue 60 were then provided as pigments. Coating liquids for respective color patterns were prepared using these pigments according to the following formulation.

(Formulation of Compositions for Color Patterns)

| | |
|---|---|
| Pigment | 3 pts. wt. |
| Nonionic surfactant (NIKKOL BO-10TX, manufactured by Nikko Chemicals Co., Ltd.) | 0.05 pt. wt. |
| Polyvinyl alcohol (Shin-Etsu Poval AT, manufactured by The Shin-Etsu Chemical Co., Ltd) | 0.6 pt. wt. |
| Water | 97 pts. wt. |

Subsequently, the composition for a red pattern was dropped as dots having a diameter of 120 μm on the center portion of each red pattern forming region surrounded by the black matrix through a nozzle. Similarly, the composition for a green pattern was dropped as dots having a diameter of 120 μm on the center portion of each green pattern forming region surrounded by the black matrix through a nozzle. Further, the composition for a blue pattern was dropped as dots having a diameter of 120 μm on the center portion of each blue pattern forming region surrounded by the black matrix through a nozzle. The compositions for respective color patterns, which had been dropped, were repelled by the unexposed areas on the black matrix and homogeneously diffused in and selectively deposited onto respective color pattern forming regions having high critical surface tension surrounded by the black matrix. Thereafter, the assembly was heat treated at 100° C. for 45 min. Thus, a colored layer comprising a red pattern, a green pattern, and a blue pattern was formed.

A two component thermosetting agent (SS7265, manufactured by Japan Synthetic Rubber Co., Ltd.) was then spin coated as a protective layer onto the colored layer. The coating was cured at 200° C. for 30 min to form a protective layer. Thus, a color filter of the present invention having a construction as shown in FIG. 14 was produced.

Example B-5

Formation of Photocatalyst-Containing Layer

A composition for a photocatalyst-containing layer as described in Example B-1 was spin coated onto a transparent substrate of soda glass having a black matrix of a thin layer pattern having an opening size of 90 μm×300 μm and a line width of 30 μm. The coated substrate was dried at a temperature of 150° C. for 10 min, permitting hydrolysis and polycondensation to proceed. Thus, a transparent photocatalyst-containing layer (thickness 0.5 μm) with a photocatalyst being strongly fixed in an organopolysiloxane was formed.

Formation of Colored Layer

Pigment Red 168, Pigment Green 36, and Pigment Blue 60 were first provided as pigments. Each mixture having the following composition was milled and dispersed by means of a triple roll mill, centrifuged at 12,000 rpm, and then filtered through a 1-μm glass filter. 1% by weight of ammonium dichromate as a crosslinking agent was added to the resultant aqueous colored resin solutions to prepare a coating liquid for a red pattern, a coating liquid for a green pattern, and a coating liquid for a blue pattern (photosensitive resin compositions).

(Formulation of Mixtures)

| | |
|---|---|
| Pigment | 1 pt. wt. |
| 10 wt % aqueous solution of polyvinyl alcohol (average degree of polymerization of polyvinyl alcohol 1750, degree of saponification 88 mol %) | 10 pts. wt. |

A photocatalyst-containing layer was formed onto the photocatalyst-containing layer with a black matrix formed thereon in the same manner as in Example B-1. The photocatalyst-containing layer was irradiated with light from a mercury lamp (wavelength 365 nm) at an intensity of 70 mW/cm² for 50 sec through a mask for a red pattern to bring exposed areas to a high critical surface tension state (not more than 10° in terms of contact angle with water) (corresponding to FIG. 20 (A)).

Next, the composition for a red pattern was bar coated onto the whole area of the photocatalyst-containing layer. As a result, the composition for a red pattern was repelled by the photocatalyst-containing layer in its unexposed areas and selectively deposited only onto exposed areas. Thereafter, the assembly was dried at 60° C. for 3 min and then exposed to light from a mercury lamp to cure the composition for a red pattern. Subsequently, heat treatment was carried out at 150° C. for 30 min to form a red pattern (corresponding to FIG. 20 (B)).

Similarly, a photocatalyst-containing layer was formed onto the photocatalyst-containing layer with a red pattern formed thereon in the same manner as in Example B-1. The photocatalyst-containing layer in its green pattern forming region was irradiated with light (corresponding to FIG. 20 (C)), and the composition for a green pattern was coated and selectively deposited only onto exposed areas, followed by curing treatment and heat treatment to form a green pattern (corresponding to FIG. 20 (D)).

Further, a photocatalyst-containing layer was formed onto the photocatalyst-containing layer with a green pattern formed thereon in the same manner as in Example B-1. The photocatalyst-containing layer in its blue pattern forming region was irradiated with light, and the composition for a blue pattern was coated and selectively deposited only onto exposed areas, followed by curing treatment and heat treatment to form a blue pattern.

Next, a two component thermosetting agent (SS7265, manufactured by Japan Synthetic Rubber Co., Ltd.) was spin coated as a protective layer onto the colored layer. The coating was cured at 200° C. for 30 min to form a protective layer. Thus, a color filter of the present invention having a construction as shown in FIG. 15 was produced (corresponding to FIG. 20 (E)).

Example B-6

Formation of Black Matrix

A photocatalyst-containing layer was formed in the same manner as in Example B-1. The photocatalyst-containing layer in its black matrix forming region was irradiated with light. The black matrix composition was coated and selectively deposited onto the exposed areas, followed by heat treatment to form a black matrix (corresponding to FIGS. 21 (A) to (B)).

Formation of Colored Layer

Pigment Red 168, Pigment Green 36, and Pigment Blue 60 were first provided as pigments. Each mixture having the following composition was milled and dispersed by means of a triple roll mill, centrifuged at 12,000 rpm, and then filtered through a 1-μm glass filter. 1% by weight of ammonium dichromate as a crosslinking agent was added to the resultant aqueous colored resin solutions to prepare a coating liquid for a red pattern, a coating liquid for a green pattern, and a coating liquid for a blue pattern (photosensitive resin compositions).

(Formulation of Mixtures)

| | |
|---|---|
| Pigment | 1 pt. wt. |
| 10 wt % aqueous solution of polyvinyl alcohol (average degree of polymerization of polyvinyl alcohol 1750, degree of saponification 88 mol %) | 10 pts. wt. |

A photocatalyst-containing layer was then formed onto the photocatalyst-containing layer with a black matrix formed thereon in the same manner as in Example B-1. The photocatalyst-containing layer was irradiated with light from a mercury lamp (wavelength 365 nm) at an intensity of 70 mW/cm² for 50 see through a mask for a red pattern to bring exposed areas to a high critical surface tension state (not more than 10° in terms of contact angle with water) (corresponding to FIG. 21 (C)).

Next, the composition for a red pattern was bar coated onto the whole area of the photocatalyst-containing layer. As a result, the composition for a red pattern was repelled by the photocatalyst-containing layer in its unexposed areas and selectively deposited only onto exposed areas. Thereafter, the assembly was dried at 60° C. for 3 min and then exposed to light from a mercury lamp to cure the composition for a red pattern. Subsequently, heat treatment was carried out at 150° C. for 30 min to form a red pattern (corresponding to FIG. 21 (D)).

Similarly, a photocatalyst-containing layer was formed onto the photocatalyst-containing layer with a red pattern formed thereon in the same manner as in Example B-1. The photocatalyst-containing layer in its green pattern forming region was irradiated with light, and the composition for a green pattern was coated and selectively deposited only onto exposed areas, followed by curing treatment and heat treatment to form a green pattern. Further, a photocatalyst-containing layer was formed onto the photocatalyst-containing layer with a green pattern formed thereon in the same manner as in Example B-1. The photocatalyst-containing layer in its blue pattern forming region was irradiated with light, and the composition for a blue pattern was coated and selectively deposited only onto exposed areas, followed by curing treatment and heat treatment to form a blue pattern.

Next, a two component thermosetting agent (SS7265, manufactured by Japan Synthetic Rubber Co., Ltd.) was spin coated as a protective layer onto the colored layer. The coating was cured at 200° C. for 30 min to form a protective layer. Thus, a color filter of the present invention having a construction as shown in FIG. 16 was produced (corresponding to FIG. 21 (E)).

Example B-7

Formation of Black Matrix

A photocatalyst-containing layer was first formed in the same manner as in Example B-1. The photocatalyst-containing layer in its black matrix forming region was irradiated with light. The black matrix composition was coated and selectively deposited onto the exposed areas, followed by heat treatment to form a black matrix.

Formation of Colored Layer

A photocatalyst-containing layer was formed onto the photocatalyst-containing layer with a black matrix formed thereon in the same manner as in Example B-1. The photocatalyst-containing layer thus formed was then irradiated with light from a mercury lamp (wavelength 365 nm) at an intensity of 70 mW/cm² for 90 sec through a mask having an opening portion (rectangular opening having a size of 23 μm×12 μm) to bring exposed areas to a high critical surface tension state (not more than 10° in terms of contact angle with water).

A thin layer of a perylene pigment having a chemical structure represented by formula B-2 was vacuum deposited onto the photocatalyst-containing layer under conditions of degree of vacuum 1×10⁻⁵ Torr and deposition rate 10 Å/sec to form a thin layer of a red pigment on the whole area of the photocatalyst-containing layer.

The surface of the thin layer of a red pigment was washed with acetone. As a result, the thin layer of the red pigment was separated only from the unexposed areas due to the difference between the adhesion of the red pigment to the exposed areas and the adhesion of the red pigment to the unexposed areas in the photocatalyst-containing layer. Thus, a rectangular (23 μm×12 μm) red pattern constituted by a thin layer (layer thickness 0.4 μm) of a red pigment could be formed on the exposed areas.

Formula B-2

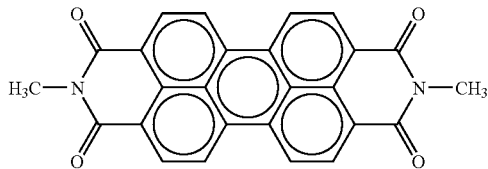

Example B-8

Formation of Black Matrix

A photocatalyst-containing layer was first formed in the same manner as in Example B-1. The photocatalyst-containing layer in its black matrix forming region was irradiated with light. The black matrix composition was coated and selectively deposited onto the exposed areas, followed by heat treatment to form a black matrix.

Formation of Colored Layer

A photocatalyst-containing layer was formed onto the photocatalyst-containing layer with a black matrix formed thereon in the same manner as in Example B-1. The photocatalyst-containing layer thus formed was then irradiated with light from a mercury lamp (wavelength 365 nm) at an intensity of 70 mW/cm² for 90 sec through a mask having an opening portion (rectangular opening having a size of 23 μm×12 μm) to bring exposed areas to a high critical surface tension state (not more than 10° in terms of contact angle with water).

A thin layer of a perylene pigment having a chemical structure represented by formula B-3 was vacuum deposited onto the photocatalyst-containing layer under conditions of degree of vacuum 1×10⁻⁵ Torr and deposition rate 10 Å/sec to form a thin layer of a blue pigment on the whole area of the photocatalyst-containing layer.

The surface of the thin layer of a blue pigment was washed with methanol. As a result, the thin layer of the blue pigment was separated only from the unexposed areas due to the difference between the adhesion of the blue pigment to the exposed areas and the adhesion of the blue pigment to the unexposed areas in the photocatalyst-containing layer. Thus, a rectangular (23 μm×12 μm) blue pattern constituted by a thin layer (layer thickness 0.4 μm) of a blue pigment could be formed on the exposed areas.

Formula B-3

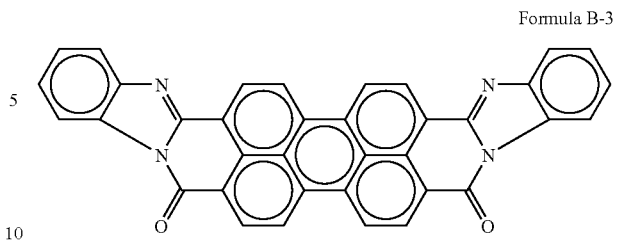

The following examples demonstrate use of an organic polymer resin layer as the wettability-variable component layer.

Example B-9

Formation of Organic Polymer-Containing Layer

Polycarbonate (Iupilon Z400, manufactured by Mitsubishi Gas Chemical Co., Ltd.) was dissolved in a 3:2 mixed liquid of dichloromethane and 1,1,2-trichloroethane to prepare a polycarbonate solution having a solid content of 10% by weight.

The polycarbonate solution was then coated onto a transparent substrate provided with a black matrix of a thin layer pattern of chromium having an opening size of 140 μm×260 μm and a line width of 30 μm to a thickness of 100 μm. The coating was leveled for 15 min and dried at 80° C. for 120 min to form an organic polymer resin layer as a wettability-variable component layer. The contact angle of the organic polymer resin layer with water was measured in the same manner as in Example B-1 and found to be 85° C.

Formation of Colored Layer

Next, a photomask having a light shielding pattern (pattern pitch 155 μm×275 μm) with the line width (20 μm) being smaller than the line width (30 μm) of the black matrix was registered with the black matrix through an organic polymer resin layer, and the organic polymer resin layer was exposed to light from an excimer lamp (an excimer lamp 172, exposure wavelength 172 nm, manufactured by Heleus) at an output of 90 W for 10 sec through this photomask to create surface roughening. Thus, exposed areas were brought to a high critical surface tension (not more than 20° in terms of contact angle with water).

Each of the exposed areas (high critical surface tension areas) had a size of 150 μm×270 μm, and the unexposed areas existed in a width of 20 μm on the black matrix.

Pigment Red 168, Pigment Green 36, and Pigment Blue 60 were then provided as pigments. Coating liquids for respective color patterns were prepared using these pigments according to the same formulation as used in Example B-4.

Subsequently, the composition for a red pattern was dropped as dots having a diameter of 90 μm on the center portion of each red pattern forming region surrounded by the black matrix through a nozzle. Similarly, the composition for a green pattern was dropped as dots having a diameter of 90 μm on the center portion of each green pattern forming region surrounded by the black matrix through a nozzle. Further, the composition for a blue pattern was dropped as dots having a diameter of 90 μm on the center portion of each blue pattern forming region surrounded by the black matrix through a nozzle. The compositions for respective color patterns, which had been dropped, were repelled by unexposed areas on the black matrix and homogeneously diffused in and selectively deposited in respective color pattern forming regions having high critical surface tension surrounded by the black matrix.

Thereafter, the assembly was heat treated at 100° C. for 45 min. Thus, a colored layer comprising a red pattern, a green pattern, and a blue pattern was formed.

A two component thermosetting agent (SS7265, manufactured by Japan Synthetic Rubber Co., Ltd.) was then spin coated as a protective layer onto the colored layer. The coating was cured at 200° C. for 30 min to form a protective layer. Thus, a color filter of the present invention having a construction as shown in FIG. 14 was produced.

(Evaluation)

The color filters prepared in Examples B-1 to B-9 were observed under an optical microscope. As a result, the black matrix and the colored layer were free from discoloration, color mixing, dropouts, and uneven color and other defects.

As is apparent from the foregoing detailed description, according to the second invention B, the wettability by the composition for a light shielding layer and the composition for a colored layer is higher in areas having specific wettability, and, upon supply of the composition for a light shielding layer and the composition for a colored layer, the composition for a light shielding layer and the composition for a colored layer are selectively and surely deposited only onto the areas having specific wettability, while they are repelled by the other areas. This makes it possible to form a light shielding layer and a colored layer with high accuracy, which in turn can realize the provision of high resolution color filters. Further, the coating compositions are selectively deposited only onto areas where the light shielding layer and the colored layer are to be formed. Therefore, the materials can be efficiently used, and the step of development and washing and the step of treating waste water are unnecessary. This simplifies the process. Further, using a photocatalyst-containing layer or an organic polymer resin layer as the wettability-variable component layer for specific wettability areas enhances the critical surface tension of exposed areas through photocatalytic action to bring the exposed areas to a high critical surface tension state (to form areas having specific wettability), or roughens the surface through a reduction in molecular weight as a result of cleavage of a polymer chain to bring the exposed areas to a high critical surface tension (to form areas having specific wettability), while the low critical surface tension of the unexposed areas remained unchanged. Upon supply of the composition for a light shielding layer and the composition for a colored layer onto the photocatalyst-containing layer or the organic polymer resin layer, the composition for a light shielding layer and the composition for a colored layer are repelled by the unexposed areas and are selectively and surely deposited only onto the exposed areas having high wettability (high critical surface tension areas).

Example C-1

(Photocatalyst-Containing Layer) (For Waterless Printing)

3 g of isopropyl alcohol, 0.4 g of an organosilane (TSL8113, manufactured by Toshiba Silicone Co., Ltd.), 0.3 g of a fluoroalkylsilane (MF-160E, manufactured by Tohchem Products Corporation), and 2 g of an inorganic coating composition for a photocatalyst (ST-K01, manufactured by Ishihara Sangyo Kaisha Ltd.). This composition for a photocatalyst-containing layer was spin coated onto a transparent substrate of quartz glass. The coating was dried at a temperature of 150° C. for 10 min, permitting hydrolysis and polycondensation to proceed. Thus, a transparent photocatalyst-containing layer (thickness 0.2 μm) with a photocatalyst being strongly fixed in an organopolysiloxane was formed. The photocatalyst-containing layer was pattern-wise exposed to light from a mercury lamp at an intensity of 70 mW/cm$^2$ through a mask for 50 sec. The contact angle of exposed areas and unexposed areas with water was measured with a contact angle goniometer (Model CA-Z, manufactured by Kyowa Interface Science Co., Ltd.). As a result, the contact angle of the unexposed areas with water was 142°, while the contact angle of the exposed areas with water was not more than 10°. Thus, a pattern was formed by utilizing a difference in wettability between the exposed areas and the unexposed areas.

Example C-2

(Microlens) (Waterless) (Coating)

The photocatalyst-containing layer described in Example C-1 was spin coated onto a transparent substrate of quartz glass. The coating was exposed at an intensity of 70 mW/cm$^2$ from a mercury lamp for 90 sec through a negative-working photomask having a circular pattern with several openings having a diameter of 50 μm being arranged at intervals of 2 μm in to prepare a transparent substrate having thereon a circular pattern having high wettability. 1000 g of a water-soluble UV curable resin (AQ-9, ester acrylate resin, manufactured by Arakawa Chemical Industries, Ltd.), 50 g of a curing initiator (Irgacure 1173, manufactured by Ciba Specialty Chemicals, K.K.), and 125 g of distilled water (manufactured by Junsei Chemical Corporation) were mixed together, and the mixture was stirred for 3 min. The mixed liquid was coated by bead coating (slide coating) onto the transparent substrate having thereon a circular pattern utilizing a difference in wettability to a thickness of 12 μm. As a result, the mixed liquid was selectively deposited onto the exposed areas (circular pattern areas). The assembly was then exposed at an intensity of 70 mW/cm$^2$ from a mercury lamp for 5 sec to prepare an array of microlenses having a diameter of 50 μm and a focal length of 1 mm.

Example C-3

(Microlens) (Waterless) (Ejection)

The photocatalyst-containing layer described in Example C-1 was spin coated onto a transparent substrate of quartz glass. The coating was exposed at an intensity of 70 mW/cm$^2$ from a mercury lamp for 90 sec through a negative-working photomask having a circular pattern with a plurality of openings having a diameter of 200 μm being arranged at intervals of 100 μm. Thus, a transparent substrate having thereon a circular pattern having high wettability was prepared.

1000 g of a water-soluble UV curable resin (AQ-11, ester acrylate resin, manufactured by Arakawa Chemical Industries, Ltd.), 50 g of a curing initiator (Irgacure 184, manufactured by Ciba Specialty Chemicals, K.K.), and 25 g of distilled water (manufactured by Junsei Chemical Corporation) were mixed together, and the mixture was stirred for 3 min. The mixed liquid was ejected in an amount of 0.0001 ml on the center of the circular pattern portion on the transparent substrate having a circular pattern utilizing a difference in wettability by a liquid precision constant rate ejection apparatus (Dispenser 1500XL-15, manufactured by EFD). As a result, the ejected liquid was spread only onto the circular pattern portion without spreading onto the other areas. The assembly was then exposed at an intensity of 70 mW/cm$^2$ from a mercury lamp for 10 sec to prepare an array of microlenses having a diameter of 200 μm and a focal length of 500 μm.

Example C-4

(Photocatalyst-Containing Layer) (Dampening Water)

3 g of isopropyl alcohol, 4.2 g of an organosilane (TSL8113, manufactured by Toshiba Silicone Co., Ltd.), and 0.2 g of a titanium oxide powder (ST-01, average particle diameter 7 nm, manufactured by Ishihara Sangyo Kaisha Ltd.) were mixed together. The mixture was stirred for 20 min while maintaining the temperature at 100° C. The resultant dispersion was spin coated onto a transparent substrate of quartz-glass. The coating was dried at a temperature of 150° C. for 10 min, permitting hydrolysis and polycondensation to proceed. Thus, a 0.2 μm-thick layer was formed. The layer was irradiated with ultraviolet light from a higher pressure mercury lamp at an intensity of 70 mW/cm$^2$ for 50 sec. The contact angle of the sample with water and n-octane was measured with a contact angle goniometer (Model CA-Z, manufactured by Kyowa Interface Science Co., Ltd.). As a result, before the irradiation, the contact angle was 72° for water and not more than 5° for n-octane, while after the irradiation, the contact angle was 0° for water and not more than 5° for n-octane.

Example C-5

(Microlens) (Dampening Water) (Ejection)

The photocatalyst-containing layer described in Example C-4 was spin coated onto a transparent substrate of quartz glass. The coating was exposed at an intensity of 70 mW/cm$^2$ from a mercury lamp for 90 sec through a positive-working photomask having a square pattern with a plurality of openings having a size of 200 μm×200 μm being arranged at intervals of 100 μm. Thus, a transparent substrate having thereon a square pattern utilizing a difference in wettability was prepared. A solution (dampening water) prepared by mixing 10 g of a clean etch liquid manufactured by Nikken Chemicals Co., Ltd. and 190 g of distilled water (manufactured by Junsei Chemical Corporation) together was spin coated onto the transparent substrate having a square pattern utilizing a difference in wettability. As a result, the mixed liquid was coated only onto exposed areas (areas other than the square pattern).

1000 g of UV curable resin (Beam Set 267, acrylic resin, manufactured by Arakawa Chemical Industries, Ltd.) and 50 g of a curing initiator (Irgacure 184, manufactured by Ciba Specialty Chemicals, K.K.) were mixed together, and the mixture was stirred for 3 min. The mixed liquid was ejected in an amount of 0.0001 ml on the center of the square pattern portion not coated with the clean etch liquid in the transparent substrate by a liquid precision constant rate ejection apparatus (Dispenser 1500XL-15, manufactured by EFD). As a result, the ejected liquid was spread only onto the square pattern portion without spreading onto the other areas. The assembly was then exposed at an intensity of 70 mW/cm$^2$ from a mercury lamp for 10 sec to prepare an array of microlenses having a square bottom of 200 μm×200 μm and a focal length of 500 μm.

Example C-6

(Colored Microlens) (Waterless) (Ejection)

The photocatalyst-containing layer described in Example C-1 was spin coated onto a transparent substrate of quartz glass. The coating was exposed at an intensity of 70 mW/cm$^2$ from a mercury lamp for 90 sec through a negative-working photomask having a circular pattern with a plurality of openings having a diameter of 200 μm being arranged at intervals of 100 μm. Thus, a transparent substrate having thereon a circular pattern having high wettability was prepared.

10 g of a water-soluble UV curable resin (AQ-11, ester acrylate resin, manufactured by Arakawa Chemical Industries, Ltd.), 0.5 g of a curing initiator (Irgacure 184, manufactured by Ciba Specialty Chemicals, K.K.), 1.25 g of distilled water, and 0.5 g of a red dye (Rose Bengal, manufactured by Tokyo Chemical Industry Co., Ltd.) were mixed together. The mixture was stirred for 3 min to prepare a composition for a red lens.

10 g of a water-soluble UV curable resin (AQ-11, ester acrylate resin, manufactured by Arakawa Chemical Industries, Ltd.), 0.5 g of a curing initiator (Irgacure 184, manufactured by Ciba Specialty Chemicals, K.K.), 1.25 g of distilled water, and 0.5 g of a green dye (Brilliant Green, manufactured by Tokyo Chemical Industry Co., Ltd.) were mixed together. The mixture was stirred for 3 min to prepare a composition for a green lens.

10 g of a water-soluble UV curable resin (AQ-11, ester acrylate resin, manufactured by Arakawa Chemical Industries, Ltd.), 0.5 g of a curing initiator (Irgacure 184, manufactured by Ciba Specialty Chemicals, K.K.), 1.25 g of distilled water, and 0.5 g of a blue dye (Victoria Blue, manufactured by Tokyo Chemical Industry Co., Ltd.) were mixed together. The mixture was stirred for 3 min to prepare a composition for a blue lens.

The compositions for lenses were ejected in an amount of 0.0001 ml on the center of the circular pattern portion, specified for red, green, and blue, on the transparent substrate having a circular pattern utilizing a difference in wettability by a liquid precision constant rate ejection apparatus (Dispenser 1500XL-15, manufactured by EED). As a result, the ejected liquid was spread only onto the circular pattern portion without spreading onto the other areas. The assembly was then exposed at an intensity of 70 mW/cm$^2$ from a mercury lamp for 10 sec to prepare an array of colored microlenses having a diameter of 200 μm and a focal length of 500 μm.

Example C-7

(Colored Microlens) (Waterless) (Coating)

The photocatalyst-containing layer described in Example C-1 was spin coated onto a transparent substrate of quartz glass. The coating was exposed at an intensity of 70 mW/cm$^2$ from a mercury lamp for 90 sec through a negative-working photomask having a circular pattern with a plurality of openings having a diameter of 200 μm being arranged at intervals of 100 μm in the longitudinal direction and at intervals of 700 μm in the lateral direction. Thus, a transparent substrate having thereon a circular pattern having high wettability was prepared.

10 g of a water-soluble UV curable resin (AQ-9, ester acrylate resin, manufactured by Arakawa Chemical Industries, Ltd.), 0.5 g of a curing initiator (Irgacure 1173, manufactured by Ciba Specialty Chemicals, K.K.), 1.25 g of distilled water, and 0.5 g of a red dye (Rose Bengal, manufactured by Tokyo Chemical Industry Co., Ltd.) were mixed together. The mixture was stirred for 3 min to prepare a composition for a red lens.

10 g of a water-soluble UV curable resin (AQ-9, ester acrylate resin, manufactured by Arakawa Chemical Industries, Ltd.), 0.5 g of a curing initiator (Irgacure 1173, manufactured by Ciba Specialty Chemicals, K.K.), 1.25 g of distilled water, and 0.5 g of a green dye (Brilliant Green, manufactured by Tokyo Chemical Industry Co., Ltd.) were mixed together. The mixture was stirred for 3 min to prepare a composition for a green lens.

10 g of a water-soluble UV curable resin (AQ-9, ester acrylate resin, manufactured by Arakawa Chemical Industries, Ltd.), 0.5 g of a curing initiator (Irgacure 1173, manufactured by Ciba Specialty Chemicals, K.K.), 1.25 g of distilled water, and 0.5 g of a blue dye (Victoria Blue, manufactured by Tokyo Chemical Industry Co., Ltd.) were mixed together. The mixture was stirred for 3 min to prepare a composition for a blue lens.

The composition for a red lens was dip coated onto a transparent substrate having thereon a circular pattern utilizing a difference in wettability to a thickness of 12 µm. As a result, the mixed liquid was deposited only onto the exposed areas (circular pattern areas). The assembly was exposed to light from a mercury lamp at an intensity of 70 mW/cm$^2$ for 10 sec to cure the coating.

A photocatalyst-containing layer was formed on the substrate having thereon a red lens in the same manner as described above. A circular pattern having high wettability was formed while leaving a space of 100 µm from the longitudinal column of the red lens in the same manner as described above. A green lens was formed in the same manner as described above in connection with the formation of the red lens, except that the composition for a green lens was used.

The above procedure was repeated, except that a composition for a blue lens was used. As a result, a blue lens was formed between the longitudinal columns of red and green while leaving a space of 100 µm from the longitudinal columns of red and green. Thus, an array of color microlenses having a diameter of 200 µm and a focal length of 1 mm.

Example C-8

(Light Shielding Layer) (Waterless) (Coating)

The photocatalyst-containing layer described in Example C-1 was formed on the backside of the quartz glass as the substrate for an array of microlenses having a diameter of 100 µm and arranged at intervals of 10 µm. Next, a photomask with openings having a diameter of 10 µm and arranged at intervals of 100 µm was registered with the lenses, followed by pattern-wise exposure to light from a mercury lamp.

4 g of carbon black (#950, Mitsubishi Chemical Corporation), 0.7 g of polyvinyl alcohol (Gosenol AH-26, Nippon Synthetic Chemical Industry Co., Ltd.), and 95.3 g of ion-exchanged water were mixed together while heating at 90° C. to prepare a solution which was then centrifuged at 12000 rpm and filtered through a 1-µm glass filter to prepare a composition for a light shielding layer. The composition for a light shielding layer was blade coated onto the whole area of the exposed photocatalyst-containing layer. As a result, the composition was repelled by unexposed areas and selectively deposited only onto exposed areas. The coating was then heated at 150° C. for 30 min to form a light shielding layer.

Example C-9

(Light Shielding Layer) (Waterless) (Ejection)

The photocatalyst-containing layer described in Example C-1 was formed on the backside of the quartz glass as the substrate for an array of microlenses having a diameter of 700 µm and arranged at intervals of 10 µm. Next, a photomask with openings having a diameter of 10 µm and arranged at intervals of 700 µm was registered with the lenses, followed by pattern-wise exposure to light from a mercury lamp.

Next, the composition for a light shielding layer described in Example C-8 was ejected by means of a dispenser (manufactured by EFD) onto the exposed areas to deposit the composition for a light shielding layer only onto exposed areas. The assembly was then heated at 150° C. for 30 min to form a light shielding layer.

Example C-10

(Light Shielding Layer) (Dampening Water) (Coating)

The photocatalyst-containing layer described in Example C-4 was formed on the backside of the quartz glass as the substrate for an array of microlenses having a diameter of 100 µm and arranged at intervals of 10 µm. Next, a photomask with light shielding areas having a diameter of 10 µm and arranged at intervals of 100 µm was registered with the lenses, followed by pattern-wise exposure to light from a mercury lamp.

Dampening water (a liquid prepared by diluting a clean etch liquid 20 times with water, manufactured by Nikken Chemicals Co., Ltd.) was blade coated onto the whole area. As a result, the dampening water selectively wet only exposed areas.

A printing ink (ACROS (EIKUROSU) Black, manufactured by The Inctec Inc.) was roll coated at 30 rpm onto the whole area. As a result, the ink was selectively deposited only onto unexposed areas. The coating was heated at 100° C. for 3 min to remove the dampening water. Thus, a light shielding layer was formed.

Example C-11

(Light Shielding Layer) (Dampening Water) (Ejection)

The photocatalyst-containing layer described in Example C-4 was formed on the backside of the quartz glass as the substrate for an array of microlenses having a diameter of 700 µm and arranged at intervals of 10 µm. Next, a photomask with light shielding areas having a diameter of 10 µm and arranged at intervals of 700 µm was registered with the lenses, followed by pattern-wise exposure to light from a mercury lamp.

Dampening water (a liquid prepared by diluting a clean etch liquid 20 times with water, manufactured by Nikken Chemicals Co., Ltd.) was blade coated onto the whole area. As a result, the dampening water selectively wet only exposed areas.

A solution prepared by diluting a printing ink (ACROS (EIKUROSU) Black, manufactured by The Inctec Inc.) three times with n-hexadecane was ejected by means of a dispenser (manufactured by EFD) onto unexposed areas to deposit the printing ink only onto the unexposed areas. The assembly was then heated at 100° C. for 30 min to remove the dampening water. Thus, a light shielding layer was formed.

Example C-12

(Microlens) (Ejection) (Variation in Focal Length by Varying Amount of Ejection: Comparative Example)

The photocatalyst-containing layer described in Example C-1 was spin coated onto a transparent substrate of quartz glass. The coating was exposed at an intensity of 70 mW/cm$^2$ from a mercury lamp for 90 sec through a mask having a circular pattern with the diameter of the opening being 9 mm. Thus, a transparent substrate having thereon a circular pattern having high wettability was prepared.

1000 g of a water-soluble UV curable resin (AQ-7, ester acrylate resin, manufactured by Arakawa Chemical Industries, Ltd.), 50 g of a curing initiator (Irgacure 184, manufactured by Ciba Specialty Chemicals, K.K.), and 25 g of distilled water (manufactured by Junsei Chemical Corporation) were mixed together. The mixture was stirred for 3 min. The mixed liquid was ejected in an amount of 15 to 55 µL through a microsyringe onto the center of the circular pattern portion on the transparent substrate having thereon the circular pattern utilizing a difference in wettability. As a result, the ejected liquid was spread only onto the circular pattern portion and was not spread onto the other areas. The larger the amount of the liquid dropped, the larger the contact angle with the substrate. The assembly was exposed to light from a mercury lamp at an intensity of 70 mW/cm² for 10 sec to cure the coating. Thus, lenses having a diameter of 9 mm and a focal length of 27 to 90 mm could be designed and prepared by varying the amount of the resin mixed liquid ejected.

For comparison, the resin mixed liquid was ejected in an amount of 15 to 55 µL onto a transparent substrate of quartz glass not having a photocatalyst-containing layer (a substrate not having a wettable pattern). In this case, ejection of the liquid in a larger amount resulted in wetting in a larger area and unstable shape in wetted area, that is, various shapes in wetted area. Further, the contact angle of the liquid with the substrate remained unchanged when the amount of the liquid ejected was increased. The assembly was exposed to light from a mercury lamp at an intensity of 70 mW/cm² for 10 sec. The lenses thus obtained had uncontrolled shape, diameter, and focal length. The contact angle of the liquid with the substrate and the diameter and focal length of the resultant lenses as a function of the amount of the resin solution (composition for a lens) ejected are shown in the following table.

| Among of resin mixed liquid dropped (µL) | Contact angle of liquid with substrate (°) | Radius of lens (mm) | Focal length of lens (mm) |
|---|---|---|---|
| Substrate with a wettable pattern formed thereon | | | |
| 15.0 | 12.4 | 9.0 | 90.4 |
| 20.0 | 16.3 | 9.0 | 52.0 |
| 30.0 | 19.5 | 9.0 | 46.3 |
| 40.0 | 22.6 | 9.0 | 40.3 |
| 50.0 | 33.4 | 9.0 | 31.2 |
| 55.0 | 38.4 | 9.0 | 27.8 |
| Substrate with a wettable pattern not formed thereon | | | |
| 15.0 | 18.9 | 8.0 | 70.0 |
| 20.0 | 22.6 | 7.0 | 68.3 |
| 30.0 | 18.4 | 9.0 | 70.5 |
| 40.0 | 24.1 | 10.0 | 66.5 |
| 50.0 | 22.6 | 11.0 | 68.0 |
| 55.0 | 22.6 | 12.0 | 68.0 |

According to the third invention C, there is provided a process for simply producing a lens that, particularly in the production of microlenses and an array of microlenses, can provide high positional accuracy and shape accuracy and can produce microlenses, and facilitates the regulation of the local length. Further, a simple process for forming a light shielding layer of lenses can be also provided.

Example D-1

3 g of isopropyl alcohol, 0.4 g of an organosilane (TSL8113, manufactured by Toshiba Silicone Co., Ltd.), 0.15 g of a fluoroalkylsilane (MF-160E, manufactured by Tohchem Products Corporation), and 2 g of a titanium oxide coating composition for a photocatalyst (ST-K01, manufactured by Ishihara Sangyo Kaisha Ltd.) were mixed together. The resultant dispersion was stirred for 20 min while maintaining the temperature at 100° C. to prepare a composition for a photocatalyst-containing layer. The composition was spin coated onto a 0.15 mm-thick polyester film. The coated polyester was dried at 130° C. for 10 min, permitting hydrolysis and polycondensation to proceed. Thus, a photocatalyst-containing layer with a photocatalyst being strongly fixed in an organopolysiloxane was obtained.

The photocatalyst layer was exposed to light from a mercury lamp (HI-40N, manufactured by Japan Storage Battery Co., Ltd.) at an intensity of 70 mW/cm² (365 nm) for 50 sec through a gradation negative-working mask having halftone dots of 2 to 98% with 175 lines/in.

After the exposure, the contact angle of the photocatalyst-containing layer with water was not more than 5° for exposed areas and 107° for unexposed areas.

Next, the following silicone rubber composition was roll coated at 400 m/min onto the exposed photocatalyst-containing layer.

| | |
|---|---|
| (1) Polydimethylsiloxane having silanol on its both ends (number average molecular weight 100,000) | 86 g |
| (2) Ethyltriacetoxysilane | 13.9 g |
| (3) Dibutyltin diacetate | 0.1 g |
| (4) Toluene | 300 g |

As a result, the silicone rubber composition could be coated only onto the photoreceptive areas, that is, the wettability-varied areas. The assembly was dried at 120° C. for 2 min to form a pattern of a 1.5 µm-thick silicone rubber layer. Next, under the same conditions, the whole area exposure was carried out using a mercury lamp to vary the wettability of the areas not provided with the silicone rubber layer. The printing plate thus obtained was mounted on an offset printing machine (Alpha New Ace, manufactured by Alpha Giken K.K.), and printing was carried out on a coated paper using a printing ink (Inctec Waterless S Deep Blue, manufactured by The Inctec Inc.) at a printing speed of 5000 sheets/hr. As a result, 20,000 sheets of good prints could be obtained.

Example D-2

The photocatalyst-containing layer described in Example D-1 was formed on a 0.15 mm-thick aluminum sheet in the same manner as in Example D-1. The photocatalyst-containing layer was then exposed to light from a mercury lamp through a gradation negative-working mask having halftone dots of 2 to 98% with 175 lines/in in the same manner as in Example D-1. The following O/W type emulsion type silicone composition was roll coated at 450 m/min onto the exposed photocatalyst-containing layer.

| | |
|---|---|
| (1) Polydimethylsiloxane having hydroxyl group on its both ends (number average molecular weight 100,000) | 95 g |
| (2) Methyltriacetoxysilane | 5 g |
| (3) Dibutyltin dilaurate | 0.01 g |
| (4) Dodecylbenzenesulfonic acid | 5 g |

As a result, the composition was coated only onto the exposed areas, that is, the wettability-varied areas. The assembly was dried at 120° C. for 10 mm to form a pattern of a 1.5 µm-thick silicone rubber layer. Next, under the same conditions, the whole area exposure was carried out using a mercury lamp to vary the wettability of the areas not provided with the silicone rubber layer.

The printing plate thus obtained was mounted on an offset printing machine (Alpha New Ace, manufactured by Alpha Giken K.K.), and printing was carried out on a coated paper using a printing ink (Inctec Waterless S Deep Blue, manufactured by The Inctec Inc.) at a printing speed of 5000 sheets/hr. As a result, 20,000 sheets of good prints could be obtained.

Example D-3

The photocatalyst-containing layer described in Example D-1 was formed on a 0.15 mm-thick polyester film in the same manner as in Example D-1. The photocatalyst layer was then exposed to light from a mercury lamp through a gradation negative-working mask having halftone dots of 2 to 98% with 175 lines/in in the same manner as in Example D-1. The following silicone rubber composition was roll coated at 400 m/min onto the exposed photocatalyst-containing layer.

| | |
|---|---|
| (1) Polydimethylsiloxane having vinyl group on its both ends | 100 g |
| (2) $(CH_3)SiO(Si(CH_3)_2O)_{30}(SiH(CH_3)O)_{10}Si(CH_3)$ | 312.8 g |
| (3) Chloroplatinic acid/methyl vinyl cyclic complex | 0.1 g |
| (4) Toluene | 200 g |

As a result, the silicone rubber composition was coated only onto the exposed areas, that is, the wettability-varied areas. The assembly was dried at 120° C. for 5 min to form a 1.5 µm-thick patterned silicone rubber layer. Next, under the same conditions, the whole area exposure was carried out using a mercury lamp to vary the wettability of the areas not provided with the silicone rubber layer.

The printing plate thus obtained was mounted on an offset printing machine (Alpha New Ace, manufactured by Alpha Giken K.K.), and printing was carried out on a coated paper using a printing ink (Inctec Waterless S Yellow, manufactured by The Inctec Inc.) at a printing speed of 5000 sheets/hr. As a result, 20,000 sheets of good prints could be obtained.

Example D-4

The photocatalyst-containing layer described in Example D-1 was formed on a 0.15 mm-thick aluminum substrate in the same manner as in Example D-1. The photocatalyst layer was then exposed to light from a mercury lamp through a gradation negative-working mask having halftone dots of 2 to 98% with 175 lines/in in the same manner as in Example D-1.

The following composition was roll coated at 520 m/min onto the exposed photocatalyst-containing layer.

| | |
|---|---|
| (1) KAYARAD D-310, manufactured by Nippon Kayaku Co., Ltd.) | 18 g |
| (2) Darocur 1173, manufactured by Ciba-Geigy Limited) | 0.9 g |
| (3) Xylene | 20 g |

As a result, the composition was coated only onto the exposed areas, that is, the wettability-varied areas. The assembly was then irradiated with ultraviolet light from a mercury lamp at an intensity of 70 mW/cm$^2$ for 50 sec to cure the composition and, at the same time, to vary the wettability of the areas not wetted by the composition. Thus, a printing plate was obtained which had a surface having an enhanced critical surface tension of not more than 10° in terms of contact angle thereof with water.

The printing plate thus obtained was mounted on an offset printing machine (Alpha New Ace, manufactured by Alpha Giken K.K.), and printing was carried out on coated paper using a printing ink (ACROS (EIKUROSU) Deep Red, manufactured by The Inctec Inc.) and dampening water (a liquid prepared by diluting a clean etch liquid 20 times with water, manufactured by Nikken Chemicals Co., Ltd.) at a printing speed of 5000 sheets/hr. As a result, 20,000 sheets of good prints could be obtained.

Thus, according to the plate for lithography of the fourth invention D, a photocatalyst-containing composition layer is formed on a substrate, the wettability of the surface is varied by photocatalytic action created in response to light irradiation, and a resin layer is coated, followed by the whole area exposure to form areas having enhanced critical surface tension in areas other than the resin layer. This can realize the production of plates for waterless lithography or lithography using dampening water that possesses high plate wear.

What is claimed is:

1. A microlens array comprising:
   a transparent substrate;
   a first photocatalyst-containing layer containing photocatalyst provided on the face side of the transparent substrate; and
   a second photocatalyst-containing layer containing photocatalyst provided on the backside of the transparent substrate
   wherein wettability of the first photocatalyst-containing layer and the second photocatalyst-containing layer is variable through photocatalystic action upon exposure to light,
   a microlens is provided in an array on the first photocatalyst-containing layer in its wettability-varied areas or in its wettability-unvaried areas, and
   a light shielding layer pattern corresponding to the microlens-pattern is provided on the second photocatalyst-containing layer in its wettability-varied areas or in its wettability-unvaried areas.

2. A color microlens array comprising lenses according to claim 1, the lenses being color microlenses of a plurality of colors disposed in array.

3. An image sensing device comprising the color microlens array according to claim 2.

4. A display comprising the color microlens array according to claim 2.

5. An image sensing device comprising the microlens array according to claim 1.

6. A display comprising the microlens array according to claim 1.

* * * * *